United States Patent
Carlson et al.

(10) Patent No.: US 11,569,255 B2
(45) Date of Patent: Jan. 31, 2023

(54) VOID FORMATION IN CHARGE TRAP STRUCTURES

(71) Applicant: Micron Technology, Inc., Boise, ID (US)

(72) Inventors: Chris M. Carlson, Nampa, ID (US); Ugo Russo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 78 days.

(21) Appl. No.: 17/314,384

(22) Filed: May 7, 2021

(65) Prior Publication Data
US 2021/0265365 A1 Aug. 26, 2021

Related U.S. Application Data

(60) Continuation of application No. 16/580,751, filed on Sep. 24, 2019, now Pat. No. 11,037,951, which is a
(Continued)

(51) Int. Cl.
*H01L 27/1157* (2017.01)
*H01L 21/28* (2006.01)
(Continued)

(52) U.S. Cl.
CPC .... *H01L 27/1157* (2013.01); *H01L 27/11582* (2013.01); *H01L 29/40117* (2019.08); *H01L 29/4234* (2013.01); *H01L 29/513* (2013.01)

(58) Field of Classification Search
CPC ......... H01L 27/11582; H01L 29/40117; H01L 27/1157; H01L 29/4234; H01L 29/513;
(Continued)

(56) References Cited

U.S. PATENT DOCUMENTS

| 5,292,677 A | 3/1994 | Dennison |
| 6,674,138 B1 | 1/2004 | Halliyal et al. |

(Continued)

FOREIGN PATENT DOCUMENTS

| CN | 111149203 A | 5/2020 |
| CN | 111149205 A | 5/2020 |

(Continued)

OTHER PUBLICATIONS

US 11,004,859 B2, 05/2021, Carlson et al. (withdrawn)
(Continued)

*Primary Examiner* — Mouloucoulaye Inoussa
(74) *Attorney, Agent, or Firm* — Schwegman Lundberg & Woessner, P.A.

(57) ABSTRACT

Electronic apparatus and methods of forming the electronic apparatus may include one or more charge trap structures for use in a variety of electronic systems and devices, where each charge trap structure includes a dielectric barrier between a gate and a blocking dielectric on a charge trap region of the charge trap structure. In various embodiments, a void is located between the charge trap region and a region on which the charge trap structure is disposed. In various embodiments, a tunnel region separating a charge trap region from a semiconductor pillar of a charge trap structure, can be arranged such that the tunnel region and the semiconductor pillar are boundaries of a void. Additional apparatus, systems, and methods are disclosed.

20 Claims, 33 Drawing Sheets

Related U.S. Application Data division of application No. 15/675,265, filed on Aug. 11, 2017, now Pat. No. 10,453,855.

(51) Int. Cl.
  *H01L 27/11582* (2017.01)
  *H01L 29/423* (2006.01)
  *H01L 29/51* (2006.01)

(58) Field of Classification Search
  CPC ......... H01L 27/11521; H01L 21/76837; H01L 45/1675; H01L 27/2463; H01L 27/2427; H01L 45/141; H01L 45/1293; H01L 45/144; H01L 21/76224; H01L 21/764; H01L 27/115; H01L 45/1233; H01L 45/06; H01L 21/7682; H01L 29/0649; H01L 27/11565; H01L 23/528; H01L 27/11556; H01L 27/11519; H01L 21/225; H01L 29/7883; H01L 23/53266; H01L 27/11568; H01L 27/11524; H01L 21/76877; H01L 21/76843; H01L 21/32055; H01L 21/76831; H01L 21/32134; H01L 21/31111; H01L 27/11573; H01L 23/5226; H01L 27/11575; H01L 29/7926; H01L 29/66666; H01L 29/66833; H01L 21/02164; H01L 21/0217; G11C 16/0483; G11C 16/06
  USPC .............. 257/326, 314, 329, 324, E29.309, 257/E27.102, E21.21, E21.238, E21.662; 438/591, 589, 287, 258, 593; 365/51
  See application file for complete search history.

(56) References Cited

U.S. PATENT DOCUMENTS

| | | | |
|---|---|---|---|
| 7,052,967 B2 | 5/2006 | Lee et al. | |
| 7,804,120 B2 | 9/2010 | Lee et al. | |
| 7,999,304 B2 | 8/2011 | Ozawa et al. | |
| 8,034,693 B2 | 10/2011 | Shibata et al. | |
| 8,148,789 B2 | 4/2012 | Kito et al. | |
| 9,129,789 B2 | 9/2015 | Krutchinsky et al. | |
| 9,136,128 B2 | 9/2015 | Lee et al. | |
| 9,177,966 B1 | 11/2015 | Rabkin et al. | |
| 9,343,316 B2 | 5/2016 | Lee et al. | |
| 9,406,694 B1 | 8/2016 | Ikeno et al. | |
| 9,570,464 B1 | 2/2017 | Wakatsuki et al. | |
| 9,679,778 B2 | 6/2017 | Lee et al. | |
| 9,679,907 B1 | 6/2017 | Kaneko | |
| 9,748,262 B1 | 8/2017 | Lai et al. | |
| 9,960,045 B1 | 5/2018 | Purayath et al. | |
| 9,997,533 B2 | 6/2018 | Yoshimizu et al. | |
| 10,134,597 B2 | 11/2018 | Lee et al. | |
| 10,164,009 B1 | 12/2018 | Carlson | |
| 10,446,572 B2 | 10/2019 | Carlson | |
| 10,453,855 B2 | 10/2019 | Carlson et al. | |
| 10,644,105 B2 | 5/2020 | Carlson | |
| 10,651,282 B2 | 5/2020 | Lee et al. | |
| 10,680,006 B2 | 6/2020 | Carlson | |
| 10,937,802 B2 | 3/2021 | Carlson | |
| 10,985,251 B2 | 4/2021 | Lee et al. | |
| 11,037,951 B2 | 6/2021 | Carlson et al. | |
| 11,329,127 B2 | 5/2022 | Carlson | |
| 11,393,843 B2 | 7/2022 | Carlson | |
| 2002/0008261 A1 | 1/2002 | Nishiyama | |
| 2003/0030099 A1 | 2/2003 | Hsieh et al. | |
| 2004/0232496 A1* | 11/2004 | Chen | H01L 27/115 257/E27.103 |
| 2005/0029573 A1* | 2/2005 | Sato | H01L 27/11529 257/314 |
| 2007/0096202 A1* | 5/2007 | Kang | H01L 21/764 257/E21.573 |
| 2007/0184615 A1 | 8/2007 | Brazzelli et al. | |
| 2007/0257305 A1 | 11/2007 | Sasago et al. | |
| 2007/0296016 A1 | 12/2007 | Nagano et al. | |
| 2008/0012061 A1 | 1/2008 | Ichige et al. | |
| 2008/0054341 A1 | 3/2008 | Natori et al. | |
| 2008/0197403 A1 | 8/2008 | Ozawa et al. | |
| 2008/0246078 A1 | 10/2008 | Huo et al. | |
| 2008/0283898 A1 | 11/2008 | Kuniya | |
| 2009/0047777 A1* | 2/2009 | Nagano | H01L 27/115 257/E21.294 |
| 2009/0101883 A1 | 4/2009 | Lai et al. | |
| 2009/0212351 A1 | 8/2009 | Chen | |
| 2009/0302367 A1 | 12/2009 | Nagano | |
| 2010/0003795 A1 | 1/2010 | Park et al. | |
| 2010/0019311 A1* | 1/2010 | Sato | H01L 29/66825 257/326 |
| 2010/0044772 A1 | 2/2010 | Yonemochi et al. | |
| 2010/0078758 A1 | 4/2010 | Sekar et al. | |
| 2010/0133525 A1 | 6/2010 | Arai et al. | |
| 2010/0176368 A1 | 7/2010 | Ko et al. | |
| 2010/0176438 A1 | 7/2010 | Lue et al. | |
| 2010/0187593 A1 | 7/2010 | Morikado | |
| 2010/0190330 A1 | 7/2010 | Yonemochi et al. | |
| 2010/0213537 A1 | 8/2010 | Fukuzumi et al. | |
| 2010/0295113 A1* | 11/2010 | Kang | H01L 27/11524 257/316 |
| 2011/0097887 A1 | 4/2011 | Aoyama et al. | |
| 2011/0104883 A1 | 5/2011 | Nagano | |
| 2011/0108905 A1 | 5/2011 | Ichige et al. | |
| 2011/0163367 A1* | 7/2011 | Kang | H01L 27/11529 257/316 |
| 2011/0193153 A1 | 8/2011 | Higuchi et al. | |
| 2011/0287612 A1* | 11/2011 | Lee | H01L 29/7926 257/E21.09 |
| 2011/0298013 A1 | 12/2011 | Hwang et al. | |
| 2011/0300703 A1 | 12/2011 | Sato et al. | |
| 2011/0303967 A1 | 12/2011 | Harari et al. | |
| 2011/0309425 A1 | 12/2011 | Purayath et al. | |
| 2011/0309426 A1 | 12/2011 | Purayath et al. | |
| 2011/0309430 A1 | 12/2011 | Purayath et al. | |
| 2012/0001252 A1 | 1/2012 | Alsmeier et al. | |
| 2012/0012920 A1* | 1/2012 | Shin | H01L 29/4234 257/E29.262 |
| 2012/0049268 A1 | 3/2012 | Chang et al. | |
| 2012/0126302 A1* | 5/2012 | Noda | H01L 21/764 438/587 |
| 2012/0126303 A1 | 5/2012 | Arai et al. | |
| 2012/0187467 A1 | 7/2012 | Rogers et al. | |
| 2012/0213006 A1 | 8/2012 | Isomura et al. | |
| 2012/0256247 A1 | 10/2012 | Alsmeier | |
| 2012/0280303 A1 | 11/2012 | Kiyotoshi et al. | |
| 2012/0313159 A1* | 12/2012 | Sim | H01L 29/7881 257/324 |
| 2012/0319172 A1 | 12/2012 | Ramaswamy et al. | |
| 2013/0049093 A1 | 2/2013 | Lee et al. | |
| 2013/0056819 A1 | 3/2013 | Matsushita et al. | |
| 2013/0134493 A1 | 5/2013 | Eom et al. | |
| 2013/0256781 A1 | 10/2013 | Paek et al. | |
| 2013/0270625 A1 | 10/2013 | Jang et al. | |
| 2014/0008714 A1 | 1/2014 | Makala et al. | |
| 2014/0131785 A1 | 5/2014 | Seo et al. | |
| 2015/0069494 A1 | 3/2015 | Makala et al. | |
| 2015/0091078 A1 | 4/2015 | Jang et al. | |
| 2015/0137062 A1 | 5/2015 | Ananthan et al. | |
| 2015/0243675 A1 | 8/2015 | Lim et al. | |
| 2015/0263036 A1 | 9/2015 | Yasuda et al. | |
| 2015/0348790 A1 | 12/2015 | Lee et al. | |
| 2015/0380431 A1 | 12/2015 | Kanamori et al. | |
| 2016/0093636 A1 | 3/2016 | Pang et al. | |
| 2016/0133671 A1* | 5/2016 | Fantini | H01L 27/11521 257/4 |
| 2016/0133752 A1 | 5/2016 | Hopkins et al. | |
| 2016/0181273 A1 | 6/2016 | Kim et al. | |
| 2016/0254159 A1 | 9/2016 | Lee | |
| 2016/0343657 A1 | 11/2016 | Sawa et al. | |
| 2016/0351582 A1 | 12/2016 | Kim et al. | |
| 2017/0062330 A1* | 3/2017 | Kim | H01L 27/1157 |
| 2017/0062471 A1 | 3/2017 | Son et al. | |

(56) References Cited

U.S. PATENT DOCUMENTS

| | | | |
|---|---|---|---|
| 2017/0069637 A1* | 3/2017 | Son | H01L 27/11565 |
| 2017/0098659 A1* | 4/2017 | Yoshimizu | H01L 21/02164 |
| 2017/0117290 A1 | 4/2017 | Lee et al. | |
| 2017/0141122 A1 | 5/2017 | Yoshimizu et al. | |
| 2017/0200737 A1 | 7/2017 | Sun et al. | |
| 2017/0229474 A1* | 8/2017 | Shimizu | H01L 27/11568 |
| 2017/0278851 A1 | 9/2017 | Fujii et al. | |
| 2017/0287719 A1 | 10/2017 | Lee et al. | |
| 2017/0373086 A1 | 12/2017 | Pang et al. | |
| 2018/0286874 A1 | 10/2018 | Kim et al. | |
| 2019/0051656 A1 | 2/2019 | Carlson et al. | |
| 2019/0051660 A1 | 2/2019 | Carlson | |
| 2019/0051661 A1 | 2/2019 | Carlson | |
| 2019/0109190 A1 | 4/2019 | Carlson | |
| 2019/0157092 A1 | 5/2019 | Lee et al. | |
| 2019/0312058 A1 | 10/2019 | Carlson | |
| 2020/0020703 A1 | 1/2020 | Carlson et al. | |
| 2020/0258906 A1 | 8/2020 | Carlson | |
| 2020/0258980 A1 | 8/2020 | Carlson | |
| 2020/0279928 A1 | 9/2020 | Lee et al. | |
| 2021/0202521 A1 | 7/2021 | Carlson | |

FOREIGN PATENT DOCUMENTS

| | | |
|---|---|---|
| CN | 111149207 A | 5/2020 |
| CN | 111164756 A | 5/2020 |
| JP | 2009081316 A | 4/2009 |
| JP | 2011082581 A | 4/2011 |
| JP | 2012248691 A | 12/2012 |
| JP | 2014096466 A | 5/2014 |
| JP | 2015177013 A | 10/2015 |
| JP | 2016508670 A | 3/2016 |
| JP | 2016225434 A | 12/2016 |
| JP | 2017139036 A | 8/2017 |
| KR | 101017713 B1 | 2/2011 |
| KR | 20110034816 A | 4/2011 |
| KR | 20110074749 A | 7/2011 |
| KR | 20120007838 U | 11/2012 |
| KR | 20130109289 A | 10/2013 |
| KR | 20130116607 A | 10/2013 |
| KR | 20140060206 A | 5/2014 |
| KR | 20150085735 A | 7/2015 |
| KR | 20150132470 A | 11/2015 |
| KR | 20170026815 A | 3/2017 |
| KR | 20170029795 A | 3/2017 |
| KR | 102334990 B1 | 12/2021 |
| KR | 102335220 B1 | 12/2021 |
| KR | 102396276 | 5/2022 |
| KR | 102409633 | 6/2022 |
| TW | 486773 | 5/2002 |
| TW | 201244007 A | 11/2012 |
| TW | 201705451 A | 2/2017 |
| TW | 201911581 A | 3/2019 |
| TW | 201921639 A | 6/2019 |
| TW | 201921652 A | 6/2019 |
| TW | 201921654 A | 6/2019 |
| WO | WO-2016191155 A1 | 12/2016 |
| WO | WO-2019032323 A1 | 2/2019 |
| WO | WO-2019032326 A1 | 2/2019 |
| WO | WO-2019032373 A1 | 2/2019 |
| WO | WO-2019032376 A1 | 2/2019 |

OTHER PUBLICATIONS

U.S. Appl. No. 13/222,367 U.S. Pat. No. 9,136,128, filed Aug. 31, 2011, Methods and Apparatuses Including Memory Cells With Air Gaps and Other Low Dielectric Constant Materials.

U.S. Appl. No. 14/825,947 U.S. Pat. No. 9,343,316, filed Aug. 13, 2015, Methods of Forming Memory Cells With Air Gaps and Other Low Dielectric Constant Materials.

U.S. Appl. No. 15/154,467 U.S. Pat. No. 9,679,778, filed May 13, 2016, Methods of Forming Memory Cells With Air Gaps and Other Low Dielectric Constant Materials.

U.S. Appl. No. 15/620,458 U.S. Pat. No. 10,134,597, filed Jun. 12, 2017, Apparatuses Including Memory Cells With Gaps Comprising Low Dielectric Constant Materials.

U.S. Appl. No. 16/168,470 U.S. Pat. No. 10,651,282, filed Oct. 23, 2018, Apparatuses Including Memory Cells With Gaps Comprising Low Dielectric Constant Materials.

U.S. Appl. No. 16/871,600 U.S. Pat. No. 10,985,251, filed May 11, 2020, Apparatuses Including Memory Cells With Gaps Comprising Low Dielectric Constant Materials.

U.S. Appl. No. 15/675,223 U.S. Pat. No. 10,680,006, filed Aug. 11, 2017, Charge Trap Structure With Barrier to Blocking Region.

U.S. Appl. No. 16/856,976, filed Apr. 23, 2020, Charge Trap Structure With Barrier to Blocking Region.

U.S. Appl. No. 15/675,197 U.S. Pat. No. 10,446,572, filed Aug. 11, 2017, Void Formation for Charge Trap Structures.

U.S. Appl. No. 16/452,292 U.S. Pat. No. 10,937,802, filed Jun. 25, 2019, Void Formation for Charge Trap Stuctures.

U.S. Appl. No. 17/181,901, filed Feb. 22, 2021, Void Formation for Charge Trap Structures.

U.S. Appl. No. 15/675,265 U.S. Pat. No. 10,453,855, filed Aug. 11, 2017, Void Formation in Charge Trap Structures.

U.S. Appl. No. 16/580,751 U.S. Pat. No. 11,004,859, filed Sep. 24, 2019, Void Formation in Charge Trap Structures.

U.S. Appl. No. 15/675,130 U.S. Pat. No. 10,164,009, filed Aug. 11, 2017, Memory Device Including Voids Between Control Gates.

U.S. Appl. No. 16/197,217 U.S. Pat. No. 10,644,105, filed Nov. 20, 2018, Memory Device Including Voids Between Control Gates.

U.S. Appl. No. 16/863,117, filed Apr. 30, 2020, Memory Device Including Voids Between Control Gates.

"Japanese Application Serial No. 2020-506985, Response filed Aug. 10, 2021 to Notification of Reasons for Refusal dated May 11, 2021", w/ English Claims, 38 pgs.

"Japanese Application Serial No. 2020-506987, Response filed Aug. 24, 2021 to Notification of Reasons for Refusal dated May 25, 2021", w/ English Claims, 18 pgs.

"Japanese Application Serial No. 2020-507575, Notification of Reasons for Refusal dated Jul. 6, 2021", w/ English translation, 11 pgs.

"Korean Application Serial No. 10-2020-7007082, Notice of Preliminary Rejection dated Aug. 31, 2021", w/ English translation, 22 pgs.

"Korean Application Serial No. 10-2020-7007242, Notice of Preliminary Rejection dated Aug. 25, 2021", w/ English translation, 17 pgs.

"Taiwanese Application Serial No. 107127922, Office Action dated May 16, 2022", w English translation, 7 pgs.

"Japanese Application Serial No. 2020-507575, Response filed May 12, 2022 to Final Notification of Reasons for Refusal dated Feb. 15, 2022", W English translation, 17 pgs.

"Japanese Application Serial No. 2020-506986, Response filed Oct. 22, 2021 to Notification of Reasons for Refusal dated May 25, 2021", w/ English Claims, 24 pgs.

"Japanese Application Serial No. 2020-506987, Examiners Decision of Final Refusal dated Oct. 12, 2021", w/ English translation, 10 pgs.

"Japanese Application Serial No. 2020-507575, Response filed Sep. 22, 2021 to Notification of Reasons for Refusal dated Jul. 6, 2021", w/ English Claims, 23 pgs.

"European Application Serial No. 18843931.9, Extended European Search Report dated Apr. 9, 2021", 9 pgs.

"European Application Serial No. 18844515.9, Extended European Search Report dated May 17, 2021", 9 pgs.

"Japanese Application Serial No. 2020-506985, Notification of Reasons for Refusal dated May 11, 2021", w/ English translation, 13 pgs.

"Japanese Application Serial No. 2020-506986, Notification of Reasons for Refusal dated May 25, 2021", w/ English translation, 11 pgs.

"Japanese Application Serial No. 2020-506987, Notification of Reasons for Refusal dated May 25, 2021", w/ English translation, 14 pgs.

(56) References Cited

OTHER PUBLICATIONS

"Korean Application Serial No. 10-2020-7006550, Notice of Preliminary Rejection dated Jan. 31, 2021", w/ English translation, 23 pgs.

"Korean Application Serial No. 10-2020-7006704, Notice of Preliminary Rejection dated Jan. 31, 2021", w/ English translation, 17 pgs.

"Korean Application Serial No. 10-2020-7007082, Notice of Preliminary Rejection dated Jan. 31, 2021", w/ English translation, 4 pgs.

"Korean Application Serial No. 10-2020-7007242, Notice of Preliminary Rejection dated Jan. 31, 2021", w/ English translation, 5 pgs.

"Singaporean Application Serial No. 11202001123P, Written Opinion dated May 14, 2021", 10 pgs.

Nyns, Laura, et al., "Impact of precursor chemistry on atomic layer deposition of lutetium aluminates", Journal of Vacuum Science and Technology: Part A, AVS /AIP, Melville, NY., US, vol. 30, No. 1, (Jan. 1, 2012), 1A120-1A120.

"Singapore Application Serial No. 11202001075P, Response filed Sep. 9, 2021 to Search Report and Written Opinion dated Apr. 27, 2021", w English Claims, 24 pgs.

"Singaporean Application Serial No. 11202001123P, Response filed Sep. 9, 2021 to Written Opinion dated May 14, 2021", w English Claims, 21 pgs.

"Japanese Application Serial No. 2020-506985, Response filed Apr. 8, 2022 to Notification of Reasons for Refusal dated Jan. 11, 2022", w English Claims, 19 pgs.

"Korean Application Serial No. 10-2021-7039333, Response filed Apr. 20, 2022 Notice of Preliminary Rejection dated Feb. 23, 2022", w English Claims, 10 pgs.

"European Application Serial No. 18843408.8, Extended European Search Report dated Apr. 7, 2021", 7 pgs.

"European Application Serial No. 18843408.8, Response filed Sep. 28, 2020 to Communication pursuant to Rule 161(1) and 162 EPC dated Mar. 18, 2020", 29 pgs.

"European Application Serial No. 18843748.7, Extended European Search Report dated Apr. 9, 2021", 11 pgs.

"European Application Serial No. 18843748.7, Response filed Sep. 28, 2020 to Communication pursuant to Rules 161(2) and 162 EPC dated Mar. 18, 2020", 24 pgs.

"European Application Serial No. 18843931.9, Response filed Sep. 28, 2020 to Communication pursuant to Rules 161(2) and 162 EPC dated Mar. 18, 2020", 22 pgs.

"European Application Serial No. 18844515.9, Response filed Oct. 5, 2020 to Communication pursuant to Rules 161(2) and 162 EPC dated Mar. 26, 2020", 15 pgs.

"International Application Serial No. PCT/US2018/044353, International Preliminary Report on Patentability dated Feb. 20, 2020", 8 pgs.

"International Application Serial No. PCT/US2018/044353, International Search Report dated Nov. 14, 2018", 3 pgs.

"International Application Serial No. PCT/US2018/044353, Written Opinion dated Nov. 14, 2018", 6 pgs.

"International Application Serial No. PCT/US2018/044375, International Preliminary Report on Patentability dated Feb. 20, 2020", 16 pgs.

"International Application Serial No. PCT/US2018/044375, International Search Report dated Nov. 16, 2018", 3 pgs.

"International Application Serial No. PCT/US2018/044375, Written Opinion dated Nov. 16, 2018", 14 pgs.

"International Application Serial No. PCT/US2018/044990, International Preliminary Report on Patentability dated Feb. 20, 2020", 11 pgs.

"International Application Serial No. PCT/US2018/044990, International Search Report dated Dec. 7, 2018", 3 pgs.

"International Application Serial No. PCT/US2018/044990, Written Opinion dated Dec. 7, 2018", 9 pgs.

"International Application Serial No. PCT/US2018/045015, International Preliminary Report on Patentability dated Feb. 20, 2020", 13 pgs.

"International Application Serial No. PCT/US2018/045015, International Search Report dated Nov. 23, 2018", 3 pgs.

"International Application Serial No. PCT/US2018/045015, Written Opinion dated Nov. 23, 2018", 10 pgs.

"Japanese Application Serial No. 2020-506987, Voluntary Amendment Filed Mar. 24, 2021", w/ English Claims, 17 pgs.

"Korean Application Serial No. 10-2020-7006550, Response filed Mar. 24, 2021 to Notice of Preliminary Rejection dated Jan. 31, 2021", w/ English Claims, 27 pgs.

"Korean Application Serial No. 10-2020-7006704, Response filed Mar. 31, 2021 to Notice of Preliminary Rejection dated Jan. 31, 2021", w/ English Claims, 21 pgs.

"Korean Application Serial No. 10-2020-7007082, Response filed Mar. 31, 2021 to Notice of Preliminary Rejection dated Jan. 31, 2021", w/ English Claims, 18 pgs.

"Korean Application Serial No. 10-2020-7007242, Response filed Mar. 30, 2021 to Notice of Preliminary Rejection dated Jan. 31, 2021", w/ English Claims, 25 pgs.

"Singapore Application Serial No. 11202001075P, Search Report and Written Opinion dated Apr. 27, 2021", 9 pgs.

"Taiwanese Application Serial No. 107127000, Office Action dated Aug. 29, 2019", w/ English Translation, 28 pgs.

"Taiwanese Application Serial No. 107127000, Response filed Nov. 29, 2019 to Office Action dated Aug. 29, 2019", w/ English Claims, 85 pgs.

"Taiwanese Application Serial No. 107127913, Office Action dated May 3, 2019", W/ English Translation, 21 pgs.

"Taiwanese Application Serial No. 107127913, Response filed Nov. 6, 2019 to Office Action dated May 3, 2019", w/ English Claims, 75 pgs.

"Taiwanese Application Serial No. 107127922, Decision of Rejection dated Jul. 10, 2020", w/ English Claims, 12 pgs.

"Taiwanese Application Serial No. 107127922, First Office Action dated Apr. 19, 2019", W/ English Translation of Search Report and English Claims, 31 pgs.

"Taiwanese Application Serial No. 107127922, Office Action dated Nov. 25, 2019", w/ English Translation, 73 pgs.

"Taiwanese Application Serial No. 107127922, Response filed Feb. 27, 2020 to Office Action dated Nov. 25, 2019", w/ English Claims, 41 pgs.

"Taiwanese Application Serial No. 107127922, Response filed Jul. 18, 2019 to First Office Action dated Apr. 19, 2019", w/ English Claims, 38 pgs.

"Taiwanese Application Serial No. 107127992, Office Action dated Aug. 29, 2019", w/ English Translation, 18 pgs.

"Taiwanese Application Serial No. 107127992, Response filed Nov. 29, 2019 to Office Action dated Aug. 29, 2019", w/ English Claims, 11 pgs.

Daycock, David A, et al., "U.S. Appl. No. 15/422,335, Memory Arrays, and Methods of Forming Memory Arrays filed Feb. 1, 2017.", 39 pgs.

Kanarik, Keren J, et al., "Overview of atomic layer etching in the semiconductor industry", J Vac Sci Technol. A, vol. 33 No. 2, (2015), 14 pgs.

Lee, Younghee, et al., "Atomic Layer Etching of Al2O3 Using Sequestial Seif-Limiting Thermal Reactions with Sn acac2 and Hydrogen Fluoride", American Chemical Society vol. 9 No 2, (2015), 2061-2070.

Lee, Younghee, et al., "Atomic Layer Etching of HfO2 Using Sequential, Self-Limiting Thermal Reactions with Sn acac2 and HF", ECS Journal of Solid Science and Technology 4 (6), (Mar. 12, 2015), 20 pgs.

Tsukamoto, Keisuke, et al., "Advanced Air Gap Process for Multi-Level-Cell Flash Memories Reducing Threshold Voltage Interference and Realizing High Reliability", Jpn. J. Appl. Phys. 46, (2007), 1.

"Japanese Application Serial No. 2020-506985, Notification of Reasons for Refusal dated Jan. 11, 2022", w/ English translation, 6 pgs.

(56) References Cited

OTHER PUBLICATIONS

"Japanese Application Serial No. 2020-506986, Final Notification of Reasons for Refusal dated Mar. 8, 2022", w/ English translation, 11 pgs.
"Japanese Application Serial No. 2020-507575, Final Notification of Reasons for Refusal dated Feb. 15, 2022", w/ English translation, 7 pgs.
"Korean Application Serial No. 10-2021-7039257, Notice of Preliminary Rejection dated Mar. 14, 2022", w/ English translation, 3 pgs.
"Korean Application Serial No. 10-2021-7039333, Notice of Preliminary Rejection dated Feb. 23, 2022", w/ English translation, 3 pgs.
Charge Trap Structure With Barrier to Blocking Region, U.S. Appl. No. 16/856,976, Notice of Allowance dated Mar. 16, 2022, 7 pgs.
Memory Device Including Voids Between Control Gates, U.S. Appl. No. 16/863,117, Corrected Notice of Allowability dated Mar. 30, 2022, 2 pgs.

\* cited by examiner

VOID FORMATION IN CHARGE TRAP STRUCTURES

PRIORITY APPLICATION

This application is a continuation of U.S. application Ser. No. 16/580,751, filed Sep. 24, 2019, which is a divisional of U.S. application Ser. No. 15/675,265, filed Aug. 11, 2017, now issued as U.S. Pat. No. 10,453,855, all of which are incorporated herein by reference in their entirety.

BACKGROUND

The electronics industry is under constant pressure to both reduce component size as well as power requirements and has a market driven need to improve operation of memory devices. One approach to reduce component size is to fabricate devices in a three-dimensional (3D) configuration. For example, a memory device can be arranged as a stack of memory cells vertically on a substrate. Such memory cells can be implemented as charge trap cells. Improvements to charge trap based memory devices and their operation can be addressed by advances in design and processing of the memory devices.

DETAILED DESCRIPTION

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. The terms "wafer" and "substrate" are used herein to refer generally to any structure on which integrated circuits are formed, and also to such structures during various stages of integrated circuit fabrication. A wafer may include a number of die in which an integrated circuit is disposed with respect to a respective substrate of the die.

Figure 1A:
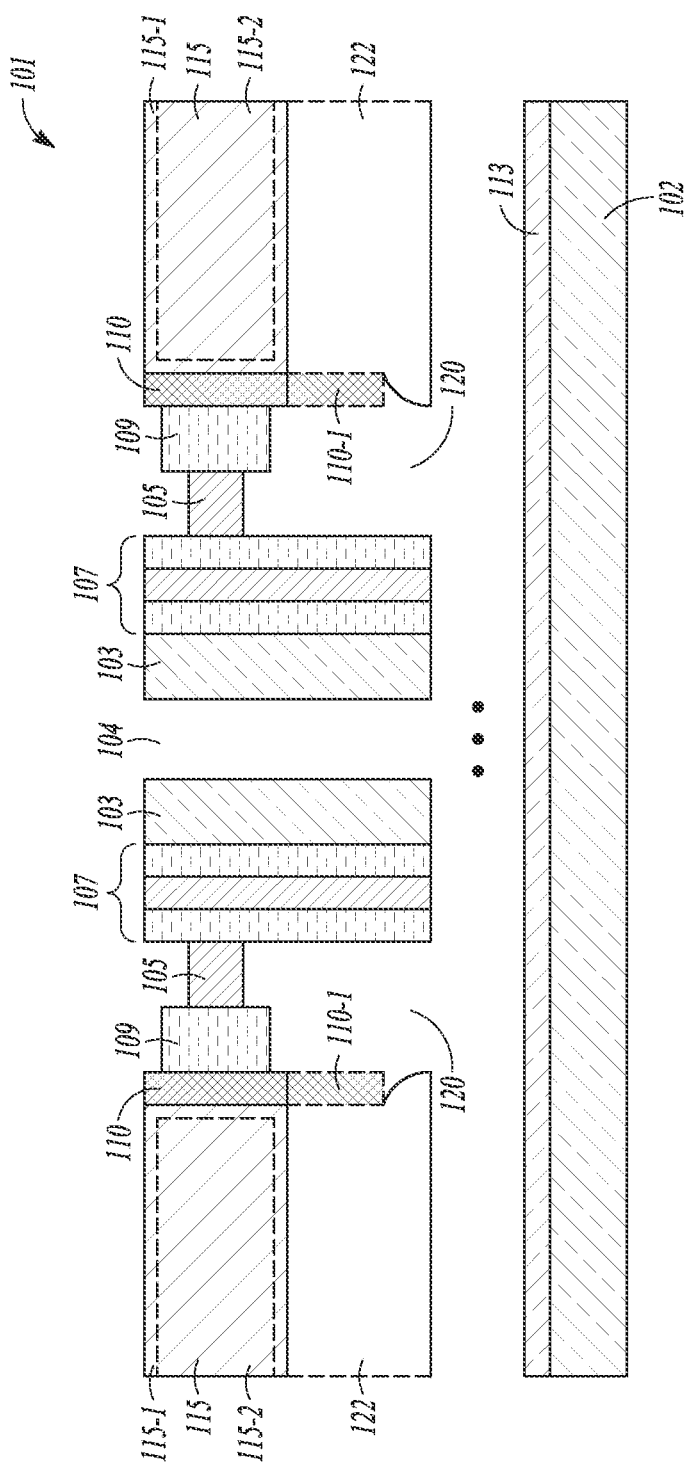
FIG. 1A is a cross-sectional representation of an example charge trap structure, according to various embodiments.

FIG. 1A is a cross-sectional representation of an embodiment of an example charge trap (CT) structure 101, which can be included in a variety of electronic apparatus. Such apparatus can include a memory array, a memory device, an integrated circuit, or other apparatus that includes one or more cells to store charge. The CT structure 101 can include a semiconductor pillar 103, a charge trap region 105, a tunnel region 107, a dielectric blocking region 109, a dielectric barrier 110, and a gate 115. Dielectric barrier 110 is disposed between and separating dielectric blocking region 109 and gate 115. Dielectric barrier 110 can be disposed in a vertical arrangement with dielectric blocking region 109 and charge trap region 105 such that a void is located in a region between a surface on which CT structure 101 is disposed and one or more of dielectric barrier 110, dielectric blocking region 109, or charge trap region 105. A void in a structure is a region of the structure without solid material and without liquid material. A void may be in the form of an evacuated region, an air gap, a gas-filled region, or similar construction. An air gap in a structure or between structures is a gap or region that is filled with air. Herein, the term air gap may include ambient gases enclosed in the gap, such as during formation of the gap.

Dielectric barrier 110 can be disposed in a vertical arrangement with dielectric blocking region 109 and charge trap region 105 in which charge trap region 105 is recessed vertically with respect to dielectric blocking region 109 in a void 120. For example, a distance between the charge trap region and the region on which the charge trap structure is disposed can be greater than a distance between the dielectric blocking region and the region on which the charge trap structure is disposed. In various embodiments, dielectric blocking region 109 can be recessed in void 120 vertically with respect to dielectric barrier 110 and/or the gate 115. For example, the distance between the dielectric blocking region and the region on which the charge trap structure is disposed can be greater than a distance between the dielectric barrier and the region on which the charge trap structure is disposed. Void 120, dielectric blocking region 109, and charge trap region 105 can be structured such that a ratio of vertical thickness of charge trap region 105 to vertical thickness of dielectric blocking region 109 and size of void 120 can be selected to attain a capacitance associated with gate 115 within a specified range.

In various embodiments, arrangements of CT structure 101 with a conductive region 113 can have a number of different structural arrangements. CT structure 101 can be separated from conductive region 113 by an access transistor that can be a transistor structure different from a CT that can operatively act as a transmission gate to provide operational coupling of conductive region 113 to CT structure 101. CT structure 101 can be separated from conductive region 113 by a number of such access transistors. In some structures, semiconductor pillar 103 of CT 101 may be coupled to and integrated in the one or more access transistors such that coupling of semiconductor pillar 103 with conductive region 113 is made by channels of the access transistors to which semiconductor pillar 103 is integrated.

A portion of dielectric barrier 110 can extend vertically below a bottom surface of gate 115 as a protrusion 110-1, which may be referred to as a fin 110-1. Fin 110-1 is a component of dielectric barrier 110 that provided a mechanism to form void 120 and can remain in the completed CT structure 101. Alternatively, after forming an opening to structure boundaries of void 120, fin 110-1 may be removed or significantly reduced, leaving dielectric barrier 110 confined to regions directly between gate 115 and dielectric blocking region 109.

Charge trap structure 101 is disposed above conductive region 113 that is located on a substrate 102. In FIG. 1A, a space is shown between the bottom of charge trap structure 101 and conductive region 113 to indicate that there may be additional materials and/or integrated circuit structures between charge trap structure 101 and conductive region 113, as noted above. An isolation region or other integrated circuit structures can separate components of the charge trap structure 101 from conductive region 113. Alternatively, the CT structure 101 can be disposed on conductive region 113, without a separation or coupling region, with gate 115 separated from conductive region 113 by a sealing dielectric 122. As noted above, CT structure 101 can be disposed above conductive region 113 with gate 115 separated from an access transistor, which couples CT structure 101 to conductive region 113, by sealing dielectric 122.

Sealing dielectric 122 is a region for CT structure 101 used to seal off void 120 during processing of different areas of the electronic apparatus in which CT structure 101 is integrated, where portions of sealing dielectric 122 remain in the completed structure, continuing to seal void 120. Void 120 can be contained within a region bounded by tunnel region 107, charge trap region 105, dielectric barrier 110, sealing dielectric 122, and a region on which CT structure 101 is disposed and/or conductive region 113, where sealing dielectric 122 is disposed on portions of gate 115. With CT structure 101 arranged without fin 110-1, the extent of sealing dielectric 122, as a boundary of void 120, toward tunnel region 107 can be limited by the process to form sealing dielectric 122. The figures herein are not drawn to scale. Further, electrical connections of gate 115, semiconductor pillar 103, and conductive region 113 to other components of an apparatus, in which CT structure 101 is integrated, are not shown to focus on the CT structure 101.

Semiconductor pillar 103 is operable to conduct a current and gate 115 is operable to control storage of charge in the charge storage region 105. Gate 115 can be a metal gate. Gate 115 can include combinations of metals and metallic compounds. Gate 115 is conductive and can include, but is not limited to, conductive titanium nitride and/or tungsten. For example, gate 115 include a conductive titanium nitride region 115-1 on which a tungsten region 115-2 is disposed. Gate 115 can be referred to as a control gate and dielectric blocking region 109 can be referred to as a control dielectric. Semiconductor pillar 103 can include semiconductor material such as, but not limited to polycrystalline silicon (poly silicon). The semiconductor material of semiconductor pillar 103 may have a majority carrier concentration that is less than the majority carrier concentration of conductive region 113, with conductive region 113 structured as a semiconductor region. The difference in majority carrier concentration can be orders of magnitude in powers of base 10. The regions of structure 101 shown in FIG. 1A can be arranged as rings of material around center region 104. Center region 104 can be a dielectric. Center region 104 can be a region of dielectric material, such as, but not limited to, a dielectric oxide. An example of a dielectric oxide in center region 104 can include, but is not limited to, silicon oxide.

Charge trap region 105 is separated from the semiconductor pillar 103 by a tunnel region 107. Charge trap region 105 can be a dielectric material that can store charge from semiconductor pillar 103. Charge trap region 105 can be a dielectric nitride region such as a region including dielectric silicon nitride. Other dielectric materials for charge trap region 105 can be used to trap charge. Tunnel region 107 can be constructed as an engineered region to meet a selected criterion, such as, for example but not limited to, an equivalent oxide thickness (EOT). The EOT quantifies the electrical properties of tunnel region 107, such as capacitance, of a dielectric in terms of a representative physical thickness. For example, EOT can be defined as the thickness of a theoretical $SiO_2$ layer that would be required to have the same capacitance density as a given dielectric (tunneling region 107), ignoring leakage current and reliability considerations. Tunnel region 107 can include an oxide and a nitride. Tunnel region can include a high-κ dielectric, where κ is a dielectric constant. A high-κ dielectric is a dielectric with a dielectric constant greater than the dielectric constant of silicon dioxide.

Tunnel region 107 may include a set of dielectric barriers. The example in FIG. 1A shows tunnel region 107 being a three region tunnel barrier. The three region tunnel barrier can be arranged as a region of dielectric oxide followed by a region of dielectric nitride followed by another region of dielectric oxide. Alternatively, tunnel region 107 can be a two region tunnel barrier or a one region tunnel barrier. Further, tunnel region 107 may have four or more regions, where the selection of material and thicknesses depends on the capability of the material with the given thicknesses to perform as a tunneling region to charge trap region 105.

Dielectric blocking region 109 is disposed adjacent to and contacting charge trap region 105. Dielectric blocking region 109 provides a mechanism to block charge from flowing from charge trap region 105 to gate 115. Dielectric blocking region 109 can be an oxide or other dielectric such as used in tunnel region 107. Gate 115 is disposed on dielectric blocking region 109, but separated from dielectric blocking region 109 by dielectric barrier 110 that is between dielectric blocking region 109 and gate 115, where the material of dielectric barrier 110 is different from the material of dielectric blocking region 109.

Dielectric barrier 110, structured as a thin region, between dielectric blocking region 109 and gate 115 enables an enhanced tunneling barrier that prevents back-tunneling of electrons from gate 115 through dielectric blocking region 109 into charge trap region 105, which can thereby limit operational erase saturation to small positive or small negative threshold voltage ($V_t$) levels. Dielectric barrier 110 can have a thickness in the range from about 15 angstroms to about 50 angstroms between dielectric blocking region 109 and gate 115. Selection of material for dielectric barrier 110 can be based on the fabrication of CT structure 101. For example, in a process in which CT structure 101 including void 120 is formed by removing of material from areas to the sides of what is to become CT structure 101, the material for dielectric barrier 110 can be selected such that the material for dielectric barrier 110 resists removal at the processing chemistries and temperatures used in removal of materials from the sides of CT structure 101. The material for dielectric barrier 110 can act as a mask to prevent removal of dielectric blocking region 109 in such removal processes in formation of CT structures like CT structure 101.

Dielectric barrier 110 can be realized as an $AlO_x$ region or a dielectric region having a higher dielectric constant than $AlO_x$. (Use of nomenclature $AB_x$ indicates an AB material that is not limited to a particular stoichiometry for the AB compound.) Dielectric barrier 110 can have an electron affinity lower than that aluminum oxide. Dielectric barrier 110 can include one or more of aluminum oxide, hafnium oxide, zirconium oxide, or mixtures of hafnium oxide and/or zirconium oxide with one or more of aluminum oxide, silicon oxide, titanium oxide, gadolinium oxide, niobium oxide, or tantalum oxide. Examples of films that can be used include $HfO_2$ and/or $ZrO_2$ based materials, as well as mixtures with other materials such as $AlO_x$, $SiO_2$, $TiO_2$, $GaO_x$, $NbO_x$, and $Ta_2O_5$. Such materials may not be limited to a particular stoichiometry. Other high-κ dielectrics can be used for dielectric barrier 110.

Figure 1B:
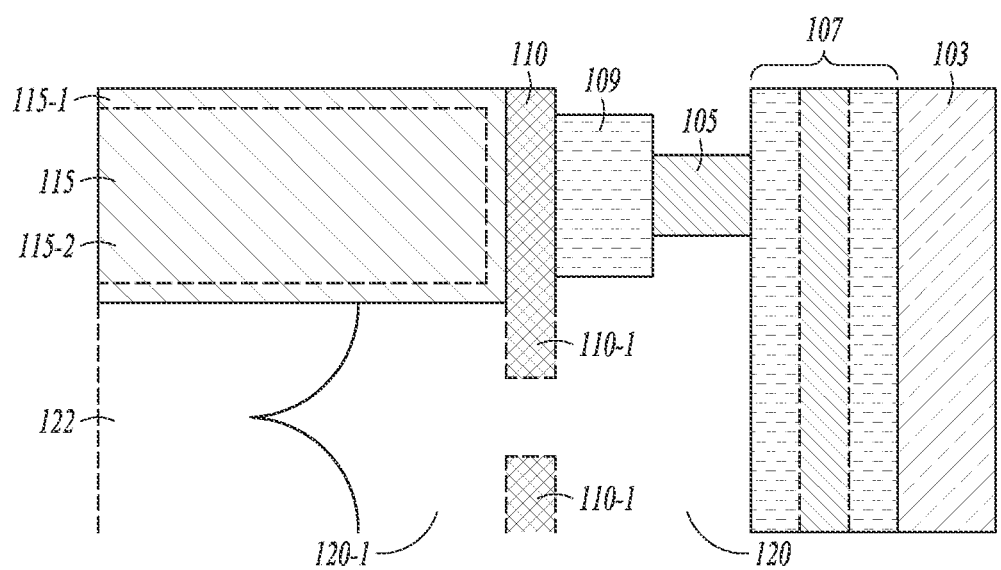
FIG. 1B is a representation of an example of a void structure for the example charge trap structure of FIG. 1A, according to various embodiments.

FIG. 1B is an illustration of CT 101 of FIG. 1A in which sealing dielectric 122 is limited in the direction towards tunnel region 107, defining a boundary of void 120. Sealing dielectric 122 may formed by a sealing process that can be implemented using plasma-enhanced chemical vapor deposition (PECVD) or other depleting process. In such depleting processes, the bulk of sealing dielectric is formed at an opening of a passageway with the material of the sealing dielectric decreasing in the passageway along the surfaces of the passageway. The extent of disposition along the passageway depends on a number of factors, which includes the area of the opening of the passageway. As shown in FIG. 1B, sealing dielectric 122 can terminate in a region below gate 115, resulting in two voids. Void 120-1 is under gate 115 and void 120 is under dielectric blocking region 109 and charge trap region 105. In CT structures 110 with fin 110-1 of dielectric barrier 110 removed, voids 120-1 and 120 together form a larger void.

Figure 2A:
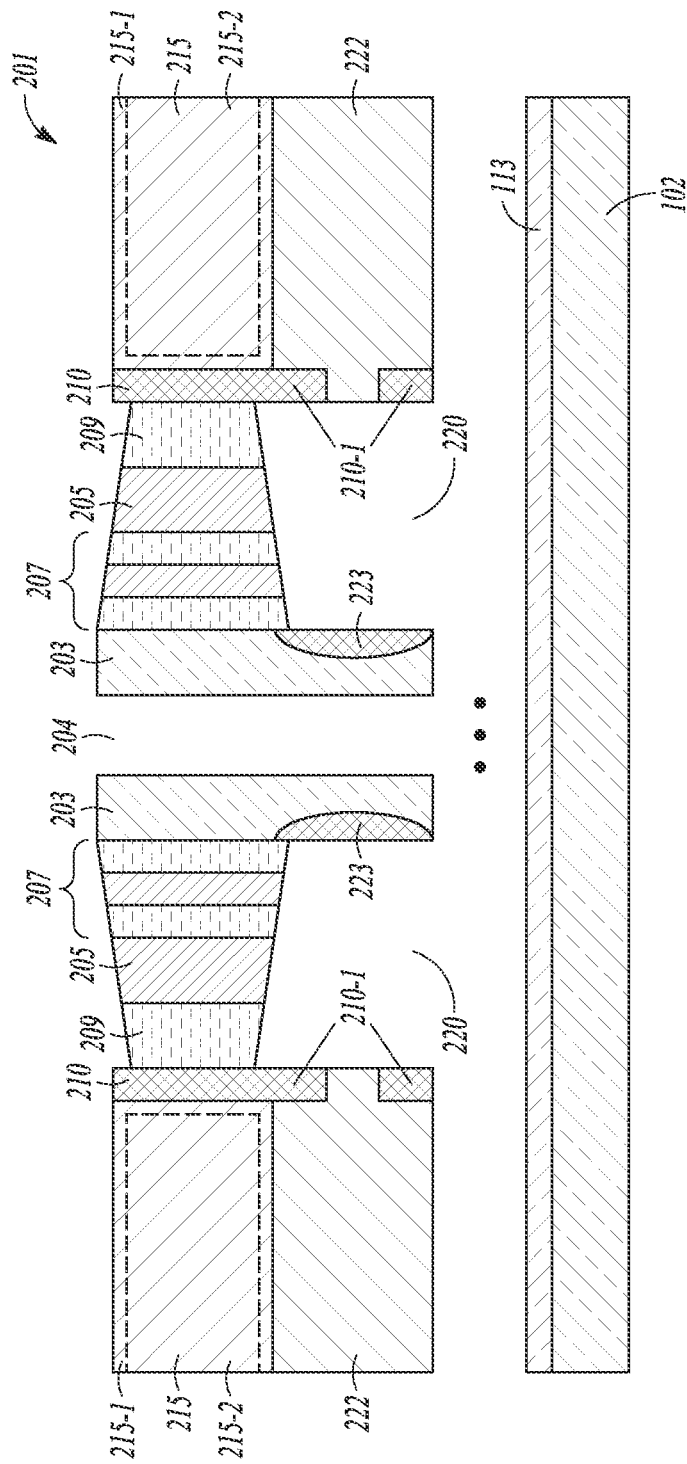
FIG. 2A is a cross-sectional representation of an example charge trap structure, according to various embodiments.

FIG. 2A is a cross-sectional representation of an embodiment of an example CT structure 201, which can be included in a variety of electronic apparatus. Such apparatus can include a memory array, a memory device, an integrated circuit, or other apparatus that includes one or more cells to store charge. The CT structure 201 can include a semiconductor pillar 203, a charge trap region 205, a tunnel region 207, a dielectric blocking region 209, a dielectric barrier 210, and a gate 215, with a void 220 located in a region between a surface on which CI structure 201 is disposed and one or more of dielectric barrier 210, dielectric blocking region 209, charge trap region 205, or tunnel region 207. CT structure 201 can be structured with tunnel region 207 as part of boundaries of void 220 and semiconductor pillar 203 arranged as a vertical boundary of the boundaries of void 220. Dielectric barrier 210 is disposed between and separating dielectric blocking region 209 and the gate 215, and can be disposed in a vertical arrangement with dielectric blocking region 209, charge trap region 205, and tunnel region 207 in which dielectric blocking region 209, charge trap region 205, and tunnel region 207 in an arrangement with semiconductor pillar 203 can be arranged as boundaries of void 220. Dielectric barrier 210 along with dielectric blocking region 209 and charge trap region 205 can be arranged as boundaries of void 220.

In various embodiments, arrangements of CT structure 201 with a conductive region 213 can have a number of different structural arrangements. CT structure 201 can be separated from conductive region 113 by an access transistor that can be a transistor structure different from a CT that can operatively act as a transmission gate to provide operational coupling of conductive region 213 to CT structure 201. CT structure 201 can be separated from conductive region 213 by a number of such access transistors. In some structures, semiconductor pillar 203 of CT 201 may be coupled to and integrated in the one or more access transistors such that coupling of semiconductor pillar 203 with conductive region 213 is made by channels of the access transistors to which semiconductor pillar 203 is integrated.

A portion of dielectric barrier 210 an extend vertically below a bottom surface of gate 215 as a fin 210-1. Fin 210-1 is a component of dielectric barrier 210 that provided a mechanism to form void 220 and can remain in the completed CT structure 201. Alternatively, after forming an opening to structure boundaries of void 220, fin 210-1 may be removed or significantly reduced, leaving dielectric barrier 210 substantially confined to regions directly between gate 215 and dielectric blocking region 209.

Charge trap structure 201 is disposed above conductive region 213 that is located on a substrate 202. In FIG. 2A, a space is shown between the bottom of charge trap structure 201 and conductive region 213 to indicate that there may be additional materials and/or integrated circuit structures between charge trap structure 201 and conductive region 213, as noted above. An isolation region or other integrated circuit structures can separate components of the charge trap structure 201 from conductive region 213. Alternatively, the CT structure 201 can be disposed on conductive region 213, without a separation or coupling region, with gate 215 separated from conductive region 213 by a sealing dielectric 222. As noted above, CT structure 201 can be disposed above conductive region 213 with gate 215 separated from an access transistor, which couples CT structure 201 to conductive region 213, by sealing dielectric 222.

Sealing dielectric 222 is a region for CT structure 201 used to seal off void 220 during processing of different areas of the electronic apparatus in which CT structure 201 is integrated, where portions of sealing dielectric 222 remain in the completed structure, continuing to seal void 220. Void 220 can be contained within a region bounded by semiconductor pillar 203 and bounded by tunnel region 207, charge trap region 205, dielectric barrier 210, sealing dielectric 222, and a region on which CT structure 201 is disposed and/or conductive region 213, where sealing dielectric 222 is disposed on portions of gate 215. With CT structure 201 arranged without fin 210-1, the extent of sealing dielectric 222, as a boundary of void 220, toward semiconductor pillar 203 can be limited by the process to form sealing dielectric 222. Further, electrical connections of gate 215, semiconductor pillar 203, and conductive region 213 to other components of an apparatus, in which CT structure 201 is integrated, are not shown to focus on CT structure 201.

Semiconductor pillar 203 is operable to conduct a current and gate 215 is operable to control storage of charge in the charge storage region 205. Gate 215 can be a metal gate. Gate 215 can include combinations of metals and metallic compounds. Gate 215 is conductive and can include, but is not limited to, conductive titanium nitride and/or tungsten. For example, gate 215 can include a conductive titanium nitride region 215-1 on which a tungsten region 215-2 is disposed. Semiconductor pillar 203 can include, but not limited to polycrystalline silicon (poly silicon). The semiconductor material of semiconductor pillar 203 may have a majority carrier concentration that is less than the majority carrier concentration of conductive region 213, with conductive region 213 structured as a semiconductor region. The difference in majority carrier concentration can be orders of magnitude in powers of base 10.

Semiconductor pillar 203 associated with CT structure 201 can be considered to have two sections. One section is adjacent to and contacting tunnel region 207 and the other section is adjacent to and is a boundary of void 220. Semiconductor pillar 203 can include higher carrier doping levels in a region 223 of semiconductor pillar 203 bounded by void 220 than in regions of semiconductor pillar 203 bounded by tunnel region 207. The higher doping levels in region 223 can be distributed as a gradient along a vertical length of semiconductor pillar 203 with respect to the carrier concentration of semiconductor pillar 203 bounded by tunnel region 207. Such a gradient may be realized with an excess of majority carrier concentration, relative to doping of along semiconductor pillar 203 bounded by tunnel region 207, approaching zero at the beginning of the boundary of semiconductor pillar 203 with tunnel region 207. This dopant gradient can enhance control of gate 215 on semiconductor pillar 203. The higher carrier doping levels can be n-type doping. Alternatively, with semiconductor doping in the various sections of CT structure 201 being p-type, the higher carrier doping levels can be p-type doping. Charge trap structure 201 may be arranged as one of a number of substantially identically structured charge trap structures arranged in a vertical stack such that the tunnel region of one charge trap structure is separated from the tunnel region of an adjacent charge trap structure in the vertical stack by a void, with higher carrier doping levels in regions of the semiconductor pillar 203 between adjacent charge trap structures.

The regions of structure 201 shown in FIG. 2A can be arranged as rings of material around center region 204. Center region 204 can be a dielectric. Center region 204 can be a region of dielectric material, such as, but not limited to, a dielectric oxide. An example of a dielectric oxide in center region 204 can include, but is not limited to, silicon oxide.

Charge trap region 205 is separated from the semiconductor pillar 203 by a tunnel region 207. Charge trap region 205 can be a dielectric material that can store charge from semiconductor pillar 203. Charge trap region 205 can be a dielectric nitride region such as a region including dielectric silicon nitride. Other dielectric materials for charge trap region 205 can be used to trap charge. Tunnel region 207 can be constructed as an engineered region to meet a selected criterion, such as, for example but not limited to, an equivalent oxide thickness (EOT). Tunnel region 207 can include an oxide and a nitride. Tunnel region 207 may include a set of dielectric barriers. The example in FIG. 2A shows tunnel region 207 being a three region tunnel barrier. The three region tunnel harrier can be arranged as a region of dielectric oxide followed by a region of dielectric nitride followed by another region of dielectric oxide. Alternatively, tunnel region 207 can be a two region tunnel barrier or a one region tunnel barrier. Further, tunnel region 207 may have four or more regions, where the selection of material and thicknesses depends on the capability of the material with the given thicknesses to perform as a tunneling region to charge trap region 205.

Dielectric blocking region 209 is disposed adjacent to and contacting charge trap region 205. Dielectric blocking region 209 provides a mechanism to block charge from flowing from charge trap region 205 to gate 215. Dielectric blocking region 209 can be an oxide or other dielectric such as used in tunnel region 207. Gate 215 is disposed on dielectric blocking region 209, but separated from dielectric blocking region 209 by dielectric barrier 210 that is between dielectric blocking region 209 and gate 215, where the material of dielectric barrier 210 is different from the material of dielectric blocking region 209.

Dielectric barrier 210 can have a thickness in the range from about 15 angstroms to about 50 angstroms between dielectric blocking region 209 and gate 215. Selection of material for dielectric barrier 210 can be based on the fabrication of CT structure 201. For example, in a process in which CT structure 201 including void 220 is formed by removing of material from areas to the sides of what is to become CT structure 201, the material for dielectric barrier 210 can be selected such that the material for dielectric barrier 210 resists removal at the processing chemistries and temperatures used in removal of materials from the sides of CT structure 201. Dielectric barrier 210 can include dielectric material different from material of dielectric blocking region 209 such that the dielectric material of the dielectric barrier 210 is capable of withstanding material processing for formation of gate 215 and removal of portions of charge trap region 205 and dielectric blocking region 209 to form void 220. The material for dielectric barrier 210 can act as a mask to prevent removal of dielectric blocking region 209 in such removal processes in formation of CT structures like CT structure 201.

Figure 2B:
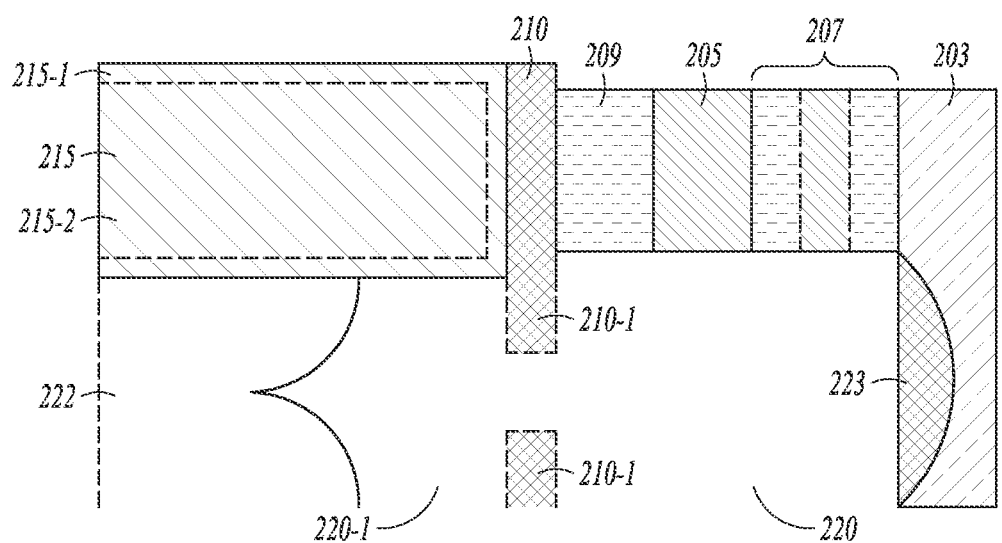
FIG. 2B is a representation of an example of a void structure for the example charge trap structure of FIG. 2A, according to various embodiments.

Dielectric barrier 210 can be realized as an $AlO_x$, region or a dielectric region having a higher dielectric constant, κ, than $AlO_x$. Dielectric barrier 210 can have an electron affinity lower than that aluminum oxide. Dielectric barrier 210 can include one or more of aluminum oxide, hafnium oxide, zirconium oxide, or mixtures of hafnium oxide and/or zirconium oxide with one or more of aluminum oxide, silicon oxide, titanium oxide, gadolinium oxide, niobium oxide, or tantalum oxide. Examples of films that can be used include $HfO_2$ and/or $ZrO_2$ based materials, as well as mixtures with other materials such as $AlO_x$, $SiO_2$, $TiO_2$, $GaO_x$, $NbO_x$, and $Ta_2O_5$. Such materials may not be limited to a particular stoichiometry. Other high-κ dielectrics can be used for dielectric harrier 210, FIG. 2B is an illustration of CT 201 of FIG. 2A in which sealing dielectric 222 is limited in the direction towards semiconductor pillar 203, defining a boundary of void 220. Sealing dielectric 222 may formed by a sealing process that can be implemented using plasma-enhanced chemical vapor deposition (PECVD) or other depleting process. In such depleting processes, the bulk of sealing dielectric is formed at an opening of a passageway with the material of the sealing dielectric decreasing in the passageway along the surfaces of the passageway. The extent of disposition along the passageway depends on a number of factors, which includes the area of the opening of the passageway. As shown in FIG. 2B, sealing dielectric 222 can terminate in a region below gate 215, resulting in two voids. Void 220-1 is under gate 215 and void 220 is under dielectric blocking region 209, charge trap region 105, and tunnel region 207. In CT structures 210 with fin 210-1 of dielectric barrier 210 removed, voids 220-1 and 220 together form a larger void.

In various embodiments, a memory device can be structured as a memory structure in which memory cells to store charge are arranged in different levels in a 3D structure. For example, the memory device can include a 3D NAND stack in which memory cells similar to CT structure 101 or CT structure 201 can be arranged. A NAND array architecture can be arranged as an array of memories (e.g., memory cells) arranged such that the memories of the array are coupled in logical rows to access lines. The access lines may be word lines. Memories of the array can be coupled together in series between common regions, such as source lines, and data lines. The data lines may be bit lines.

The 3D NAND stack can be implemented with a dielectric barrier, such as dielectric barrier 110 or dielectric barrier 210, using materials for the dielectric barrier selected to enable processing of voids between CT structures arranged in the 3D NAND stack. Within CT cells in the 3D NAND stack, the gate of each such CT cell, which may be coupled to an access line, for example a word line, or formed as part of the access line, can be formed in a process in which an initially formed region, having material such as silicon nitride, is removed and replaced by a conductive gate in a number of CT cells in a vertical string in the stack. Such gates may be referred to as replacement gates.

Figure 3:
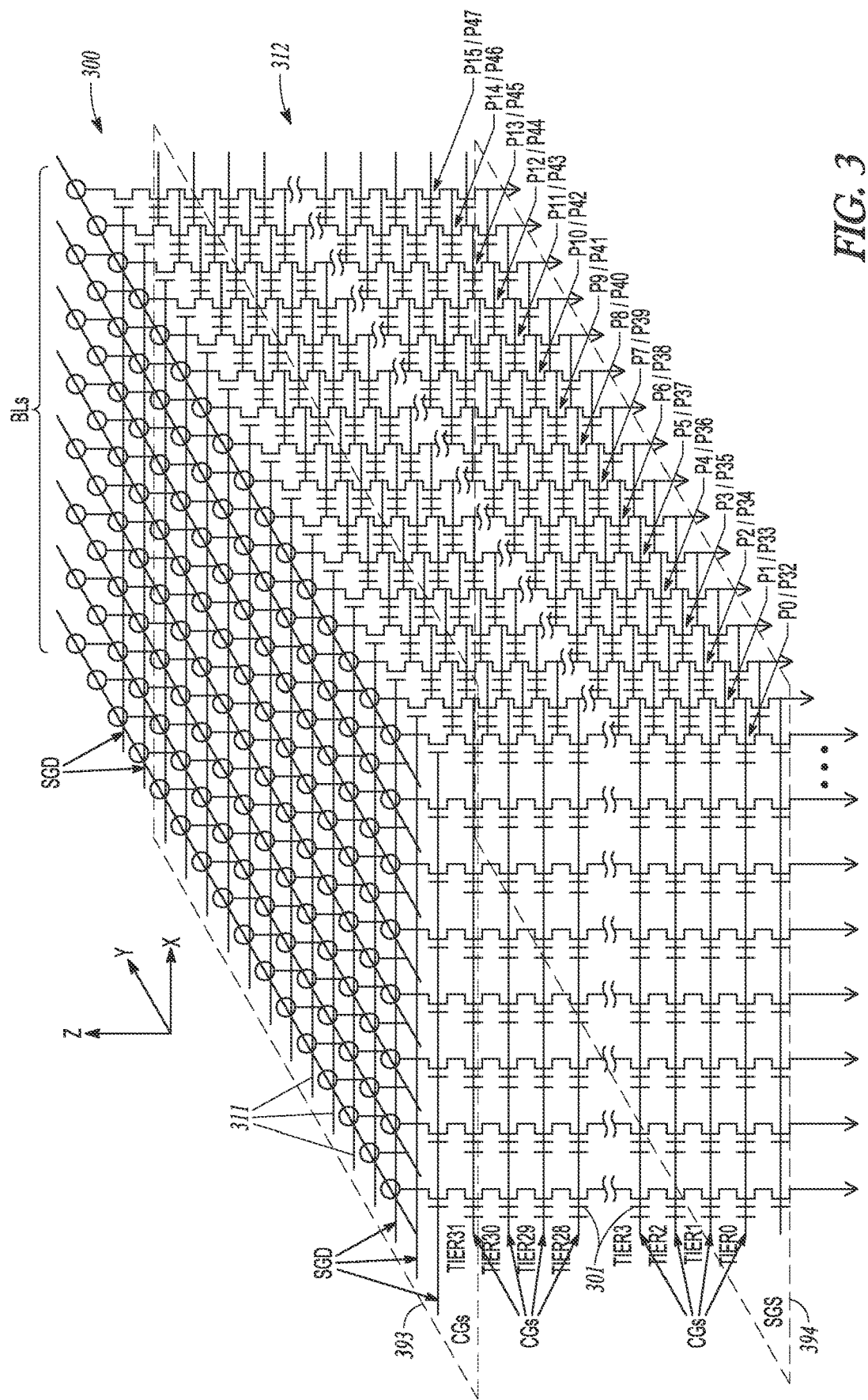
FIG. 3 is a schematic diagram of an example of a block architecture and page address mapping of a memory array of a three-dimensional memory device, according to various embodiments.

FIG. 3 is a schematic diagram of an embodiment of an example of a block architecture and page address mapping of a memory array 312 of a 3D memory device 300. Memory device 300 can be realized in the form of a 3D NAND memory device 300. Memory device 300 can comprise multiple vertical strings 311 of charge storage devices 301. In the Z direction shown in FIG. 3, each string 311 of charge storage devices can comprise multiple storage devices 301 stacked over one another with each charge storage device 301 corresponding to one of multiple tiers. For example, as shown in FIG. 3, thirty-two charge storage devices are stacked over one another in a string with each charge storage device 301 corresponding to one of thirty-two tiers shown as Tier0-Tier31. The number of storage devices and tiers in the Z direction are not limited to thirty-two. The charge storage devices 301 of a respective string 311 may share a common channel region, such as one formed in a respective pillar of semiconductor material (e.g., polysilicon) about which the string of charge storage devices are formed. The pillars may be polysilicon, monocrystalline silicon, or other semiconductor structure in which transistors can be fabricated.

In the X direction shown in FIG. 3, sixteen groups of strings may comprise eight strings that share thirty two access lines, CGs. Each of the access lines CGs may couple (e.g., electrically or otherwise operatively connect) the charge storage devices 301 corresponding to a respective tier of each string 311 of a corresponding one of the eight strings. The charge storage devices 301 coupled by the same access line, CG, (and thus corresponding to the same tier) may be logically grouped into, for example, two pages, such as P0/P32, P1/P33, P2/P34 and so on, when each charge storage device comprise a multi-level cell capable of storing multiple bits of information. Memory device 300 can be arranged to operate each charge storage device as a quad level cell. The page address mapping counts up horizontally in the same tier.

In the Y direction shown in FIG. 3, eight groups of strings can comprise sixteen strings coupled to a corresponding one of eight data lines (BLs). The structure with respect to the SGSs in this example is one plate 394, which connects 16 pillar strings together, and the structure with respect to the CGs is one plate 393, which connects 16 pillar strings together. The SGD is separated by one pillar string. The number of the strings, tiers, access lines, data lines, groups of strings in each direction, and/or pages may be greater or smaller than those shown in FIG. 3.

The vertical strings 311 can include a pillar of semiconductor material with a number of charge storage devices 301 arranged along each vertical string. Each charge storage device 301 can include a charge trap region separated from the pillar of a respective vertical string by a tunnel region; a dielectric blocking region on the charge trap region; a gate on the dielectric blocking region to control storage of charge in the charge storage region, the gate coupled to an access line; and a dielectric barrier between the dielectric blocking region and the gate, with a void located between one or more of the dielectric barrier, the dielectric blocking region, the charge trap region, or tunnel region of charge storage device 301 and an adjacent charge storage device 301. In an arrangement, charge storage device 301 can be structured with its charge trap region recessed vertically with respect to its dielectric blocking region in the void and its tunneling region arranged as a vertical boundary of the boundaries of the void. In another arrangement, charge storage device 301 can be structured with its tunnel region as part of upper boundaries of the void and its channel arranged as a vertical boundary of the boundaries of the void. A number of other structures of charge storage device 301 can be realized with different ones or combinations of its dielectric barrier, the dielectric blocking region, the charge trap region, tunnel region, and channel arranged as a vertical boundary of a void associated with charge storage device 301.

In various embodiments in which a channel, structured as a pillar of semiconductor material, is common to all charge storage devices 301 in string 311, the common channel can include higher carrier doping levels in a region of the channel between adjacent charge storage devices 301 bounded by a void than in regions of the common channel bounded by the tunnel region of each charge storage devices 301. The higher carrier doping levels can be realized as a doping gradient between adjacent charge storage devices 301. The doping gradient may include a gradient across the common channel along the common channel between adjacent charge storage devices 301. The gate of each charge storage device 301 can be coupled to or integrated with an access line CG corresponding to the location in memory array 312 of the respective charge storage device 301. Charge storage device 301 may be realized in a manner similar to a CT structure associated with FIGS. 1A, 1B, 2A, and 2B.

The components of charge storage device 301 can be implemented by selecting properties from a number of different parameters. The dielectric barrier of charge storage device 301 can include one or more of aluminum oxide, hafnium oxide, zirconium oxide, or mixtures of hafnium oxide and/or zirconium oxide with one or more of aluminum oxide, silicon oxide, titanium oxide, gadolinium oxide, niobium oxide, or tantalum oxide. Other high-κ dielectrics can be used for the dielectric barrier. The dielectric barrier can have a thickness in a range from about 15 angstroms to about 50 angstroms from the dielectric blocking region to the gate of charge storage device 301.

The tunnel region of charge storage device 301 can be implemented as a three region tunnel barrier. Such a three region tunnel barrier can be implemented as a region of dielectric oxide followed by a region of dielectric nitride followed by another region of dielectric oxide. The tunnel region of charge storage device 301 can be implemented as a multiple region barrier other than three regions. Such a multiple region barrier can be implemented such that the selection of material and thicknesses of the regions depends on the capability of the material with the given thicknesses to perform a tunneling region to the charge trap region of charge storage device 301. The gate of charge storage device 301 can be implemented as a metal gate or a gate including a combination of metal and metallic compounds. The channel of charge storage device 301 in a string 311 can be implemented as a poly silicon channel.

Figure 4:
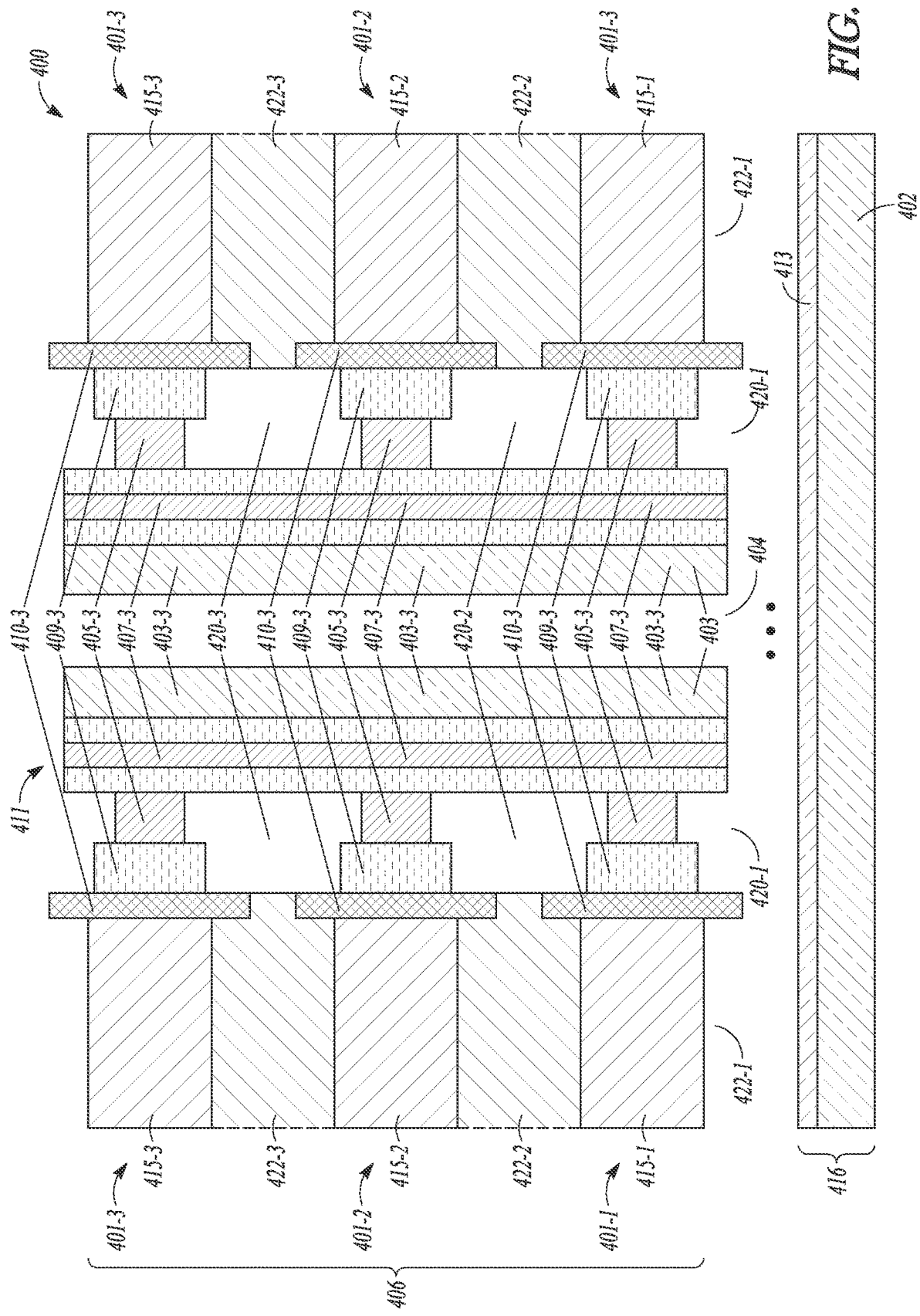
FIG. 4 is a cross-sectional representation of an example of a number of charge trap structures in a vertical string of a memory device, according to various embodiments.

FIG. 4 is a cross-sectional representation of an embodiment of a number of CT structures, for example CT structures 401-1, 401-2, and 401-3, in a vertical string 411 of a memory device 400. Vertical string 411 can be one of multiple strings of a memory array of a 3D memory. An example of a 3D memory device with multiple vertical strings is shown in FIG. 3. Other 3D memory devices with multiple vertical strings can be structured with CT memory cells, similar to CT structures 101 of FIG. 1A or 1B. Other vertical strings in a 3D memory device can be structured similar to vertical string 411, arranged with different sets of electrical connections.

Vertical string 411 includes a pillar 403 of semiconductor material coupled to and part of CT structures 401-1, 401-2, and 401-3. Memory device 400 is not limited to three CT structures in a vertical string. FIG. 4 shows three CT structures to focus on the architecture of CT structures arranged in a vertical stack 406 along or as part of vertical string 411. Vertical string 411 can be include more than three CT structures, for example, 8, 16, 32, 64, or other number of CT structures coupled to pillar 403 of vertical string 411 depending on the memory size of memory device 400 or other factors for an architecture for memory device 400. Each CT structure can be arranged as a memory cell of a string, where each CT structure is at a different vertical level than the other CT structures of the string, which each vertical level is a tier of the memory array of the memory device.

Stack 406 can be supported by a base 416. In FIG. 4, a space is shown between the bottom of stack 406 and base 416 to indicate that there may be additional materials and/or integrated circuit structures between base 416 and stack 406. In various applications, such additional integrated materials may include, for example, a source-side select transistor material. Base 416 may include a conductive region 413 on a substrate 402. Depending on the architecture of memory device 400, conductive region 413 may be a source region. Conductive region 413 may include semiconductor material. The semiconductor material may include, but is not limited to, monocrystalline silicon or polycrystalline silicon. Substrate 402 may be a semiconductor substrate or a substrate having a combination of semiconductor material and insulating material.

CT structure 401-1 is arranged as a first charge trap structure along vertical string 411, above which charge trap structures 401-2 and 401-3 are arranged in vertical stack 406 with each of charge trap structures 401-2 and 401-3 disposed above another CT structure of vertical stack 406. The semiconductor material of pillar 403 is arranged as a pillar 403-1, 403-2, and 403-3 for CT structures 401-1, 401-2, and 401-3, respectively. Each of CT structures 401-1, 401-2, and 401-3 includes a tunnel region 407-1, 407-2, and 407-3, respectively, adjacent and contacting their respective channels 403-1, 403-2, and 403-3. Tunnel region 407-1 of first CT structure 401-1 can extend along pillar 403 of semiconductor material associated with string 411 and can extend through the other CT structures 401-2 and 401-3 as tunnel regions 407-2 and 407-3 of each respective CT structure 401-2 and 401-3.

Each of tunnel regions 407-1, 407-2, and 407-3 can be implemented as a set of tunnel barriers. For example, each of tunnel regions 407-1, 407-2, and 407-3 can be implemented as a three region tunnel barrier. Such a three region tunnel barrier can be implemented as a region of dielectric oxide followed by a region of dielectric nitride followed by another region of dielectric oxide. Each of tunnel regions 407-1, 407-2, and 407-3 may be implemented as a two region tunnel barrier. Each of tunnel regions 407-1, 407-2, and 407-3 may be implemented as a one region tunnel barrier. Further, each of tunnel regions 407-1, 407-2, and 407-3 may have four or more regions, where the selection of material and thicknesses of these tunnel regions depends on the capability of the material with the given thicknesses to perform as a tunneling region.

Each of CT structures 401-1, 401-2, and 401-3 includes a charge trap region 405-1, 405-2, and 405-3, respectively, adjacent and contacting their respective tunnel regions 407-1, 407-2, and 407-3. Each of charge trap regions 405-1, 405-2, and 405-3 can be a dielectric material that can store charge from channels 403-1, 403-2, and 403-3, respectively. Charge trap regions 405-1, 405-2, and 405-3 can be realized as a dielectric nitride region such as a region including dielectric silicon nitride. Other dielectric materials for charge trap regions 405-1, 405-2, and 405-3 can be used to trap charge. Each of CT structures 401-1, 401-2, and 401-3 includes a dielectric blocking region 409-1, 409-2, and 409-3, respectively, adjacent and contacting their respective charge trap region 405-1, 405-2, and 405-3.

Each of CT structures 401-1, 401-2, and 401-3 includes a dielectric barrier 410-1, 410-2, and 410-3 and a gate 415-1, 415-2, and 415-3, respectively, where each dielectric barrier 410-1, 410-2, and 410-3 is disposed between dielectric blocking region 409-1, 409-2, and 409-3 and gates 415-1, 415-2, and 415-3 of their respective CT structures 401-1, 401-2, and 401-3. Each of dielectric barriers 410-1, 410-2, and 410-3 can be implemented using materials for the dielectric barriers selected to enable processing of voids between CT structures 401-1, 401-2, and 401-3 arranged in the 3D stack 406 associated with string 411. 3D stack 406 can be realized as a 3D NAND stack 406. Each of dielectric barriers 410-1, 410-2, and 410-3 can include an aluminum oxide or a dielectric having a dielectric constant greater than that of aluminum oxide. Each of dielectric barriers 410-1, 410-2, and 410-3 can include one or more of hafnium oxide, zirconium oxide, or mixtures of hafnium oxide and/or zirconium oxide with one or more of aluminum oxide, silicon oxide, titanium oxide, gadolinium oxide, niobium oxide, or tantalum oxide. Other high-κ dielectrics can be used for each of dielectric barriers 410-1, 410-2, and 410-3.

CT structures 401-3, 401-2, and 401-1 can be separated from adjacent CT structures by voids 420-3, 420-2, and 420-1, respectively. The charge trap region and the dielectric blocking region of a CT structure can be separated from the charge trap region and the dielectric blocking region of an adjacent CT structure in a vertical stack by an associated void. The dielectric barrier of each CT structure can be arranged with the charge trap region and the dielectric blocking region of the respective CT structure such that the charge trap region of the respective CT structure is recessed vertically with respect to the dielectric blocking region in the void. The dielectric blocking region of the respective CT structure may be recessed in the void vertically with respect to the dielectric barrier and/or the gate of the of the respective CT structure.

Void 420-3 is between CT structures 401-3 and 401-2. Void 420-3 can include one or more of dielectric barrier 410-3, dielectric blocking region 409-3, or charge trap region 405-3 of CT structure 401-3 and one or more of dielectric barrier 410-2, dielectric blocking region 409-2, or charge trap region 405-2 of CT structure 401-2 as boundaries of void 420-3. Material of tunnel region 420-3 of CT structure 401-3 extends to tunnel region 420-2 of CT structure 401-2 and provides a vertical boundary for void 420-3. In various embodiments, one or both of dielectric barriers 410-3 and 410-2 of CT structures 401-3 and 401-2, respectively, may terminate near edges of their respective gates 415-3 and 415-2 such that CT structures 401-3 and 401-2 do not include fin structures of dielectric barriers 410-3 and 410-2 shown in FIG. 4. (See discussion of fin structures with respect to CT structure 101 of FIGS. 1A and 1B) Charge trap region 405-3 of CT structure 401-3 can be separated from charge trap region 405-2 of adjacent CT structure 401-2 in the vertical stack 406 by void 420-3. Charge trap region 405-3 and dielectric blocking region 409-3 of CT structure 401-3 can be separated from charge trap region 405-2 and dielectric blocking region 409-2 of adjacent CT structure 401-2 in the vertical stack 406 by void 420-3. Dielectric barrier 410-3 of CT structure 401-3 can be arranged with charge trap region 405-3 and dielectric blocking region 409-3, where charge trap region 405-3 is recessed vertically with respect to dielectric blocking region 409-3 in void 420-3. Dielectric blocking region 409-3 may be recessed in void 420-3 vertically with respect to dielectric barrier 410-3 and/or gate 415-3. Dielectric barrier 410-2 of CT structure 401-2 can be arranged with charge trap region 405-2 and dielectric blocking region 409-2, where charge trap region 405-2 is recessed vertically with respect to dielectric blocking region 409-2 in void 420-3. Dielectric blocking region 409-2 may be recessed in void 420-3 vertically with respect to dielectric barrier 410-2 and/or gate 415-2.

Void 420-2 is between CT structures 401-2 and 401-1. Void 420-2 can include one or more of dielectric barrier 410-2, dielectric blocking region 409-2, or charge trap region 405-2 of CT structure 401-2 and one or more of dielectric barrier 410-2, dielectric blocking region 409-2, or charge trap region 405-2 of CT structure 401-2 as boundaries of void 420-2. Material of tunnel region 420-2 of CT structure 401-2 extends to tunnel region 420-1 of CT structure 401-1 and provides a vertical boundary for void 420-2. In various embodiments, one or both of dielectric barriers 410-2 and 410-1 of CT structures 401-2 and 401-1, respectively, may terminate near edges of their respective gates 415-2 and 415-1 such that CT structures 401-2 and 401-1 do not include fin structures of dielectric barriers 410-2 and 410-1 shown in FIG. 4. (See discussion of fin structures with respect to CT structure 101 of FIGS. 1A and 1B.) Charge trap region 405-2 of CT structure 401-2 can be separated from charge trap region 405-1 of adjacent CT structure 401-1 in the vertical stack 406 by void 420-2. Charge trap region 405-2 and dielectric blocking region 409-2 of CT structure 401-2 can be separated from charge trap region 405-1 and dielectric blocking region 409-1 of adjacent CT structure 401-1 in the vertical stack 406 by void 420-2. Dielectric barrier 410-2 of CT structure 401-2 can be arranged with charge trap region 405-2 and dielectric blocking region 409-2 such that charge trap region 405-2 is recessed vertically with respect to dielectric blocking region 409-2 in void 420-2. Dielectric blocking region 409-2 may be recessed in void 420-2 vertically with respect to dielectric barrier 410-2 and/or gate 415-2. Dielectric barrier 410-1 of CT structure 401-1 can be arranged with charge trap region 405-1 and dielectric blocking region 409-1 such that charge trap region 405-1 is recessed vertically with respect to dielectric blocking region 409-1 in void 420-2. Dielectric blocking region 409-1 may be recessed in void 420-2 vertically with respect to dielectric barrier 410-1 and/or gate 415-1.

Void 420-1 is between CT structure 401-1 and a surface on which stack 406 is disposed. Void 420-1 can include one or more of dielectric barrier 410-1, dielectric blocking region 409-1, or charge trap region 405-1 of CT structure 401-1 and the surface on which stack 406 is disposed as boundaries of void 420-1. Material of tunnel region 420-1 of CT structure 401-1 can extend to the surface on which stack 406 is disposed and can provide a vertical boundary for void 420-1. In various embodiments, one of both of dielectric barrier 410-1 CT structure 401-1 may terminate near edges of gate 415-1 such that CT structure 401-1 does not include fin structures of dielectric barrier 410-1 shown in FIG. 4. (See discussion of fin structures with respect to CT structure 101 of FIGS. 1A and 1B.) Charge trap region 405-1 of CT structure 401-1 can be separated from the surface on which stack 406 is disposed by void 420-1. Charge trap region 405-1 and dielectric blocking region 409-1 of CT structure 401-1 can be separated from the surface on which stack 406 is disposed by void 420-1. Dielectric barrier 410-1 of CT structure 401-1 can be arranged with charge trap region 405-1 and dielectric blocking region 409-1 such that charge trap region 405-1 is recessed vertically with respect to dielectric blocking region 409-1 in void 420-1. Dielectric blocking region 409-1 may be recessed in void 420-1 vertically with respect to dielectric barrier 410-1 and/or gate 415-1.

Each of voids 420-1, 420-2, and 420-3 can be sealed by a dielectric region 422-1, 422-2, and 422-3, respectively. Dielectric regions 422-1, 422-2, and 422-3 can be part of the boundaries of voids 420-1, 420-2, and 420-3, respectively. Dielectric region 422-1 can be located on the surface on which stack 406 is disposed, which may be conductive region 413, and can extend to and can be located on a portion of gate 415-1 of CT structure 401-1. Dielectric region 422-2 can be located on a portion of gate 415-2 of CT structure 401-2 and can extend to and be located on a portion of gate 415-1 of CT structure 401-1. Dielectric region 422-3 can be located on a portion of gate 415-3 of CT 401-3 and can extend to and be located on a portion of gate 415-2 of CT structure 401-2. In various embodiments, one or more of dielectric regions 422-1, 422-2, and 422-3 may terminate along and between the gates of adjacent CT structures, where, in such cases, effectively two voids may be arranged. Each of voids 420-1, 420-2, and 420-3 are one of the voids associated with such a termination and the other effective void associated with each of dielectric regions 422-3, 422-2, and 422-1 is a void between gates of adjacent CT structures 401-3, 401-2, 401-1, and the surface on which stack 406 is disposed, respectively. Such sealing dielectric regions 422-1, 422-2, and 422-3 can be realized similar to sealing dielectric regions discussed with respect to FIGS. 1A and 1B.

Pillar 403 of string 411 of memory device 400 can be structured as a doped semiconductor hollow channel. By hollow channel is meant that the region in the center of the 3-D channel can be filled by a material different than the material of the channel. Pillar 403 can include poly silicon as a hollow channel surrounding a dielectric 404. The regions of structure 400 shown in FIG. 4 can be arranged as rings of material around center region 404. Pillar 403 can operatively conduct a current between conductive region 413 and a conductive data line coupled to pillar 403. Such conductive data line may be coupled to pillar 403 by an access transistor. In various 3D memory architectures, such arrangement of conductive region 413 and a conductive data line coupled to pillar 403 can be provided with conductive region 413 being a source region and conductive data line being a data line. The current can be affected by the charge stored in CT structures 401-1, 401-2, and 401-3 along string 411, where control of storing the charge is by the gates 415-1, 415-2, and 415-3 of CT structures 401-1, 401-2, and 401-3. Gates 415-1, 415-2, and 415-3 can be incorporated in access lines of a memory array of memory device 400. The access lines may be word lines.

Voids 420-1, 420-2, and 430-3 provide a mechanism to address coupling between charge trap regions and access line-to-access line RC (product of resistance and capacitance) issues associated with conventional memory arrays. Voids 420-1, 420-2, and 430-3 and the separation of charge trap regions 405-1, 405-2, and 405-3, as discussed with respect to FIG. 4, provide isolation to limit such coupling and RC issues. The void arrangements between CT structures 401-1, 401-2, and 401-3 allow for tier pitch scaling of a 3D memory structure, such as 3D NAND, to around 30 nm from current values of 65 to 60 nm. Structural designs, and associated processing, similar to memory device 400 enable less tier deposition of tool capacity for vertical scaling of a 3D NAND using replacement gate processing. The separation of charge trap regions between adjacent CT structures of a memory similar to memory device 400 avoids or minimizes trapped charge hopping that occurs between adjacent CT structures for small gate-to-gate spacing with continuous charge trap regions between adjacent CT structures. The voids may allow for avoiding or minimizing coupling between charge trap regions. The reduced coupling and charge hopping enables the design of memory device 400 and similar memories to have thinner stacks of memory cells. Formation of these voids can provide for access line (gate) capacitance to be held in check, that is, controlled and, in conduction with limiting the dielectric barriers to vertical deployments with respect to their associated gates, can also allow for reduction in access line (gate) resistance.

Figure 5:
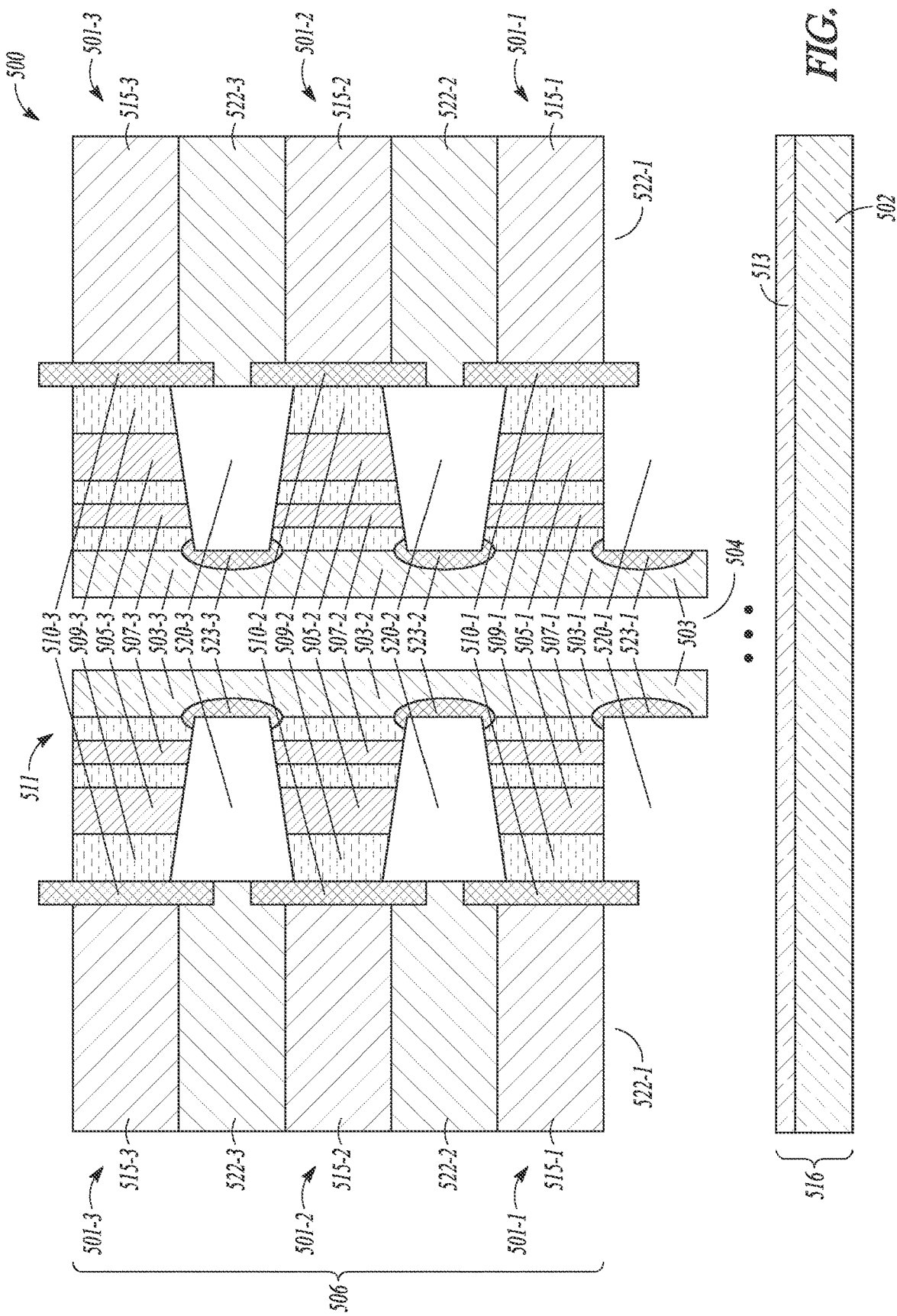
FIG. 5 is a cross-sectional representation of an example of a number of charge trap structures in a vertical string of a memory device, according to various embodiments.

FIG. 5 is a cross-sectional representation of an embodiment of a number of CT structures, for example CT structures 501-1, 501-2, and 501-3, in a vertical string 511 of a memory device 500. Vertical string 511 can be one of multiple strings of a memory array of a 3D memory. An example of a 3D memory device with multiple vertical strings is shown in FIG. 3. Other 3D memory devices with multiple vertical strings can be structured with CT memory cells, similar to CT structures 201 of FIG. 2A or 2B. Other vertical strings in a 3D memory device can be structured similar to vertical string 511, arranged with different sets of electrical connections.

Vertical string 511 includes a pillar 503 of semiconductor material coupled to and part of CT structures 501-1, 501-2, and 501-3. Memory device 500 is not limited to three CT structures in a vertical string. FIG. 5 shows three CT structures to focus on the architecture of CT structures arranged in a vertical stack 506 along or as part of vertical string 511. Vertical string 511 can be include more than three CT structures, for example, 8, 16, 32, 64, or other number of CT structures coupled to pillar 503 of vertical string 511 depending on the memory size of memory device 500 or other factors for an architecture for memory device 500. Each CT structure can be arranged as a memory cell of a string, where each CT structure is at a different vertical level than the other CT structures of the string, which each vertical level is a tier of the memory array of the memory device.

Stack 506 can be supported by a base 516. In FIG. 5, a space is shown between the bottom of stack 506 and base 516 to indicate that there may be additional materials and/or integrated circuit structures between base 516 and stack 506. In various applications, such additional integrated materials may include, for example, a source-side select transistor material. Base 516 may include a conductive region 513 on a substrate 502. Depending on the architecture of memory device 500, conductive region 513 may be a source region. Conductive region 513 may include semiconductor material. The semiconductor material may include, but is not limited to, monocrystalline silicon or polycrystalline silicon. Substrate 502 may be a semiconductor substrate or a substrate having a combination of semiconductor material and insulating material.

CT structure 501-1 is arranged as a first charge trap structure along vertical string 511, above which charge trap structures 501-2 and 501-3 are arranged in vertical stack 506 with each of charge trap structures 501-2 and 501-3 disposed above another CT structure of vertical stack 506. The semiconductor material of pillar 503 is arranged as a channel 503-1, 503-2, and 503-3 for CT structures 501-1, 501-2, and 501-3, respectively, such that pillar 503 extends between and through CT structures 501-1, 501-2, and 501-3. Each of CT structures 501-1, 501-2, and 501-3 includes a tunnel region 507-1, 507-2, and 507-3, respectively, adjacent and contacting their respective channels 503-1, 503-2, and 503-3.

Each of tunnel regions 507-1, 507-2, and 507-3 can be implemented as a set of barriers. For example, each of tunnel regions 507-1, 507-2, and 507-3 can be implemented as a three region tunnel barrier. Such a three region tunnel barrier can be implemented as a region of dielectric oxide followed by a region of dielectric nitride followed by another region of dielectric oxide. Each of tunnel regions 507-1, 507-2, and 507-3 may be implemented as a two region tunnel barrier. Each of tunnel regions 507-1, 507-2, and 507-3 may be implemented as a one region tunnel barrier. Further, each of tunnel regions 507-1, 507-2, and 507-3 may have four or more regions, where the selection of material and thicknesses of these tunnel regions depends on the capability of the material with the given thicknesses to perform as a tunneling region.

Each of CT structures 501-1, 501-2, and 501-3 includes a charge trap region 505-1, 505-2, and 505-3, respectively, adjacent and contacting their respective tunnel regions 507-1, 507-2, and 507-3. Each of charge trap regions 505-1, 505-2, and 505-3 can be a dielectric material that can store charge from channels 503-1, 503-2, and 503-3, respectively. Charge trap regions 505-1, 505-2, and 505-3 can be realized as a dielectric nitride region such as a region including dielectric silicon nitride. Other dielectric materials for charge trap regions 505-1, 505-2, and 505-3 can be used to trap charge. Each of CT structures 501-1, 501-2, and 501-3 includes a dielectric blocking region 509-1, 509-2, and 509-3, respectively, adjacent and contacting their respective charge trap region 505-1, 505-2, and 505-3.

Each of CT structures 501-1, 501-2, and 501-3 includes a dielectric barrier 510-1, 510-2, and 510-3 and a gate 515-1, 515-2, and 515-3, respectively, where each dielectric barrier 510-1, 510-2, and 510-3 is disposed between dielectric blocking region 509-1, 509-2, and 509-3 and gates 515-1, 515-2, and 515-3 of their respective CT structures 501-1, 501-2, and 501-3. Each of dielectric barriers 510-1, 510-2, and 510-3 can be implemented using materials for the dielectric barriers selected to enable processing of voids between CT structures 501-1, 501-2, and 501-3 arranged in the 3D stack 506 associated with string 511. 3D stack 506 can be realized as a 3D NAND stack 506. Each of dielectric barriers 510-1, 510-2, and 510-3 can include an aluminum oxide or a dielectric having a dielectric constant greater than that of aluminum oxide. Each of dielectric barriers 510-1, 510-2, and 510-3 can include one or more of hafnium oxide, zirconium oxide, or mixtures of hafnium oxide and/or zirconium oxide with one or more of aluminum oxide, silicon oxide, titanium oxide, gadolinium oxide, niobium oxide, or tantalum oxide. Other high-κ dielectrics can be used for each of dielectric barriers 510-1, 510-2, and 510-3.

CT structures 501-3, 501-2, and 501-1 can be separated from adjacent CT structures by voids 520-3, 520-2, and 520-1, respectively. The tunnel region of a CT structure can be separated from the tunnel region of an adjacent CT structure in a vertical stack by an associated void. In addition, the charge trap region and the dielectric blocking region of the respective CT structure may be separated from the charge trap region and the dielectric blocking region of the adjacent CT structure in a vertical stack by the associated void.

Void 520-3 is between CT structures 501-3 and 501-2. Void 520-3 can include one or more of dielectric barrier 510-3, dielectric blocking region 509-3, charge trap region 505-3, or tunnel region 507-3 of CT structure 501-3 and one or more of dielectric barrier 510-2, dielectric blocking region 509-2, charge trap region 505-2, or tunnel region 507-2 of CT structure 501-2 as boundaries of void 520-3. Material of channel 520-3 of CT structure 501-3 extends to channel 520-2 of CT structure 501-2 and provides a vertical boundary for void 520-3. In various embodiments, one of both of dielectric barriers 510-3 and 510-2 of CT structures 501-3 and 501-2, respectively, may terminate near edges of their respective gates 515-3 and 515-2 such that CT structures 501-3 and 501-2 do not include fin structures of dielectric barriers 510-3 and 510-2 shown in FIG. 5. (See discussion of fin structures with respect to CT structure 201 of FIGS. 2A and 2B.) Tunnel region 507-3 of CT structure 501-3 can be separated from tunnel region 507-2 of adjacent CT structure 501-2 in the vertical stack 506 by void 520-3. Charge trap region 505-3 and dielectric blocking region 509-3 of CT structure 501-3 can be separated from charge trap region 505-2 and dielectric blocking region 509-2 of adjacent CT structure 501-2 in the vertical stack 506 by void 520-3. In variations of the structure of memory device 500 illustrated in FIG. 5, dielectric barrier 510-3 of CT structure 501-3 may be arranged with charge trap region 505-3 and dielectric blocking region 509-3 such that charge trap region 505-3 is recessed vertically with respect to dielectric blocking region 509-3 in void 520-3. In addition, dielectric blocking region 509-3 may be recessed in void 520-3 vertically with respect to dielectric barrier 510-3 and/or gate 515-3. Such variations may include dielectric barrier 510-2 of CT structure 501-2 arranged with charge trap region 505-2 and dielectric blocking region 509-2 such that charge trap region 505-2 is recessed vertically with respect to dielectric blocking region 509-2 in void 520-3. In addition, dielectric blocking region 509-2 may be recessed in void 520-3 vertically with respect to dielectric barrier 510-2 and/or gate 515-2.

Void 520-2 is between CT structures 501-2 and 501-1. Void 520-2 can include one or more of dielectric barrier 510-2, dielectric blocking region 509-2, charge trap region 505-2, or tunnel region 507-2 of CT structure 501-2 and one or more of dielectric barrier 510-1, dielectric blocking region 509-1, charge trap region 505-1, or tunnel region 507-1 of CT structure 501-1 as boundaries of void 520-2. Material of channel 520-2 of CT structure 501-2 extends to channel 520-1 of CT structure 501-1 and provides a vertical boundary for void 520-2. In various embodiments, one of both of dielectric barriers 510-2 and 510-1 of CT structures 501-2 and 501-1, respectively, may terminate near edges of their respective gates 515-1 and 515-1 such that CT structures 501-2 and 501-1 do not include fin structures of dielectric barriers 510-2 and 510-1 shown in FIG. 5. (See discussion of fin structures with respect to CT structure 201 of FIGS. 2A and 2B.) Tunnel region 507-2 of CT structure 501-2 can be separated from tunnel region 507-2 of adjacent CT structure 501-2 in the vertical stack 506 by void 520-2. Charge trap region 505-2 and dielectric blocking region 509-2 of CT structure 501-2 can be separated from charge trap region 505-1 and dielectric blocking region 509-1 of adjacent CT structure 501-1 in vertical stack 506 by void 520-2. In variations of the structure of memory device 500 illustrated in FIG. 5, dielectric barrier 510-2 of CT structure 501-2 may be arranged with charge trap region 505-2 and dielectric blocking region 509-2 such that charge trap region 505-2 is recessed vertically with respect to dielectric blocking region 509-2 in void 520-2. In addition, dielectric blocking region 509-2 may be recessed in void 520-2 vertically with respect to dielectric barrier 510-2 and/or gate 515-2. Such variations may include dielectric barrier 510-1 of CT structure 501-1 arranged with charge trap region 505-1 and dielectric blocking region 509-1 such that charge trap region 505-1 is recessed vertically with respect to dielectric blocking region 509-1 in void 520-2. In addition, dielectric blocking region 509-1 may be recessed in void 520-2 vertically with respect to dielectric barrier 510-1 and/or gate 515-1.

Void 520-1 is between CT structure 501-1 and a surface on which stack 506 is disposed. Void 520-1 can include one or more of dielectric barrier 510-1, dielectric blocking region 509-1, charge trap region 505-1, or tunnel region 507-1 of CT structure 501-1 and the surface on which stack 506 is disposed as boundaries of void 520-1. Material of channel 520-1 of CT structure 501-1 extends to surface on which stack 506 is disposed and provides a vertical boundary for void 520-1. In various embodiments, dielectric barrier 510-1 of CT structure 501-1 may terminate near edges of its respective gate 515-1 such that CT structure 501-1 does not include a fin structure of dielectric barrier 510-1 shown in FIG. 5. (See discussion of fin structures with respect to CT structure 201 of FIGS. 2A and 2B.) Tunnel region 507-1 of CT structure 501-1 can be separated from the surface on which stack 506 is disposed by void 520-1. Charge trap region 505-1 and dielectric blocking region 509-1 of CT structure 501-1 can be separated from the surface on which stack 506 is disposed by void 520-1. In variations of the structure of memory device 500 illustrated in FIG. 5, dielectric harrier 510-1 of CT structure 501-1 may be arranged with charge trap region 505-1 and dielectric blocking region 509-1 such that charge trap region 505-1 is recessed vertically with respect to dielectric blocking region 509-1 in void 520-1. In addition, dielectric blocking region 509-1 may be recessed in void 520-1 vertically with respect to dielectric barrier 510-1 and/or gate 515-1.

Each of voids 520-1, 520-2, and 520-3 can be sealed by a dielectric region 522-1, 522-2, and 522-3, respectively. Dielectric regions 522-1, 522-2, and 522-3 can be part of the boundaries of voids 520-1, 520-2, and 520-3, respectively. Dielectric region 522-1 can be located on the surface on which stack 506 is disposed, which may be conductive region 513, and can extend to and can be located on a portion of gate 515-1 of CT structure 501-1. Dielectric region 522-2 can be located on a portion of gate 515-2 of CT structure 501-2 and can extend to and be located on a portion of gate 515-1 of CT structure 501-1. Dielectric region 522-3 can be located on a portion of gate 515-3 of CT 501-3 and can extends to and be located on a portion of gate 515-2 of CT structure 501-2. In various embodiments, one or more of dielectric regions 522-1, 522-2, or 522-3 may terminate along and between the gates of adjacent CT structures, where, in such cases, effectively two voids may be arranged. Each of voids 520-1, 520-2, and 520-3 are one of the voids associated with such a termination and the other effective void associated with each with dielectric region 522-3, 522-2, and 522-1 is a void between gates of adjacent CT structures 501-3, 501-2, 501-1, and the surface on which stack 506 is disposed, respectively. Such sealing dielectric regions 522-1, 522-2, and 522-3 can be realized similar to sealing dielectric regions discussed with respect to FIGS. 2A and 2B.

Pillar 503 of string 511 of memory device 500 can be structured as a doped semiconductor hollow channel. Pillar 503 can include poly silicon as a hollow channel surrounding a dielectric 504. The regions of structure 500 shown in FIG. 5 can be arranged as rings of material around center region 504. Pillar 503 can operatively conduct a current between conductive region 513 and a conductive data line coupled to pillar 503. Such conductive data line may be coupled to pillar 503 by an access transistor. In various 3D memory architectures, such arrangement of conductive region 513 and a conductive data line coupled to pillar 503 can be provided with conductive region 513 being a source region and conductive data line being a data line. The current can be affected by the charge stored in CT structures 501-1, 501-2, and 501-3 along string 511, where control of storing the charge is by the gates 515-1, 515-2, and 515-3 of CT structures 501-1, 501-2, and 501-3. Gates 515-1, 515-2, and 515-3 can be incorporated in access lines of a memory array of memory device 500. The access lines may be word lines.

The semiconductor material of pillar 503 arranged as a channel 503-1, 503-2, and 503-3 for CT structures 501-1, 501-2, and 501-3, respectively, extends between and through CT structures 501-1, 501-2, and 501-3. Pillar 503 can include regions of alternating doping levels. For example, channels 503-1, 503-2, and 503-3 adjacent to and contacting tunnel regions 507-1, 507-2, and 507-3 can be doped different from regions of pillar 503 adjacent to and forming a boundary of voids 520-1, 520-2, and 520-3, respectively. Pillar 503 can include higher carrier doping levels in regions 523-1, 523-2, and 523-3 of pillar 503 bounded by voids 520-1, 520-2, and 520-3, respectively, than in regions of channels 503-1, 503-2, and 503-3 bounded by and contacting tunnel regions 507-1, 507-2, and 507-3, respectively. The higher doping levels in regions 523-1, 523-2, and 523-3 can be non-uniform along a vertical length of pillar 503 with respect to the carrier concentration in channels 503-1, 503-2, and 503-3 bounded by tunnel regions 507-1, 507-2, and 507-3, respectively. The higher doping levels in regions 5234, 523-2, and 523-3 can be distributed as a gradient along a vertical length of pillar 503 with respect to the carrier concentration in channels 503-1, 503-2, and 503-3 bounded by tunnel regions 507-1, 507-2, and 507-3, respectively. Such a gradient, may be realized with an excess of majority carrier concentration, relative to doping along pillar 503 bounded by tunnel regions 507-1, 507-2, and 507-3, approaching zero at the beginning of the boundary of pillar 503 with tunnel regions 507-1, 507-2, and 507-3. The higher doping levels in regions 523-1, 523-2, and 523-3 can be distributed as a gradient across pillar 503 in the x-direction, perpendicular to the length of pillar 503 along the CT structures 503-1, 503-2, and 503-3. This dopant gradient can enhance control of gate channels 515-1, 515-2, and 515-3 on channels 503-1, 503-2, and 503-3, respectively. The higher carrier doping levels can be n-type doping. Alternatively, with semiconductor doping in the various sections of CT structures 501-1, 501-2, and 501-3 being p-type, the higher carrier doping levels can be p-type doping.

Voids 520-1, 520-2, and 530-3 provide a mechanism to address coupling between charge trap regions and access line-to-access line RC (product of resistance and capacitance) issues associated with conventional memory arrays. Voids 520-1, 520-2, and 530-3 and the separation of charge trap regions 505-1, 505-2, and 505-3, as discussed with respect to FIG. 5, provide isolation to limit such coupling and RC issues. The void arrangements between CT structures 501-1, 501-2, and 501-3 allow for tier pitch scaling of a 3D memory structure, such as 3D NAND, to around 30 nm from current values of 65 to 60 nm. Structural designs, and associated processing, similar to memory device 500 enable less tier deposition of tool capacity for vertical scaling of a 3D NAND using replacement gate processing. The separation of charge trap regions between adjacent CT structures of a memory similar to memory device 500 avoids or minimizes trapped charge hopping that occurs between adjacent CT structures for small gate-to-gate spacing with continuous charge trap regions between adjacent CT structures. The voids may allow for avoiding or minimizing coupling between charge trap regions. Reduction of coupling between charge trap regions may also be provided by a dopant gradient between adjacent CT structures that is higher than doping levels in the channels adjacent tunnel regions of the adjacent CT structures. Such doping gradients may enhance the control of individual gates, such as gates 515-1, 515-2, and 515-3 on the channels, such as respective channels 503-1, 503-2, and 503-3 of their respective CT structure, such as CT structures 501-1, 501-2, and 501-3. The reduced coupling and charge hopping enables the design of memory device 500 and similar memories to have thinner stacks of memory cells. Formation of these voids can provide for access line (gate) capacitance to be held in check, that is, controlled and, in conduction with limiting the dielectric barriers to vertical deployments with respect to their associated gates, can also allow for reduction in access line (gate) resistance.

Figure 6:
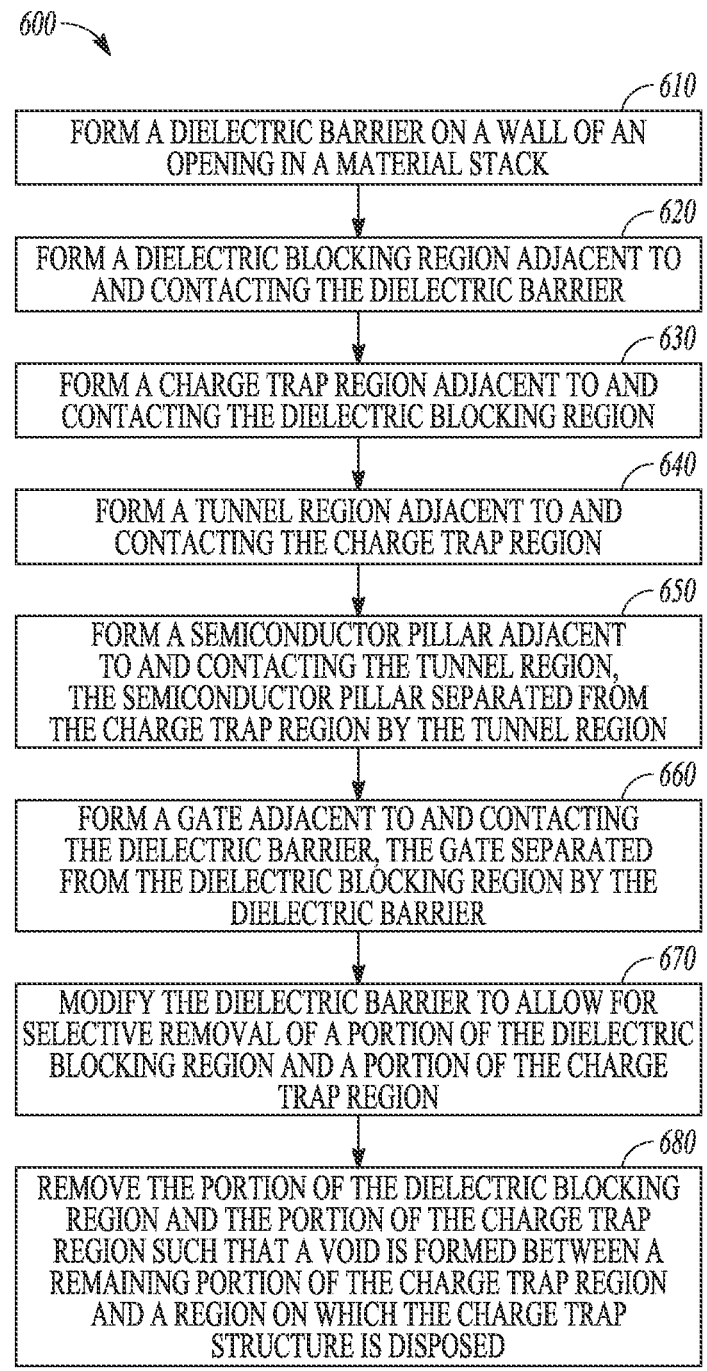
FIG. 6 is a flow diagram of features of an example method of forming a charge trap structure, according to various embodiments.

FIG. 6 is a flow diagram of features of an embodiment of an example method 600 of forming a charge trap structure. At 610, a dielectric barrier is formed on a wall of an opening in a material stack. Forming the dielectric barrier can include forming aluminum oxide or a dielectric having a dielectric constant greater than that of aluminum oxide. Forming the dielectric barrier can include forming the dielectric barrier with material that can withstand temperatures and etching chemistries in processing the charge trap structure. Forming the dielectric barrier can include forming one or more of hafnium oxide, zirconium oxide, or mixtures of hafnium oxide and/or zirconium oxide with one or more of aluminum oxide, silicon oxide, titanium oxide, gadolinium oxide, niobium oxide, or tantalum oxide. Other high-k dielectric materials may be used for the material for the dielectric barriers.

At 620, a dielectric blocking region is formed adjacent to and contacting the dielectric barrier. The material of the dielectric blocking region is different from the material of the dielectric barrier. At 630, a charge trap region is formed adjacent to and contacting the dielectric blocking region. Forming the charge trap region can include forming a dielectric nitride as the charge trap region. Other charge trapping material may be used. At 640, a tunnel region is formed adjacent to and contacting the charge trap region. The tunnel region may be formed as a set of regions that can provide for transfer of charge carriers to the charge trap region. At 650, a semiconductor pillar is formed adjacent to and contacting the tunnel region, the semiconductor pillar separated from the charge trap region by the tunnel region. The semiconductor pillar is operable to conduct a current. Forming the semiconductor pillar can include forming poly silicon.

At 660, a gate is formed adjacent to and contacting the dielectric barrier, the gate separated from the dielectric blocking region by the dielectric barrier. The gate is operable to control storage of charge in the charge trap region. Forming the gate can include forming tungsten as the gate. Forming the gate can include totaling titanium nitride region between the dielectric barrier and the tungsten.

At 670, the dielectric barrier is modified to allow for selective removal of a portion of the dielectric blocking region and a portion of the charge trap region. At 680, the portion of the dielectric blocking region and the portion of the charge trap region are removed such that a void is formed between a remaining portion of the charge trap region and a region on which the charge trap structure is disposed.

Variations of method 600 or methods similar to method 600 can include a number of different embodiments that may or may not be combined depending on the application of such methods and/or the architecture of systems in which such methods are implemented. Such methods can include forming the charge trap region recessed vertically with respect to the dielectric blocking region in the void. For example, the charge trap region and the dielectric blocking region can be formed such that a distance between the charge trap region and the region on which the charge trap structure is disposed is greater than a distance between the dielectric blocking region and the region on which the charge trap structure is disposed. Forming the dielectric barrier can include forming the dielectric barrier having a thickness in the range from about 15 angstroms to about 50 angstroms between the dielectric blocking region and the gate in the completed charge trap structure. In various embodiments, modifying the dielectric barrier can comprise: atomic layer etching (ALE or sometimes referred to as ALEt) the dielectric barrier selective to the gate and the dielectric blocking region; depositing additional dielectric barrier material to form a modified dielectric barrier; and atomic layer etching the modified dielectric barrier to form a mask on the dielectric blocking region. Method 600 or methods similar to method 600 can include forming a sealing dielectric in forming the void.

ALE is similar to atomic layer deposition (ALD) except that ALD is a deposition process and ALE is a removal process. ALD is a monolayer-by-monolayer sequencing deposition process that allows material to be formed in a metered manner. ALE is a material removal technique based on sequential, self-limiting surface reactions. ALE provides the capability to remove films with atomic layer control, allowing nano-fabrication of a wide range of electronic devices. ALE removal of $Al_2O_3$ has been reported using sequential, self limiting thermal reactions with tin(II) acetylacetonate ($Sn(acac)_2$) and HF as reactants in the cycles. Use of $Sn(acac)_2$ and HF to etch $Al_2O_3$ providing linear removal of $Al_2O_3$ at temperatures from 150-250° C. at etch rates of angstroms per cycle, dependent on the processing temperature, was reported. ALE of $HfO_2$ has also been reported using $Sn(acac)_2$ and HF as the reactants in sequential, self-limiting thermal reactions, where linear removal of the $HfO_2$ by the ALE process was achieved. Other materials, which may be etched by ALE, include other metal oxides, metal nitrides, metal phosphides, metal sulfides, and metal arsenides.

In various embodiments, methods including forming CT structure with associated voids can be performed using variations of methods similar to method 600. Note that these features may be performed in a number of different sequencing steps and are not limited to the order or features as presented in FIG. 6.

In various embodiments, an apparatus can comprise a semiconductor pillar operable to conduct a current; a charge trap region separated from the semiconductor pillar by a tunnel region; a dielectric blocking region adjacent to the charge trap region; a gate adjacent to the dielectric blocking region and operable to control storage of charge in the charge trap region; and a dielectric barrier between and separating the dielectric blocking region and the gate, wherein the semiconductor pillar, the tunnel region, the charge trap region, the dielectric blocking region, the dielectric barrier, and the gate are part of a charge trap structure, and the charge trap region is separated by a void from a region on which the charge trap structure is disposed. The charge trap region can be recessed vertically with respect to the dielectric blocking region in the void. A distance between the charge trap region and the region on which the charge trap structure is disposed can be greater than a distance between the dielectric blocking region and the region on which the charge trap structure is disposed. The dielectric blocking region can be recessed in the void vertically with respect to the dielectric barrier and/or the gate. The distance between the dielectric blocking region and the region on which the charge trap structure is disposed can be greater than a distance between the dielectric barrier and the region on which the charge trap structure is disposed.

The void, the dielectric blocking region, and the charge trap region can be structured such that, a ratio of vertical thickness of the charge trap region to vertical thickness of the dielectric blocking region and size of the void are selected to attain a capacitance associated with the gate within a specified range. The dielectric barrier can include aluminum oxide or a dielectric having a dielectric constant greater than that of aluminum oxide. The dielectric barrier can have a thickness in the range from about 15 angstroms to about 50 angstroms between the dielectric blocking region and the gate.

Figure 7:
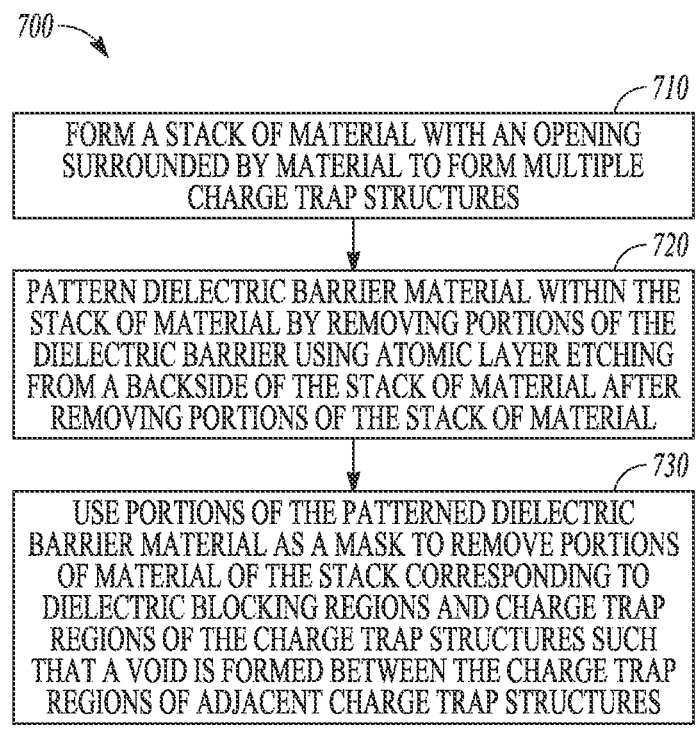
FIG. 7 is a flow diagram of features of an example method of forming multiple charge trap structures in a stack, according to various embodiments.

FIG. 7 is a flow diagram of features of an embodiment of an example method 700 of forming multiple charge trap structures in a stack of material. At 710, a stack of material is formed with an opening surrounded by material to form multiple charge trap structures of a string of memory cells. The multiple charge trap structures to be formed include a first charge trap structure with each charge trap structure of the string, except the first charge trap structure, disposed above another one of the multiple charge trap structures. At 720, dielectric barrier material within the stack of material is patterned by removing portions of the dielectric barrier material using atomic layer etching from a backside of the stack of material after removing portions of the stack of material. Forming the stack of material can include forming the dielectric barrier material with aluminum oxide or a dielectric having a dielectric constant greater than that of aluminum oxide. Forming the dielectric barrier material can include forming one or more of hafnium oxide, zirconium oxide, or mixtures of hafnium oxide and/or zirconium oxide with one or more of aluminum oxide, silicon oxide, titanium oxide, gadolinium oxide, niobium oxide, or tantalum oxide. Other high-κ dielectric materials may be used for the material for the dielectric barriers.

At 730, portions of the patterned dielectric barrier material are used as a mask to remove portions of material of the stack corresponding to dielectric blocking regions and charge trap regions of the charge trap structures such that a void is formed between the charge trap regions of adjacent charge trap structures. The dielectric barrier material separates the dielectric blocking region from a gate in each completed charge trap structure. The dielectric barrier material is different from the material for the dielectric blocking regions.

Variations of method 700 or methods similar to method 700 can include a number of different embodiments that may or may not be combined depending on the application of such methods and/or the architecture of systems in which such methods are implemented. Such methods can include forming the charge trap region for each completed charge trap structure recessed vertically with respect to the dielectric blocking region in the void. Forming each charge trap structure of the multiple charge trap structures can include forming each charge trap structure in a tier of a memory device such that tier pitch is about 30 nanometers. In an embodiment, portions of the formed stack of material can be used as tunnel regions and channels of the multiple charge trap structures, where the tunnel regions of each charge trap structure are a portion of material in the stack from the first charge trap structure through all charge trap structures and the channels are another portion of material in the stack from the first charge trap structure through all charge trap structures.

Method 700 or methods similar to method 700 can include forming a sealing dielectric, between gates of adjacent charge trap structures in forming the voids. Such methods can include patterning the dielectric barrier material by repeating deposition and etching of additional dielectric barrier material until openings in the dielectric barrier material attain a size to process the material corresponding to dielectric blocking regions. The openings can be used to perform an oxide etch followed by a nitride etch to form the voids. After forming the voids, a dielectric can be formed in open regions to seal the open regions, where the open regions were formed by the removing of portions of the stack of material to pattern the dielectric barrier material. Forming the dielectric in the open regions can include forming the dielectric using plasma-enhanced chemical vapor deposition.

In various embodiments, methods including forming CT structure with associated voids can be performed using variations of methods similar to method 700. Note that these features may be performed in a number of different sequencing steps and are not limited to the order or features as presented in FIG. 7.

In various embodiments, a memory device can comprise: a vertical string of memory cells including a vertical pillar of semiconductor material; and multiple CT structures, including a first CT structure, arranged along the vertical string, the multiple CT structures arranged in a vertical stack with each CT structure, except for the first CT structure, disposed above another one of the multiple CT structures. Each CT structure can include: the semiconductor material operable as a channel for the CT structure; a tunnel region adjacent and contacting the semiconductor material; a charge trap region adjacent and contacting the tunnel region; a dielectric blocking region adjacent and contacting the charge trap region, the charge trap region separated from the charge trap region of an adjacent CT structure in the vertical stack by a void; and a dielectric barrier between and separating the dielectric blocking region and a gate of the CT structure.

The dielectric barrier of each CT structure can be arranged with the charge trap region and the dielectric blocking region of each CT structure such that the charge trap region is recessed vertically with respect to the dielectric blocking region in the void. For example, a distance between the charge trap region and the region on which the charge trap structure is disposed can be greater than a distance between the dielectric blocking region and the region on which the charge trap structure is disposed. The dielectric blocking region can be recessed in the void vertically with respect to the dielectric barrier and/or the gate. For example, the distance between the dielectric blocking region and the region on which the charge trap structure is disposed can be greater than a distance between the dielectric barrier and/or the gate and the region on which the charge trap structure is disposed. The tunnel region of the first CT structure can extend along the pillar of semiconductor material and can extend through the other CT structures as the tunnel region of each CT structure. A sealing dielectric can be disposed between gates of adjacent CT structures to seal the void between adjacent charge trap regions of the string.

The dielectric barrier can include aluminum oxide or a dielectric having a dielectric constant greater than that of aluminum oxide. The charge trap region and the dielectric blocking region can be composed of materials such that, in fabrication, the charge trap region is removable in part by an etchant material while the dielectric blocking region is substantially unaffected by the etchant material. Each CT structure of the multiple CT structures can be arranged in a tier of the memory device such that tier pitch is about 30 nanometers.

Figure 8:
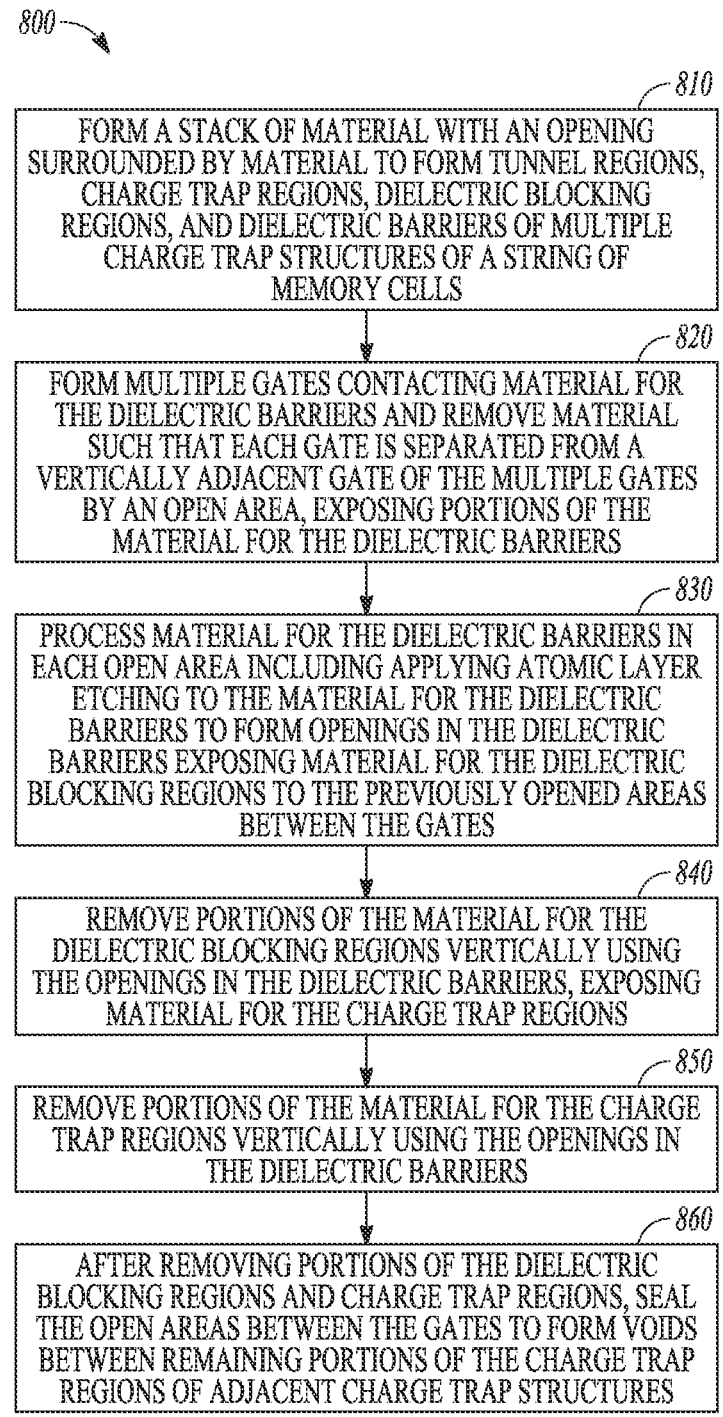
FIG. 8 is a flow diagram of features of an example method of forming multiple charge trap structures in a stack, according to various embodiments.

FIG. 8 is a flow diagram of features of an embodiment of an example method of forming multiple charge trap structures in a stack of material. At 810, a stack of material is formed with an opening surrounded by material to form tunnel regions, charge trap regions, dielectric blocking regions, and dielectric barriers of multiple charge trap structures of a string of memory cells. The multiple charge trap structures being formed include a first charge trap structure with each charge trap structure of the string of memory cells, after the first charge trap structure, disposed above another one of the multiple charge trap structures of the string.

At 820, multiple gates are formed contacting material for the dielectric barriers and removal of material from the stack of material is conducted such that each gate is separated from a vertically adjacent gate of the multiple gates by an open area, exposing portions of the material for the dielectric barriers. Forming multiple gates contacting material for the dielectric barriers and removing material such that each gate is separated from a vertically adjacent gate of the multiple gates can include removing sacrificial regions adjacent the material for the dielectric barriers using a chemistry and process to remove the sacrificial regions substantially without removing material for the dielectric barrier. Gate material can be formed in each region in which a sacrificial region is removed. Material of an isolation dielectric can be removed from between each gate by a chemistry and process to remove the isolation dielectric previously formed between adjacent sacrificial regions.

At 830, material for the dielectric barrier is processed in each open area including applying atomic layer etching to the material for the dielectric barriers to form openings in the dielectric barriers exposing material for the dielectric blocking regions to the previously opened areas between the gates. Processing material for the dielectric barriers in each open area including applying atomic layer etching to the material for the dielectric barriers can include applying a first atomic layer etching to remove portions of the material for the dielectric barrier using a chemistry selective to removing material for the dielectric barrier substantially without removing material of the gate or material for the dielectric blocking region. Additional material of the dielectric barrier can be deposited, after removing portions of the material for the dielectric barriers, on adjacent gates in each open area and on surfaces of material for dielectric blocking regions exposed by the first atomic layer etching. Atomic layer etching can be applied to the additional material for the dielectric barriers providing the openings for the removing of portions of the dielectric blocking regions.

At 840, portions of the material for the dielectric blocking regions are removed vertically using the openings in the dielectric barrier, exposing material for the charge trap region. At 850, portions of the material for the charge trap regions are removed vertically using the openings in the dielectric barriers. At 860, after removing portions of the dielectric blocking regions and charge trap regions, the open areas between the gates are sealed to form voids between remaining portions of the charge trap regions of adjacent charge trap structures. Sealing the void can include forming a dielectric between the gates of the adjacent charge trap structures. Forming the dielectric between the gates of the adjacent charge trap structures can include forming the dielectric from an entrance to the open areas and terminating the forming of the dielectric prior to reaching the material for the dielectric barrier, leaving a void between adjacent gates.

Variations of method 800 or methods similar to method 800 can include a number of different embodiments that may or may not be combined depending on the application of such methods and/or the architecture of systems in which such methods are implemented. Removing the portions of the material for the dielectric blocking regions and removing the portions of the material for the charge trap regions can include removing these portions such that the charge trap region of each completed charge trap structure is recessed vertically with respect to the dielectric blocking region in the void. For example, a distance between the charge trap region of each completed charge trap structure and the region on which the charge trap structure is disposed can be greater than a distance between the dielectric blocking region of each respective completed charge trap structure and the region on which the charge trap structure is disposed. The dielectric barrier material separates the dielectric blocking region from a gate in each completed charge trap structure. Removing portions of the material for the dielectric blocking regions vertically using the openings in the dielectric barrier can include conducting an etch to remove portions of the material for dielectric blocking regions. Removing portions of the material for the charge trap regions vertically using the openings in the dielectric barriers can include conducting another etch to remove portions of the material for the charge trap regions to form the recessed charge trap region without substantially recessing material for the gate. After forming the recessed charge trap regions, annealing the stack can be conducted.

Variations of method 800 or methods similar to method 800, in which the charge trap region of each completed charge trap structure is recessed vertically with respect to the dielectric blocking region in the void, can include balancing a size of openings in the material dielectric barrier used to remove the portions of the dielectric blocking region with a ratio of thickness of a completed charge trap region to thickness of a completed dielectric blocking region to attain a desired gate stack dimension.

Variations of method 800 or methods similar to method 800 can include sealing the void associated with each charge trap structure to a region between adjacent charge trap structures, where each void has boundaries including the charge trap region of each adjacent charge trap structure along with material of the stack of material providing the tunnel regions of the adjacent charge trap structures.

Variations of method 800 or methods similar to method 800 can include removing portions of the tunnel region using the openings of the dielectric barriers, exposing a semiconductor pillar, in addition to removing the portions of the material for the dielectric blocking regions and the portions of the material for the charge trap regions. Such methods can include applying a vapor to the exposed semiconductor pillar to generate doping to the semiconductor pillar increasing carrier doping levels in a region of the semiconductor pillar between directly adjacent charge trap structures. The increased carrier doping levels are relative to the level doping in regions of the semiconductor pillar bounded by the tunnel region of the charge trap structures. Applying a vapor can include applying phosphine to increase the carrier doping levels. Another vapor that can be used in an isotropic vapor anneal is arsine. Other chemical vapors that provide doping can be used. Chemicals such as phosphine and arsine provide n-type doping. For a p-type channel, to increase carrier doping level, a vapor can be applied that provides increased p-type doping. Applying a vapor anneal with a p-type species can include applying diborane gas to provide an increase in p-type doping levels. For an undoped semiconductor pillar, to increase carrier doping level in the regions of the semiconductor pillar bounded by the tunnel region of the charge trap structures, a vapor can be applied that provides p-type doping or n-type doping. The selection of the doping type in the regions of the semiconductor pillar bounded by the tunnel region of the charge trap structures can depend on other features of the integration scheme, for example, the doping scheme of selector devices vertically coupled to the stack of CT structures. Various methods can include activating dopants in the regions of the semiconductor pillar between adjacent charge trap structures without diffusing dopants into the semiconductor pillar bounded by the tunnel region of each charge trap structure.

In various embodiments, the charge trap regions can be nitride regions, the dielectric blocking regions can be oxide regions, and the material for the dielectric barriers can include aluminum oxide or a dielectric having a dielectric constant greater than that of aluminum oxide. A dielectric having a dielectric constant greater than that of aluminum oxide can include one or more of hafnium oxide, zirconium oxide, or mixtures of hafnium oxide and/or zirconium oxide with one or more of aluminum oxide, silicon oxide, titanium oxide, gadolinium oxide, niobium oxide, or tantalum oxide. Other high-v dielectric materials may be used for the material for the dielectric barriers.

In various embodiments, an apparatus can comprise: a semiconductor pillar operable to conduct a current; a charge trap region separated from the semiconductor pillar by a tunnel region; a dielectric blocking region adjacent to the charge trap region; a gate adjacent to the dielectric blocking region and operable to control storage of charge in the charge trap region; and a dielectric barrier between the dielectric blocking region and the gate, wherein the tunnel region and the semiconductor pillar are arranged as boundaries of a void. The dielectric barrier, the dielectric blocking region, and the charge trap region can be arranged as boundaries of the void. The semiconductor pillar can include higher carrier doping levels in a region of the semiconductor pillar bounded by the void than in regions of the semiconductor pillar bounded by the tunnel region. The higher carrier doping levels are n-type doping.

The apparatus can include a die having a charge trap structure, the semiconductor pillar, the tunnel region, the charge trap region, the dielectric blocking region, the dielectric barrier, and the gate disposed as part of the charge trap structure.

The CT structure can be one of a number of substantially identically structured CT structures arranged in a vertical stack such that the tunnel region of a CT structure is separated from the tunnel region of an adjacent CT structure in the vertical stack by a void. The CT structures can be arranged in the vertical stack with the semiconductor pillar being common such that regions of the semiconductor pillar between adjacent charge trap structures have higher carrier doping levels than regions of the semiconductor pillar adjacent and contacting the tunnel regions of the charge trap structures. The dielectric barrier can include dielectric material different from material of the dielectric blocking region such that the dielectric material of the dielectric barrier is capable of withstanding material processing for formation of the gate and removal of portions of the charge trap region and the dielectric blocking region to form the void.

In various embodiments, a memory device can comprise: a vertical string of memory cells including a vertical pillar of semiconductor material; and multiple charge trap structures, including a first charge trap structure, arranged along the vertical string, the multiple charge trap structures arranged in a vertical stack with each charge trap structure, except for the first charge trap structure, disposed above another one of the multiple charge trap structures. Each charge trap structure can include: the semiconductor material operable as a channel for the charge trap structure; a tunnel region adjacent and contacting the semiconductor material; a charge trap region adjacent and contacting the tunnel region; a dielectric blocking region adjacent and contacting the charge trap region; a dielectric barrier between and separating the dielectric blocking region and a gate of the charge trap structure, wherein the tunnel region is separated from the tunnel region of an adjacent charge trap structure in the vertical stack by a void. The vertical pillar of semiconductor material can include higher carrier doping levels in a region between adjacent CT structures bounded by the void than in regions bounded by the tunnel region of each CT structure. The dielectric barrier can include aluminum oxide or one or more of hafnium oxide, zirconium oxide, or mixtures of hafnium oxide and/or zirconium oxide with one or more of aluminum oxide, silicon oxide, titanium oxide, gadolinium oxide, niobium oxide, or tantalum oxide. A sealing dielectric can be disposed between gates of adjacent CT structures providing a seal to the void between adjacent CT structures.

Figure 9A:
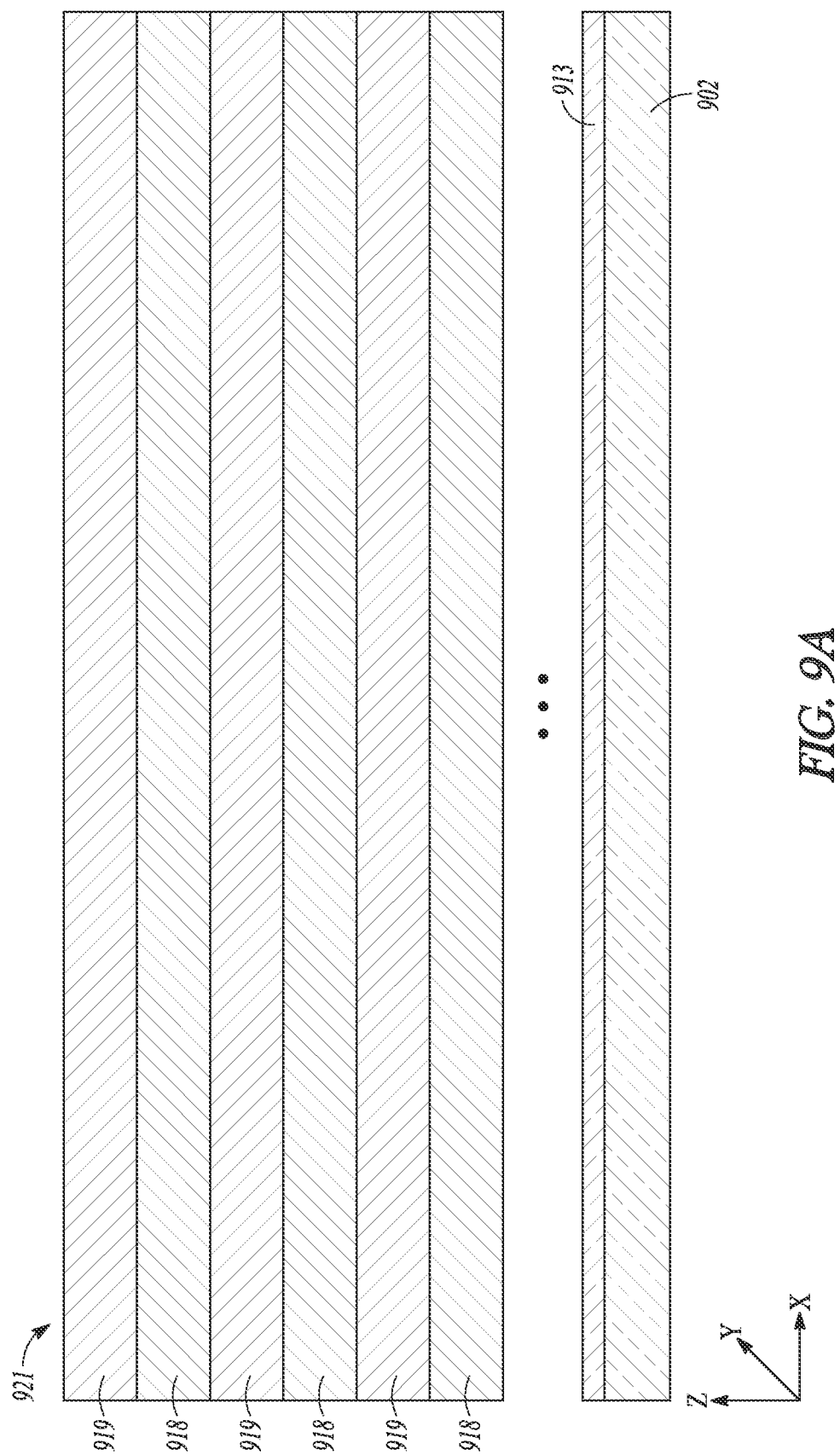
FIGS. 9A-9R are cross-sectional views illustrating stages of an example method of forming charge trap structures, according to various embodiments.
Figure 9B:
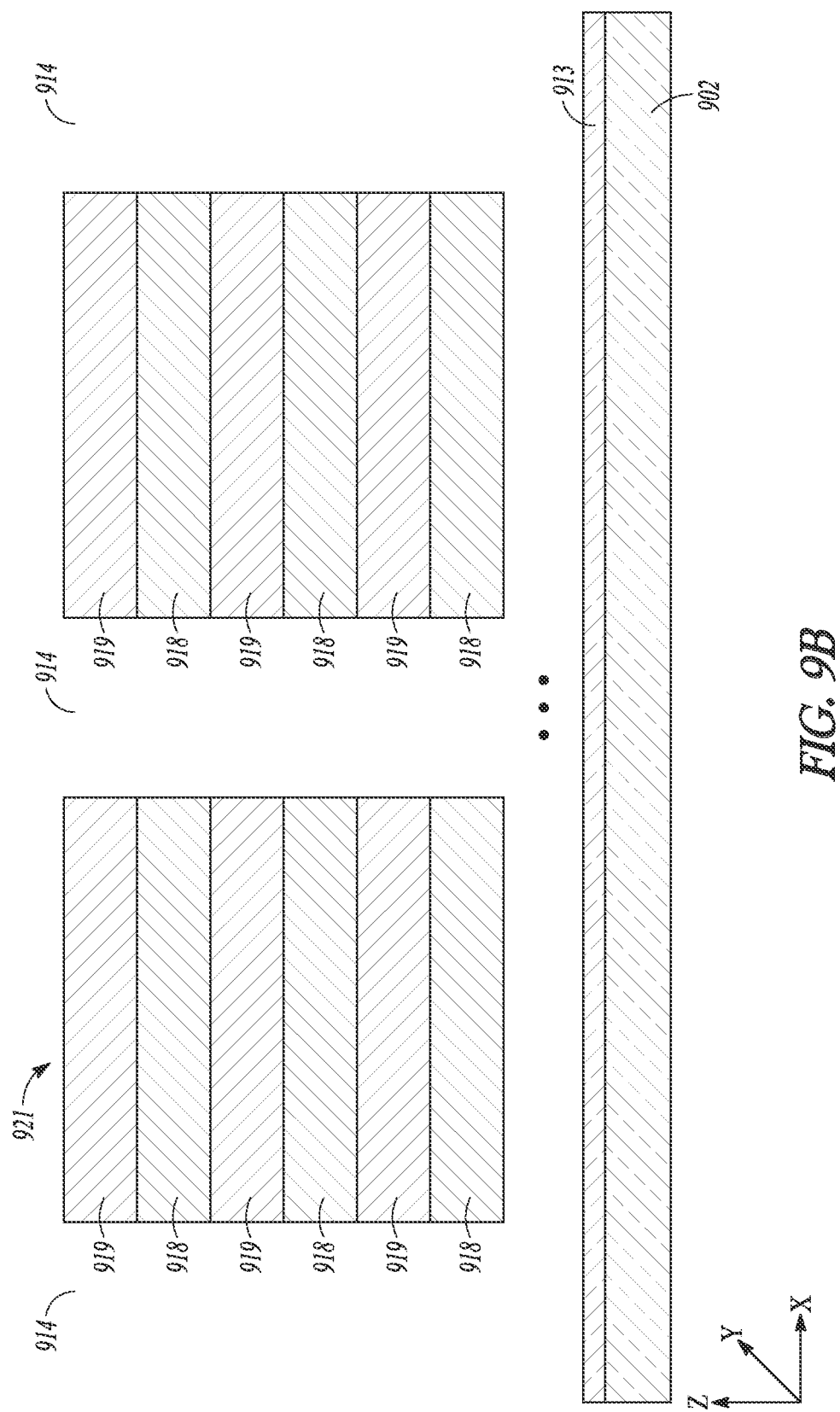
Figure 9C:
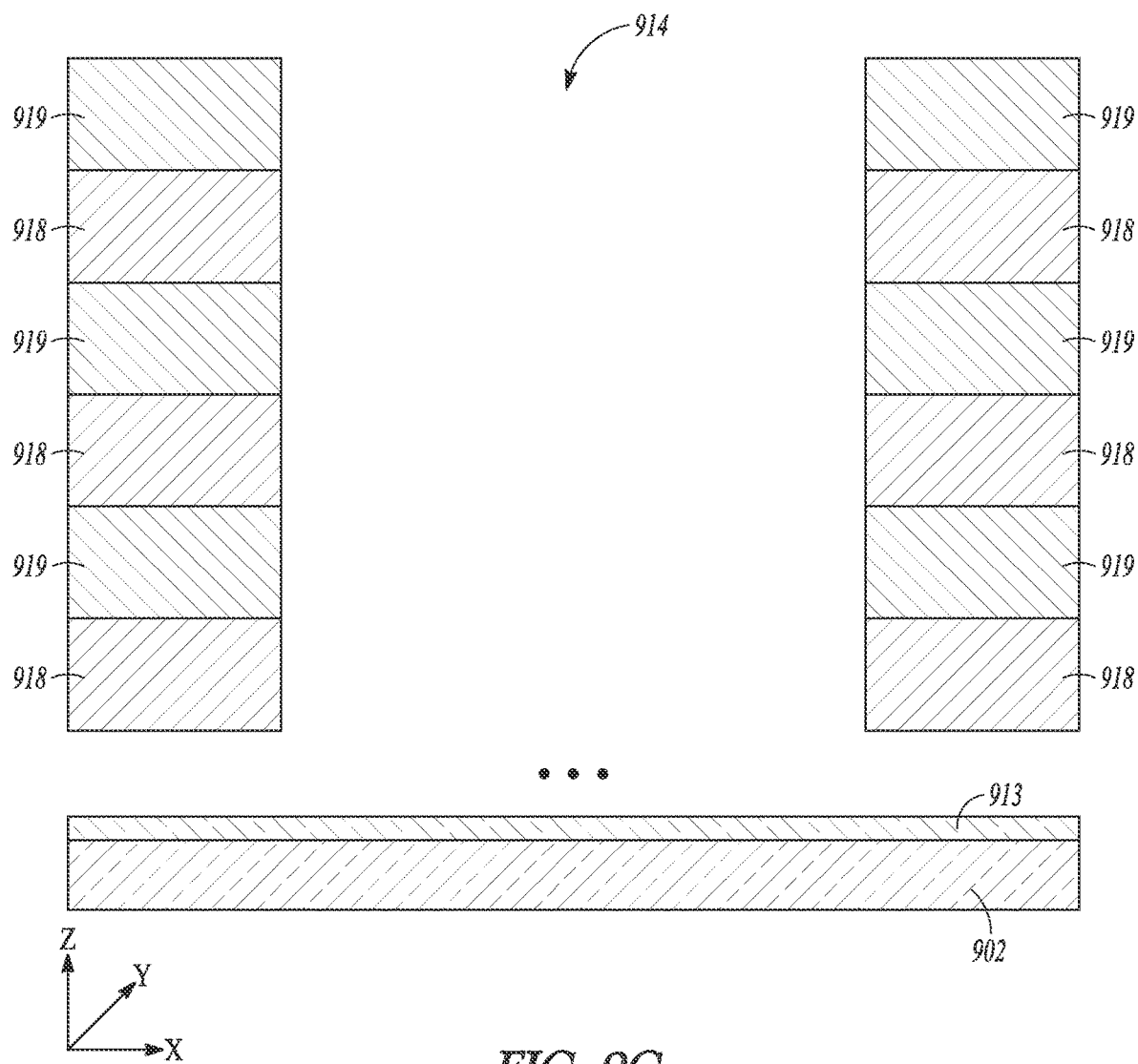
Figure 9D:
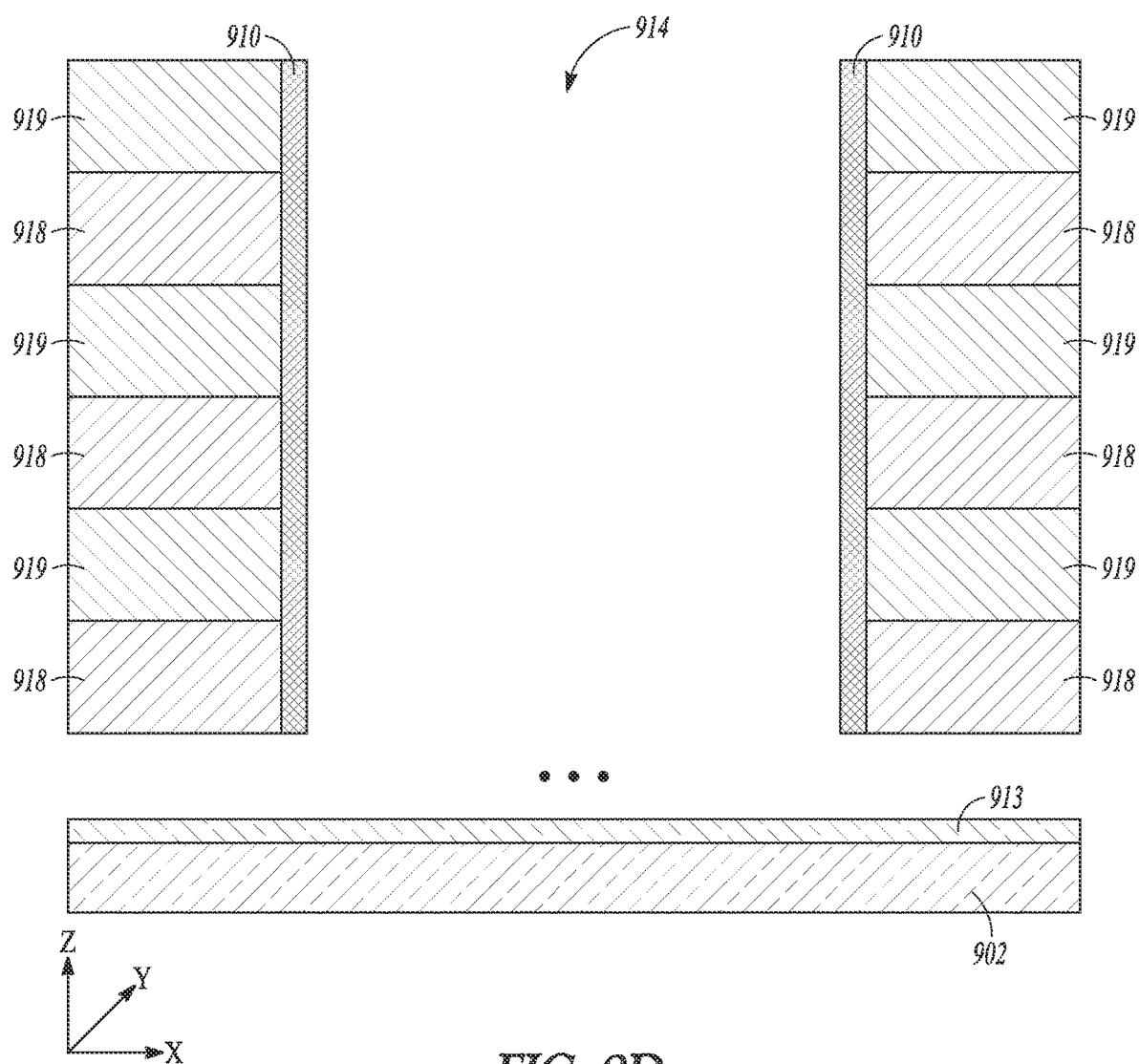
Figure 9E:
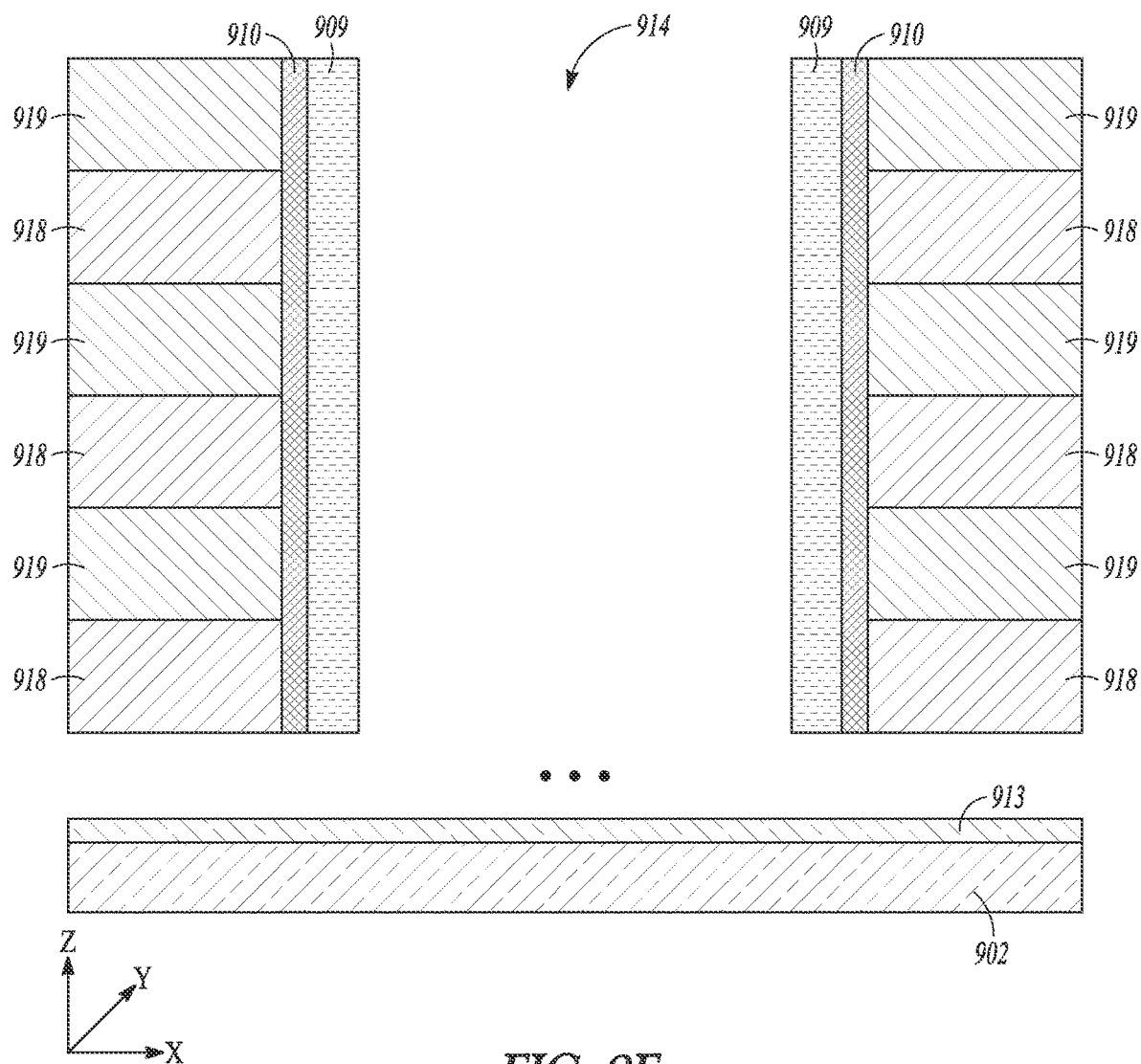
Figure 9F:
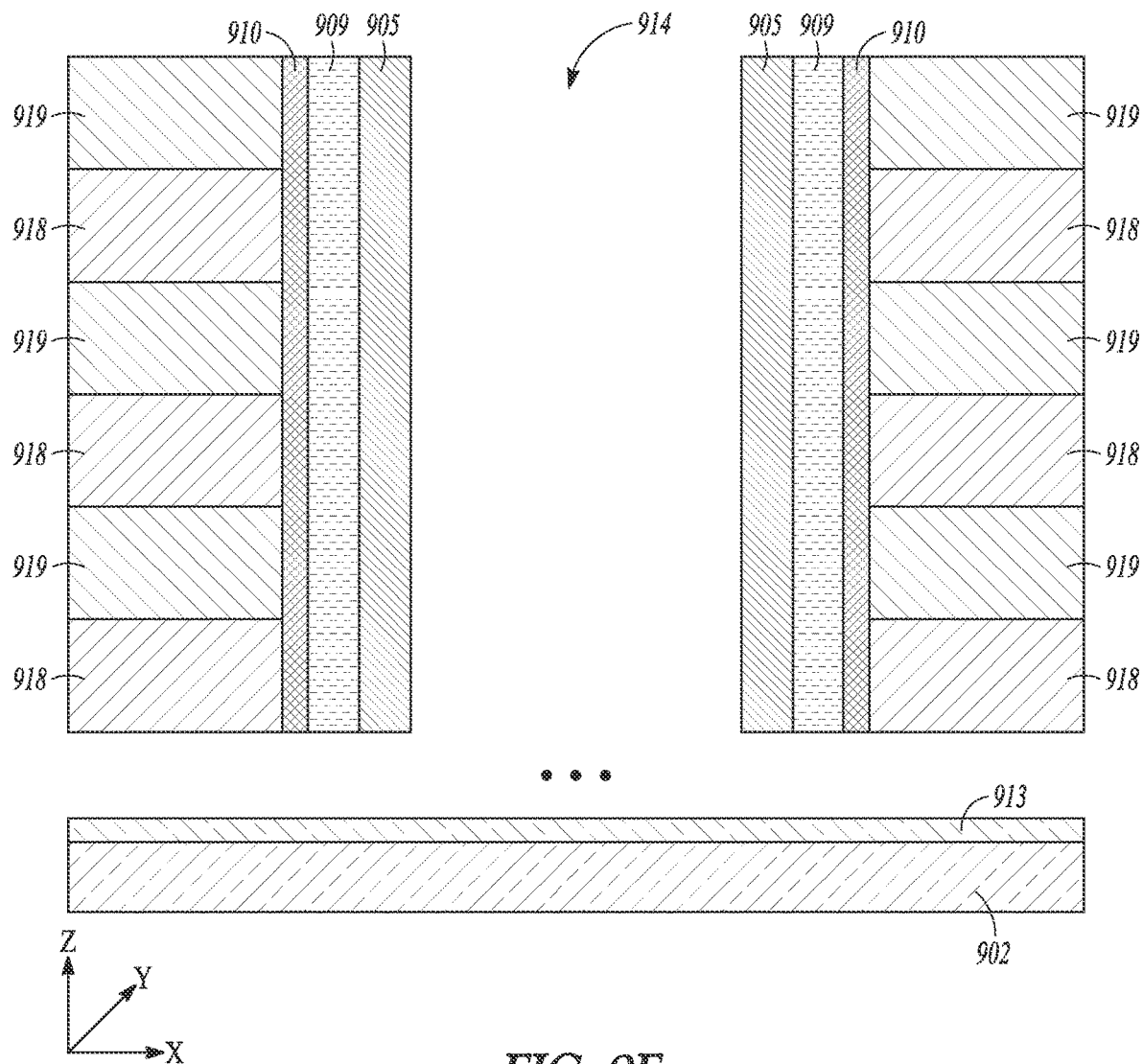
Figure 9G:
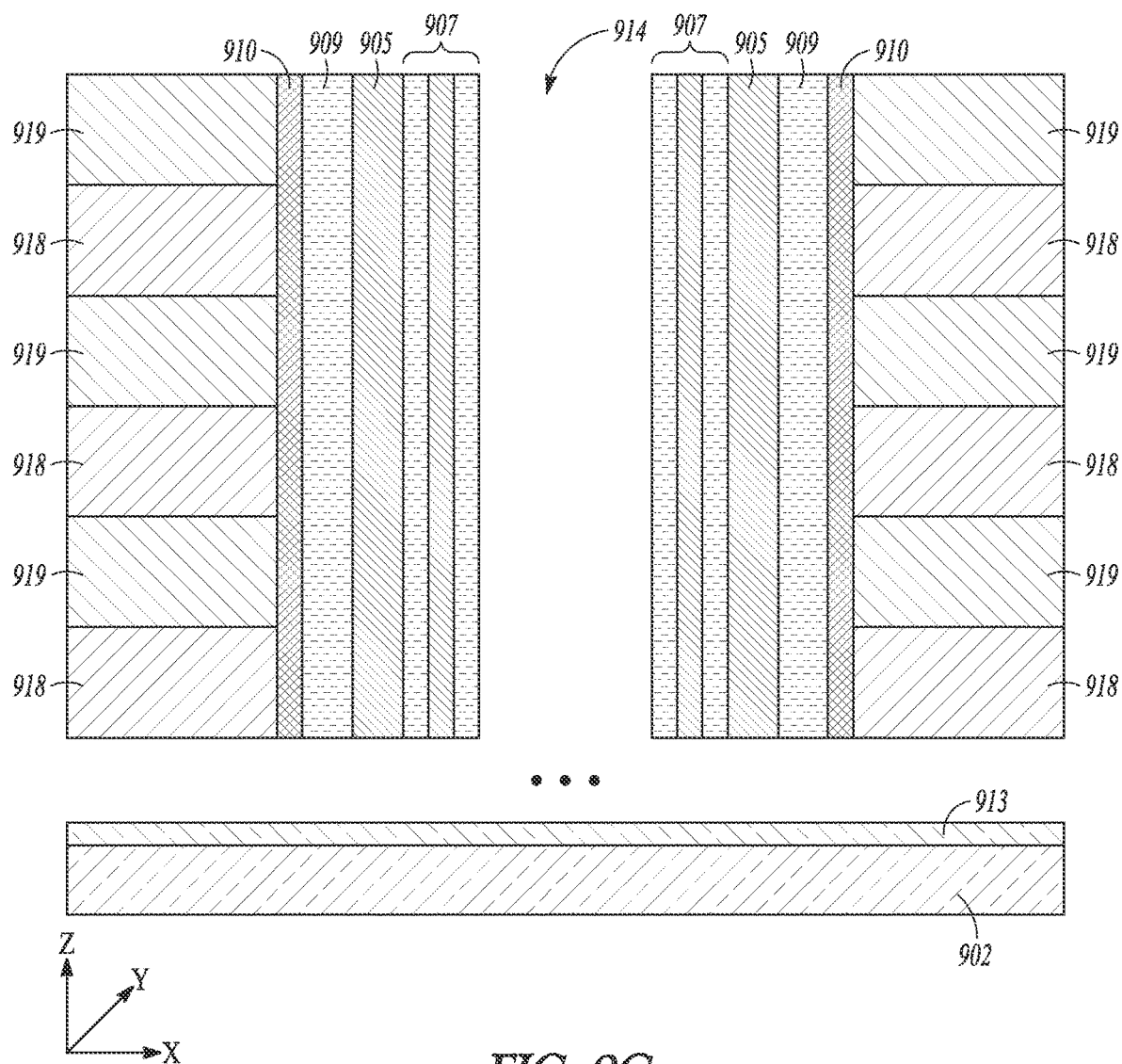
Figure 9H:
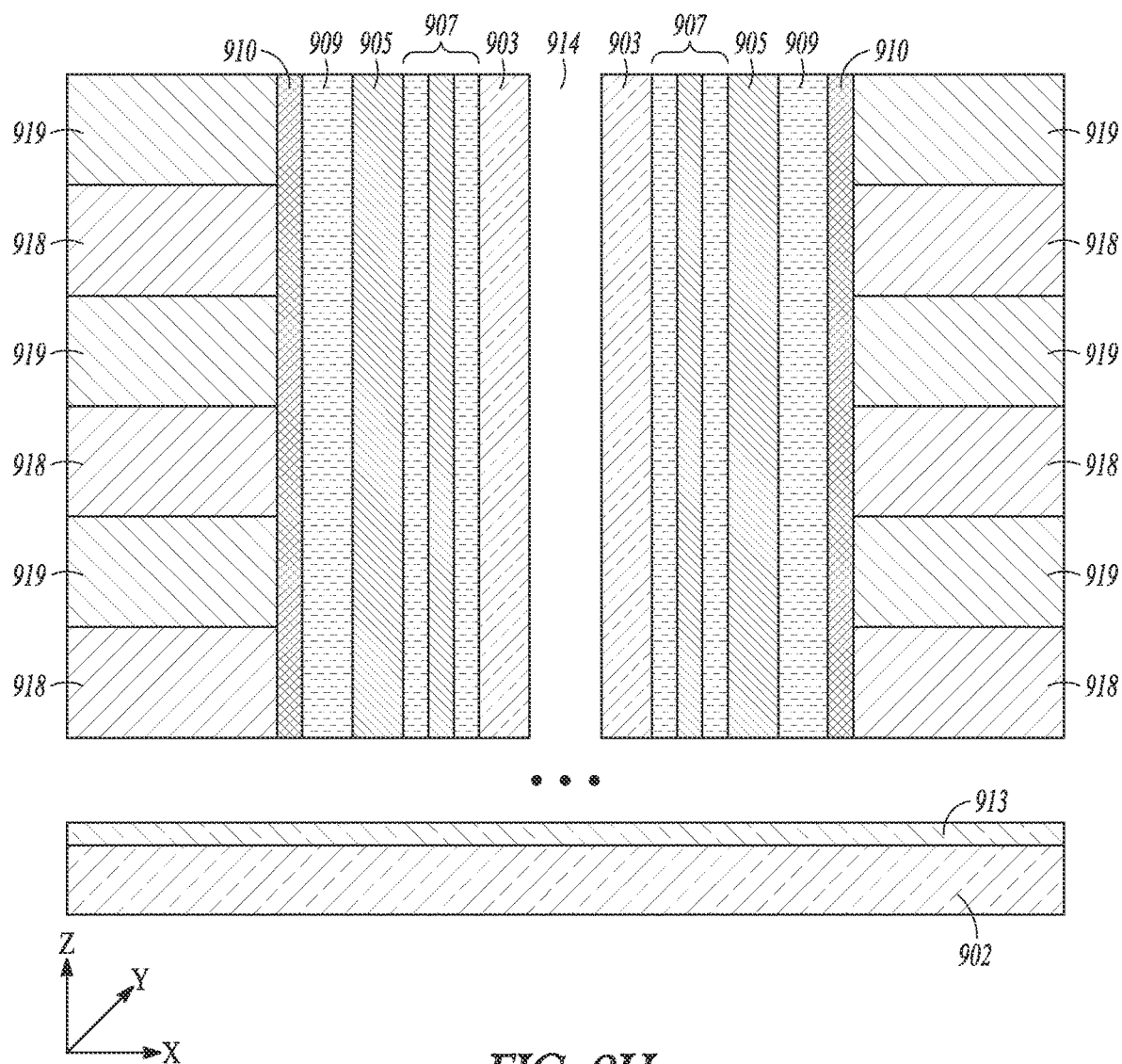
Figure 9I:
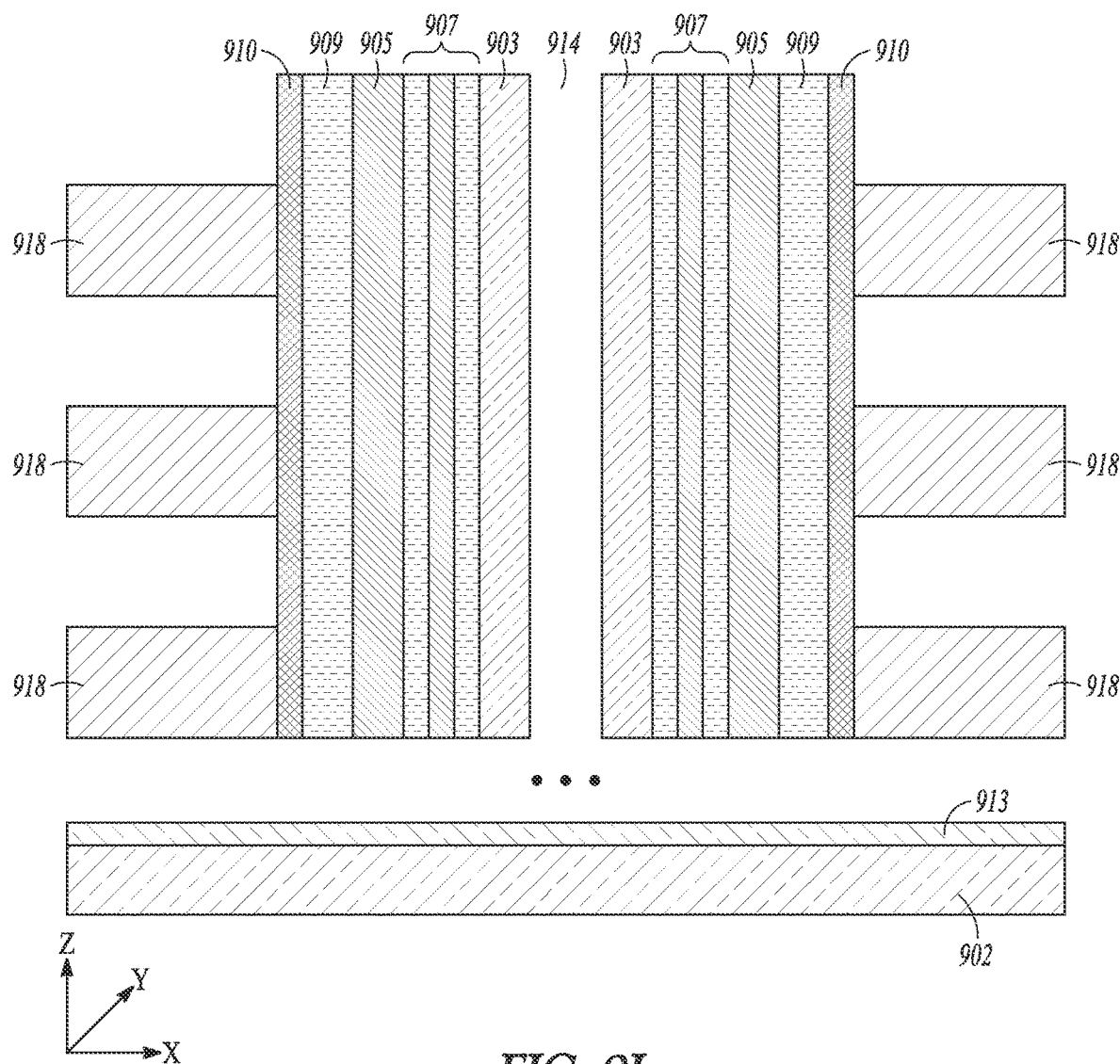
Figure 9J:
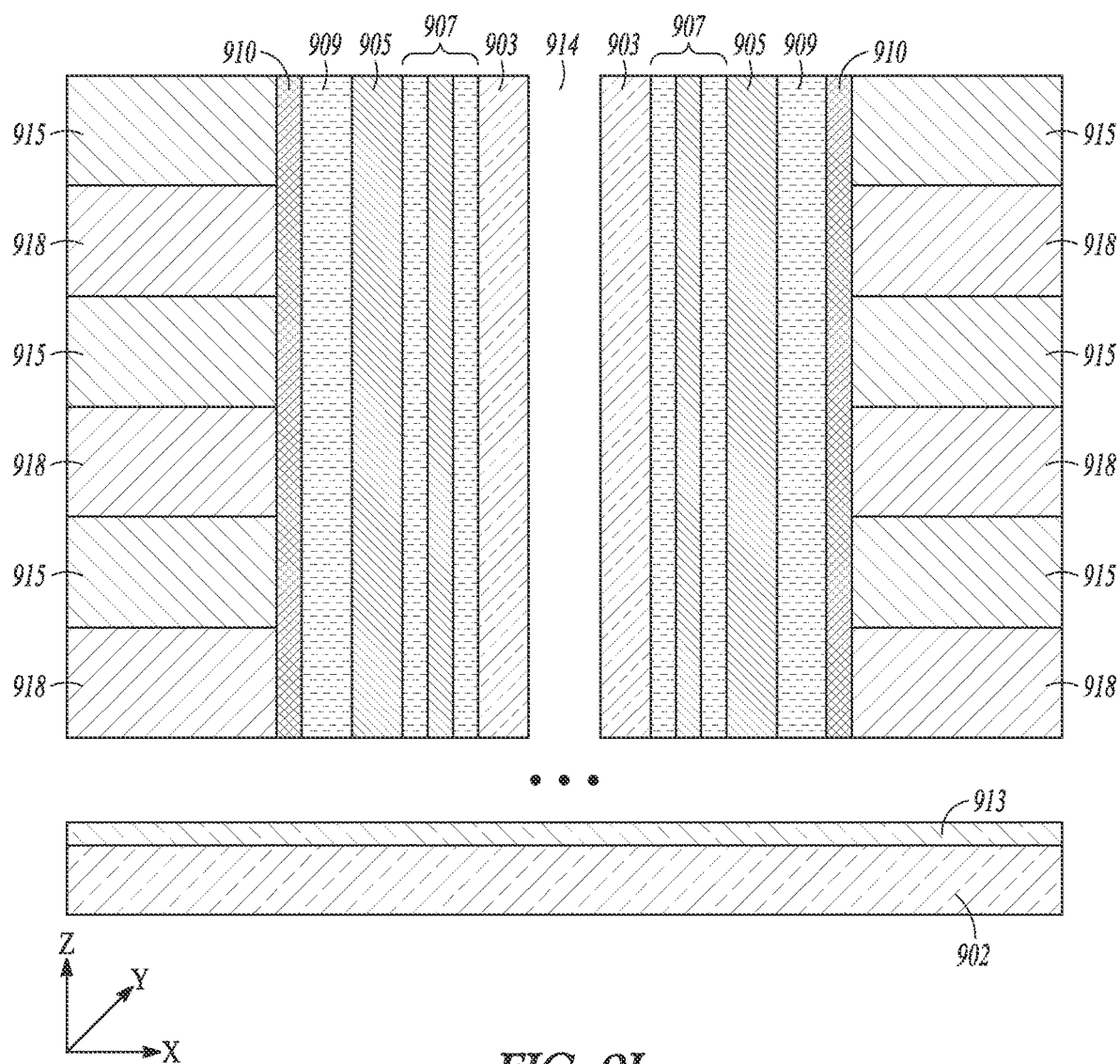
Figure 9K:
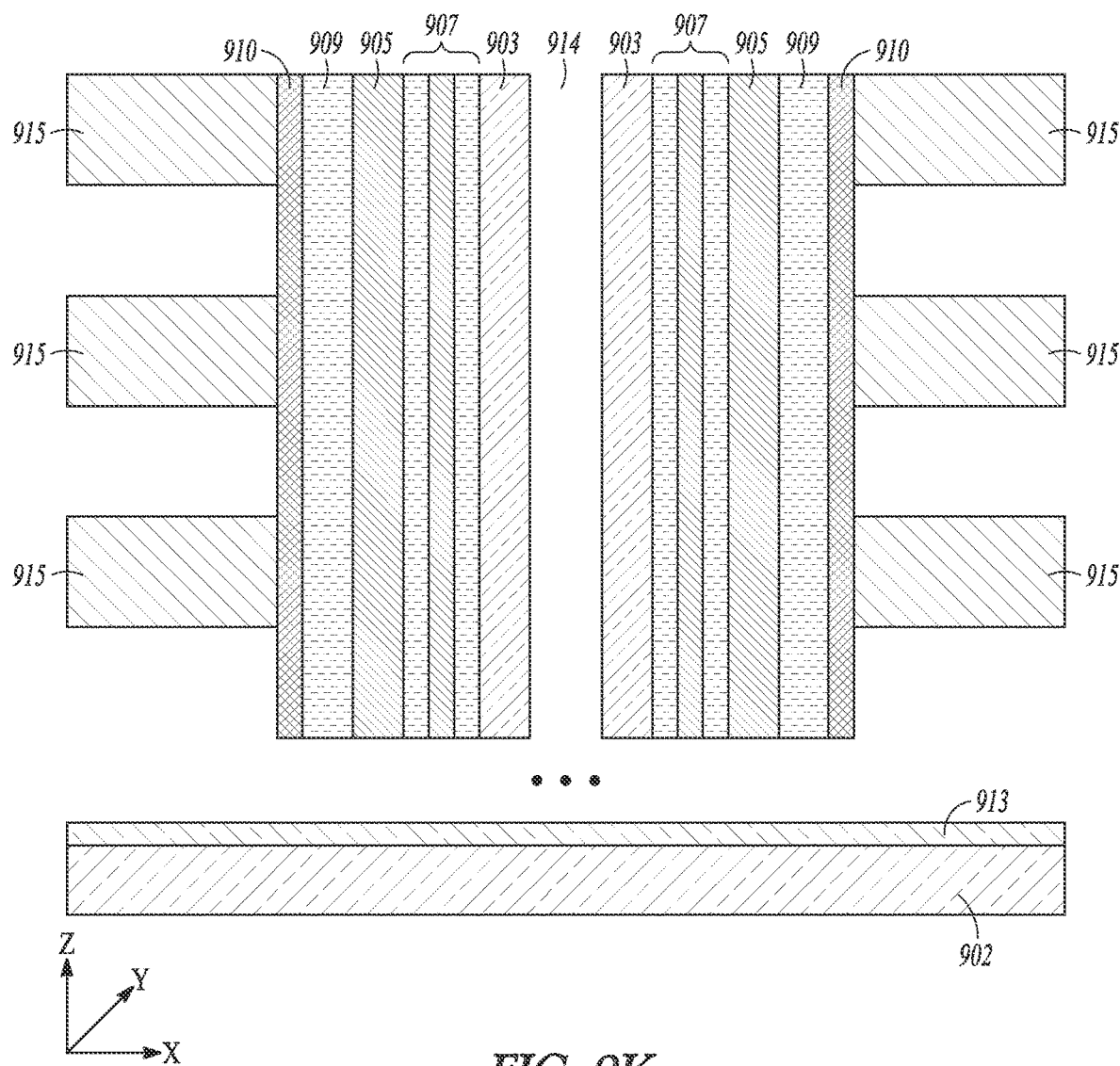
Figure 9L:
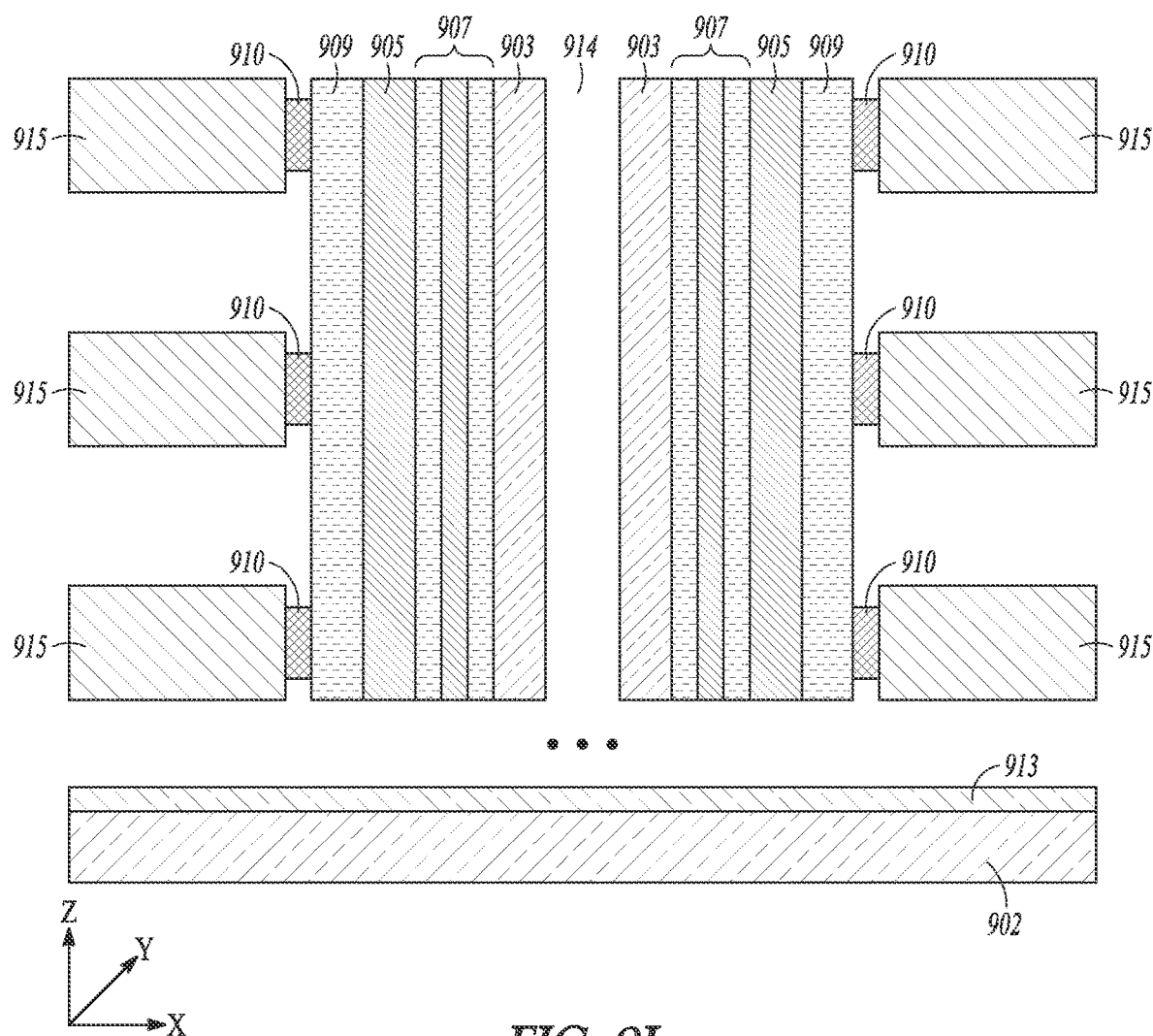
Figure 9M:
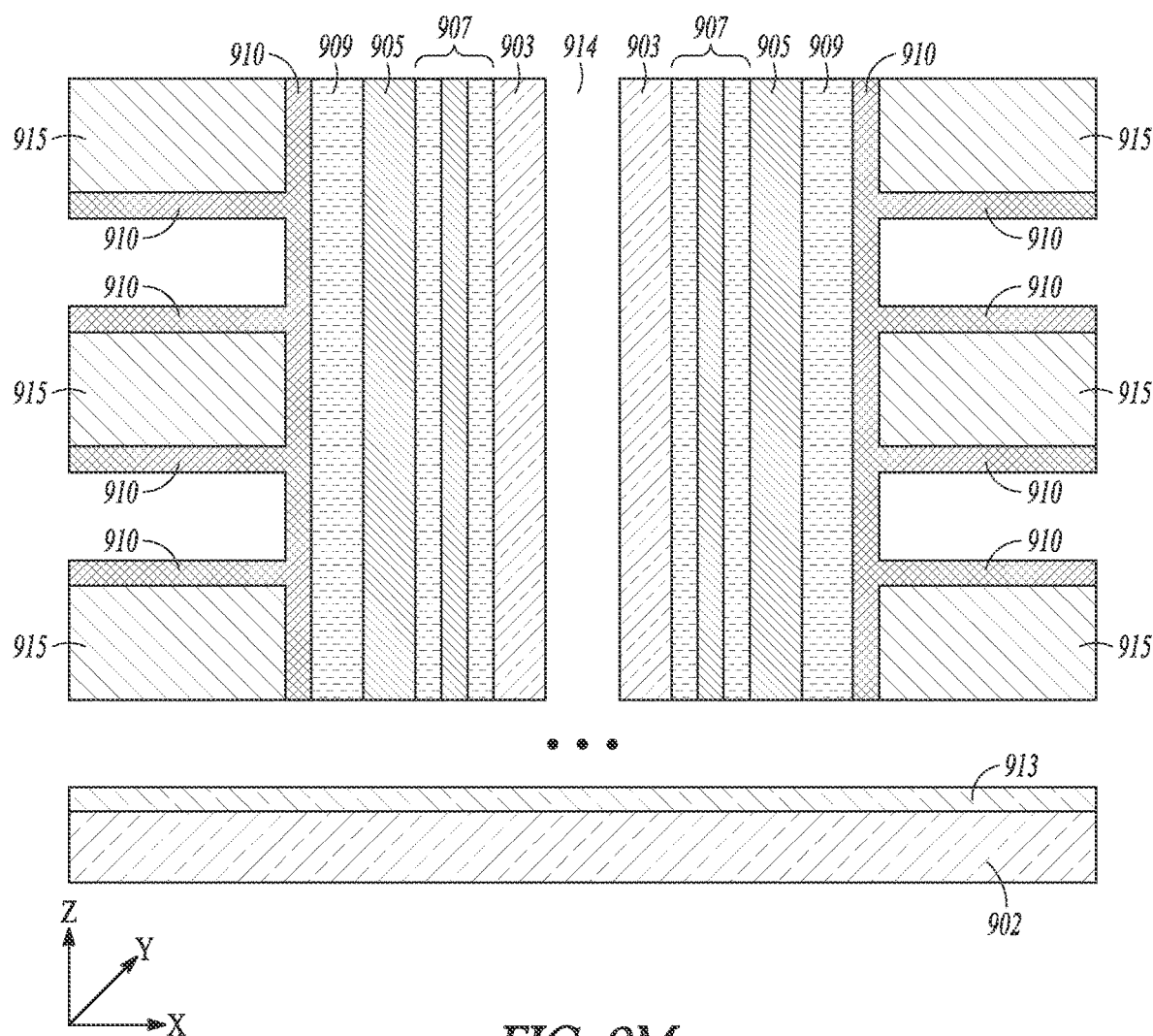
Figure 9N:
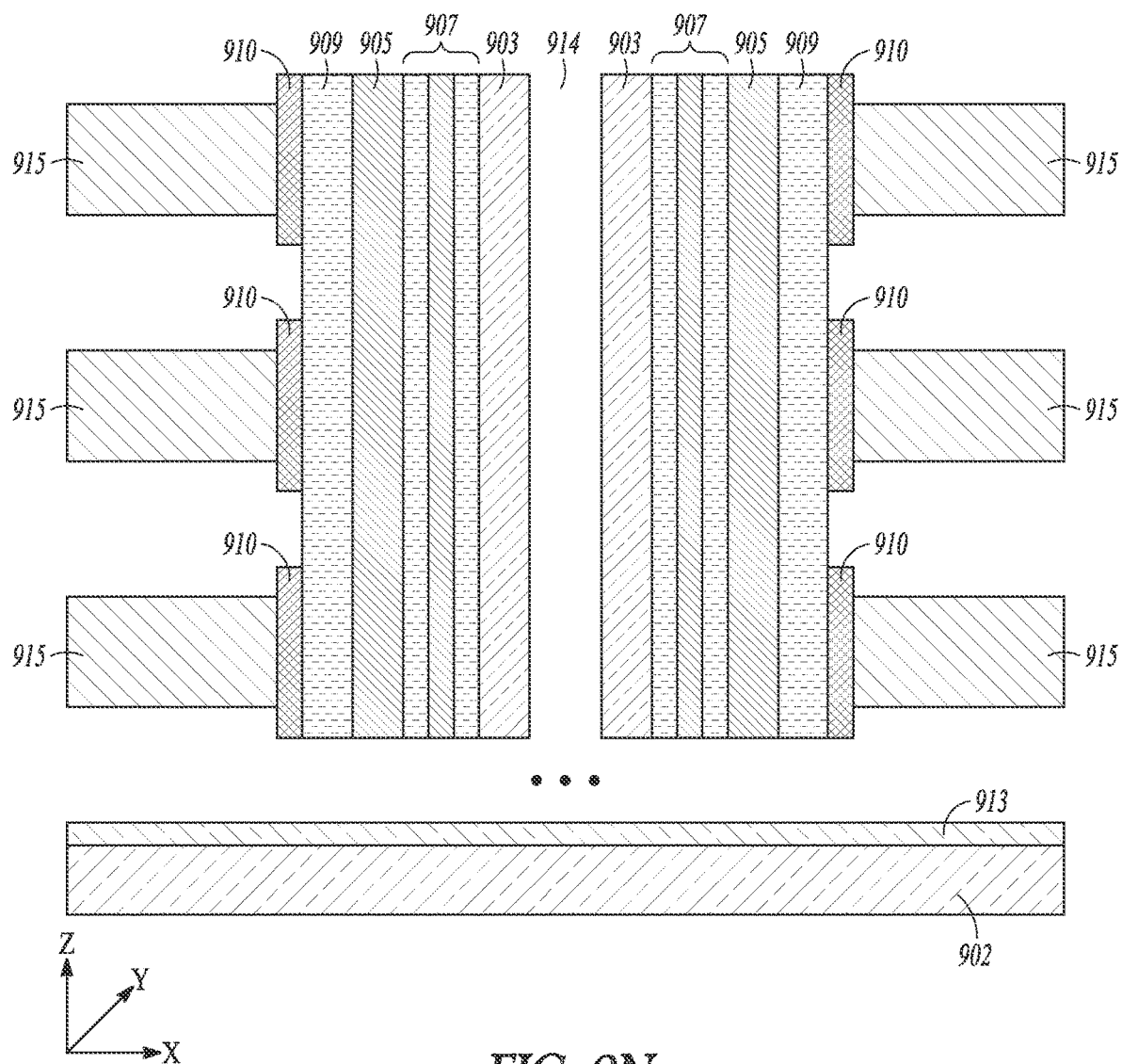
Figure 9O:
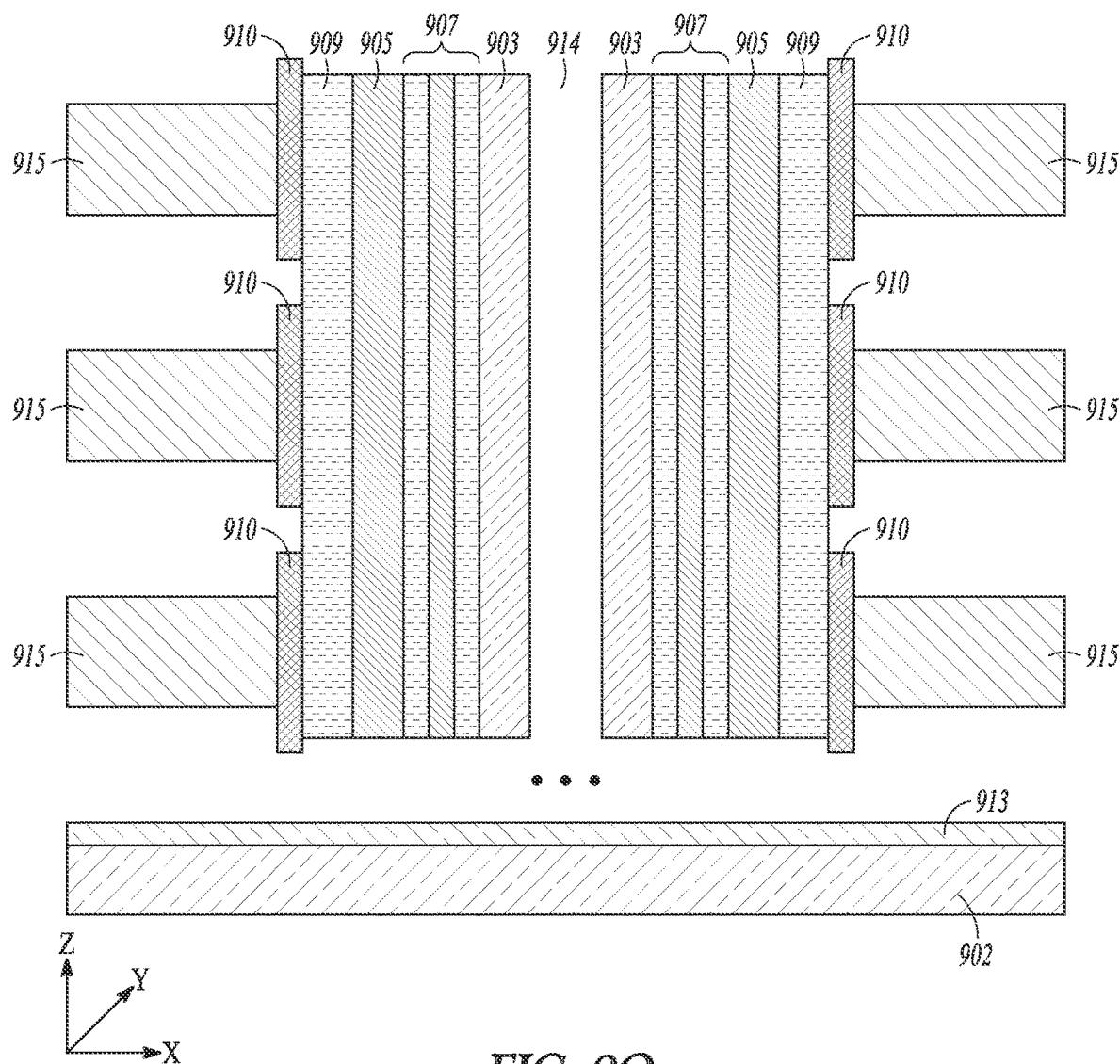
Figure 9P:
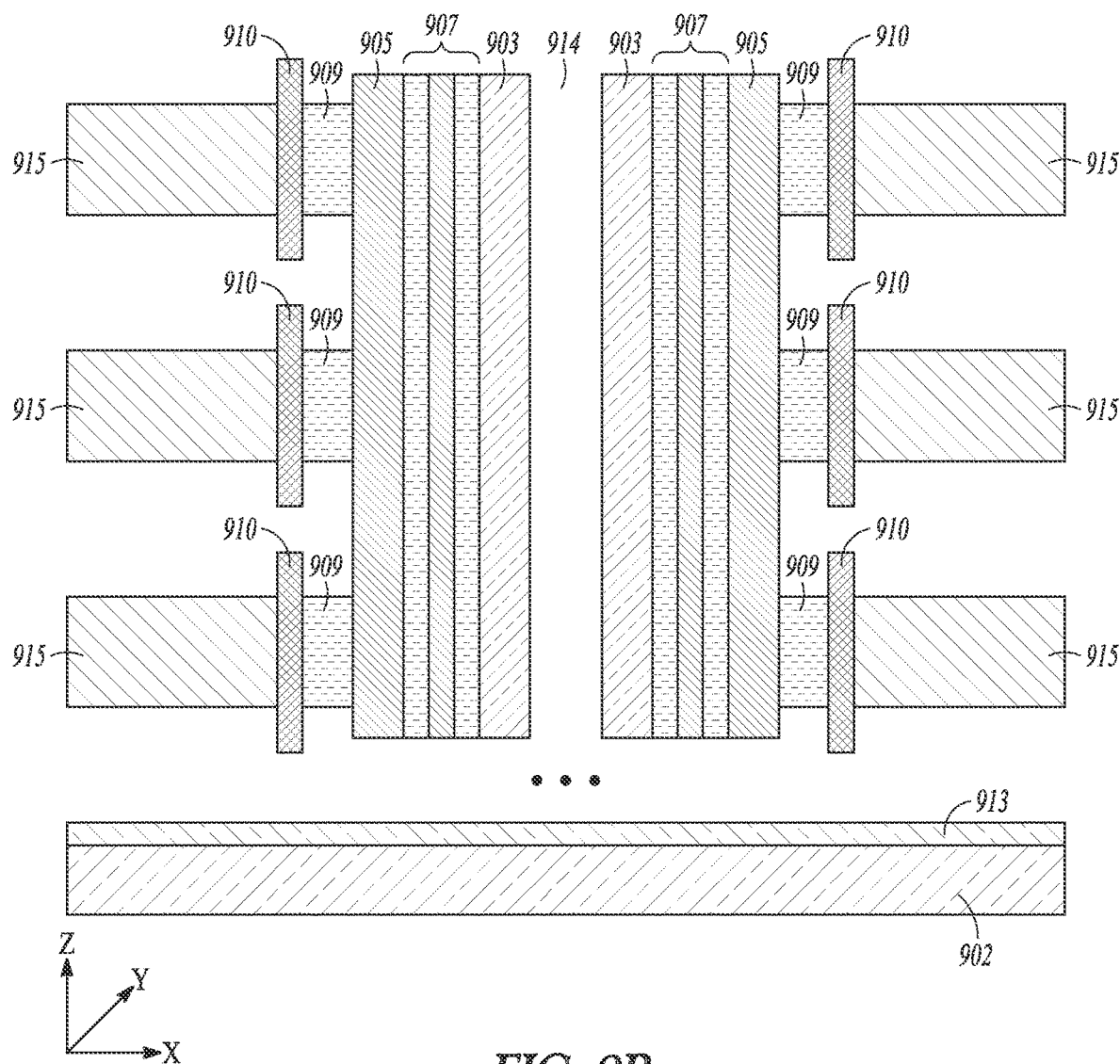
Figure 9Q:
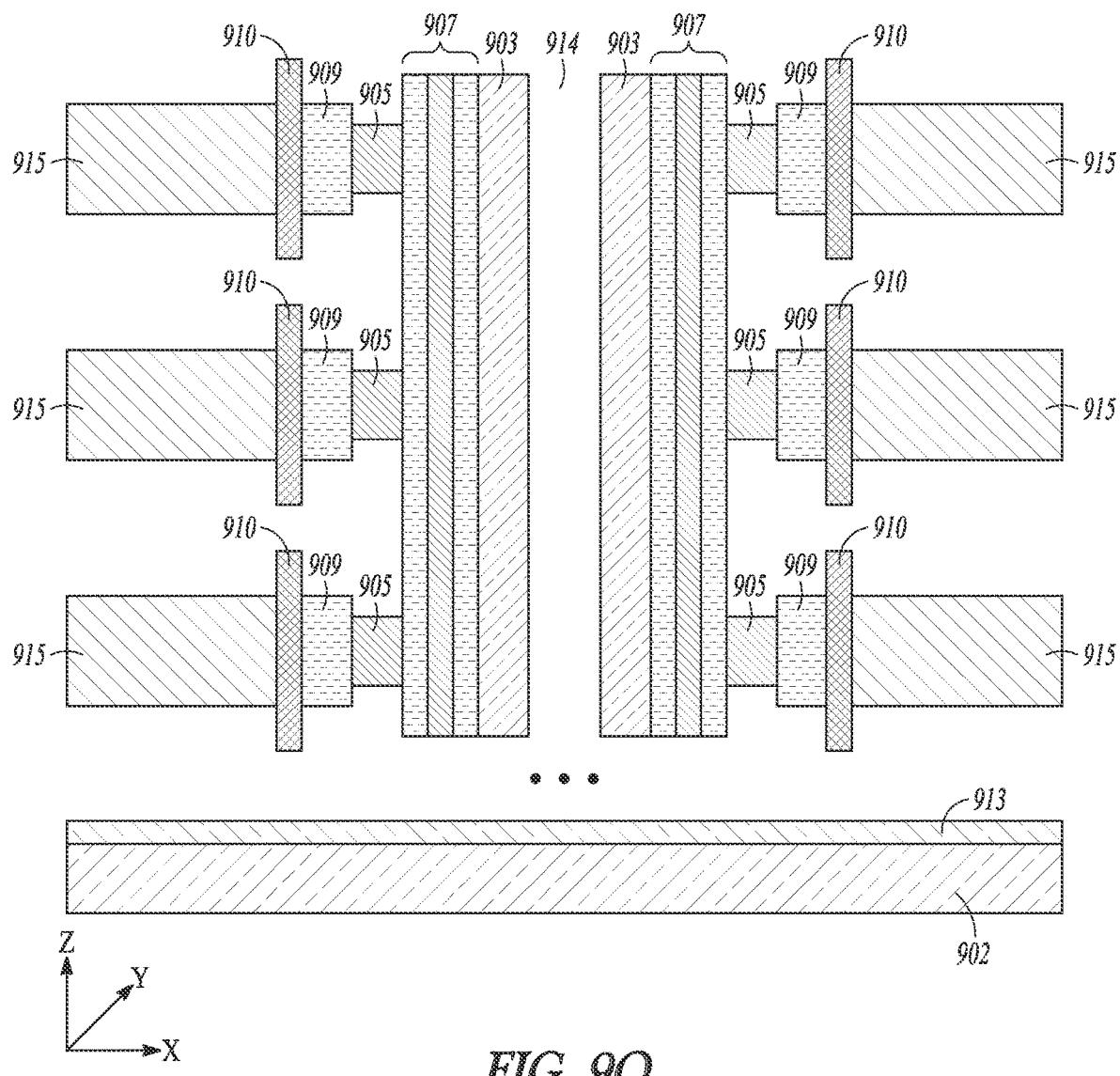
Figure 9R:
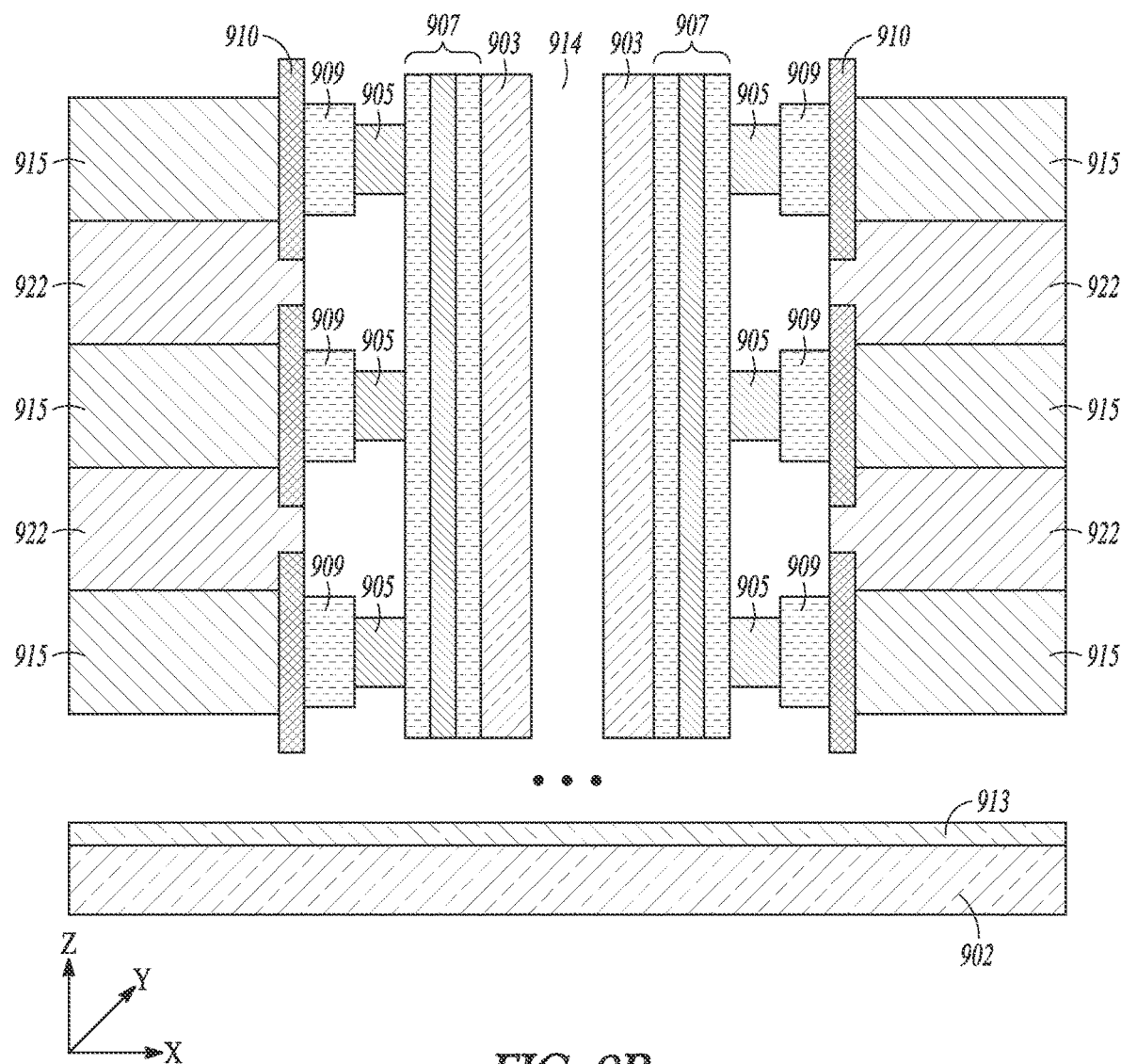

FIGS. 9A-9R are cross-sectional views illustrating features of stages of an embodiment of forming multiple CT structures in an electronic device. FIG. 9A shows a material stack 921 above a conductive region 913 on a substrate 902. Material stack 921 includes alternating isolation dielectrics 918 and sacrificial regions 919 above conductive region 913. The number of alternating isolation dielectrics 918 and sacrificial regions 919 may depend on the number of CT structures being formed in a vertical stack. For a 3D memory device, this number can depend on the number of tiers in a memory array of the memory device, for example, a pair of isolation dielectric 918 and sacrificial region 919 for each tier. Three isolation dielectrics 918 and three sacrificial regions 919 which can correspond to three tiers in a memory array of a memory device, are shown in FIG. 9A for ease of discussion. Isolation dielectrics 918 can include, but are not limited to, an oxide such as silicon oxide, and sacrificial regions 919 can include but are not limited to, a nitride such as silicon nitride. The choice of material for isolation dielectrics 918 and sacrificial regions 919 can depend on the temperatures and chemistries used in fabricating multiple CT structures. Conductive region 913 can be a semiconductor region 913. Semiconductor region 913 may be formed including poly silicon. In FIGS. 9A-9R, a space is shown between conductive region 913 on substrate 902 and the lowest isolation dielectric 918 of stack 921 vertically from conductive region 913 to indicate that there may be additional materials and/or integrated circuit structures between this isolation dielectric 918 and conductive region 913.

FIG. 9B shows material stack 921 after a removal process has been conducted to form trenches 914 in which pillars for strings of CT structures are being formed. The removal process can include masking areas and etching material stack 921 in the locations for the trenches 914. Trenches 914 may be referred to as open pillars 914 in material stack 921. Each open pillar 914 may become a separate individual string of CT structures in a memory array of a memory device. Each open pillar 914 may be cylindrical-like in shape or have some other similar shape that extends vertically though material stack 921 (z-direction), but extends a relatively short distance in material stack 921 in the y-direction. In FIG. 9B, open pillars 914 are arranged along conductive region 913 in the x-direction, where multiple CT structures will be stacked on each other in the z-direction in each open pillar 914. Though not shown for ease of discussion, open pillars 914 can be formed in the y-direction with multiple CT structures stacked on each other in the z-direction in each open pillar 914 in the y-direction. See, for example, FIG. 2.

FIG. 9C shows one of the open pillars 914 associated with FIG. 9B. The figures following 9C show processing of this open pillar 914, where such processing is being performed on the other similar open pillars associated with material stack 921 of FIG. 99. FIG. 9D shows a material for a dielectric barrier 910 formed on a wall of open pillar 914 of FIG. 9C. Forming the material for dielectric barrier 910 can include depositing one or more of aluminum oxide, hafnium oxide, zirconium oxide, or mixtures of hafnium oxide and/or zirconium oxide with one or more of aluminum oxide, silicon oxide, titanium oxide, gadolinium oxide, niobium oxide, or tantalum oxide. Forming the material for dielectric barrier 910 can include depositing other high-κ dielectrics. The deposition can be performed using one or more of a number of deposition processes. For example, the deposition can be implemented using chemical vapor deposition (CVD), ALD, or other process suitable for forming a 3D memory device. These deposition techniques can be used in depositing material at various stages of forming the multiple CTs associated with FIGS. 9A-9R. AU) allows formation of a region as a nanolaminate of a number of different compounds in each of sub-region of the region with the formed region having a total thickness in the nanometer region. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate may have a thickness as low as a monolayer of the material or as high as 5 nanometers. The material for dielectric barrier 910 can be formed with a thickness from the wall of the open pillar 914 in the range of 20 to 50 angstroms.

FIG. 9E shows the structure of FIG. 9D after formation of material for dielectric blocking region 909 on a surface of the material for dielectric barrier 910 opposite the wall of the open pillar 914. The material for dielectric blocking region 909 can include silicon oxide or other dielectric material. The material for dielectric blocking region 909 can be selected to be different from the material for dielectric barrier 910. FIG. 9F shows the structure of FIG. 9E after material for a charge trap region 905 is formed on a surface of the material for dielectric blocking region 909 opposite the surface of the material for dielectric barrier 910. The material for charge trap region 905 can include a dielectric nitride. For example, a dielectric nitride of charge trap region 905 can include silicon nitride. The material for charge trap region 905 may include other dielectric material capable of trapping charge.

FIG. 9G shows the structure of FIG. 9F after formation of material for a tunnel region 907 on the material for charge trap region 905. The material for tunnel region 907 can be implemented as a three region tunnel barrier as shown in FIG. 9E. Such a three region tunnel barrier can be implemented as a region of dielectric oxide followed by a region of dielectric nitride followed by another region of dielectric oxide. Alternatively, the material for tunnel region 907 may be implemented as a two region tunnel barrier. Also, the material for tunnel region 907 may be implemented as a one region tunnel barrier. Further, the material for tunnel region 907 may have four or more than regions, where the selection of material and thicknesses depends on the capability of the material with the given thicknesses to perform as a tunneling region to charge trap region 905. The material for tunnel region 907 can include one or more dielectrics such as silicon oxide or a high-κ dielectric.

FIG. 9H shows the structure of FIG. 9G after formation of material for a semiconductor pillar 903 on the material for tunnel region 907. The material for a semiconductor pillar 903 may be formed as a doped hollow channel. The doped hollow channel can be coupled to conductive region 913 via material and/or integrated circuit structures coupled on and contacting conductive region 913. For example, the material for semiconductor pillar 903 may be semiconductor material deposited to extend to and contact conductive region 913. Conductive region 913 can be formed as a semiconductor region 913 having a majority carrier concentration at a concentration level higher than the majority carrier concentration of semiconductor pillar 903. Semiconductor region 913 can be formed as a source region.

From the processed structure in FIG. 9H, procedures can be performed to generate gates and voids for CT structures of a completed device. The regions of the structure shown in FIG. 9H can be arranged as rings of material around the center region of open pillar 914. The center region of open pillar 914 may be filled with a dielectric at some time in the process after forming the material for semiconductor pillar 903 on the material for tunnel region 907. On either side of the structure of open pillar 914 surrounded by materials for semiconductor pillar 903, tunnel region 907, dielectric blocking region 909, and dielectric barrier 910 along with portions of isolation dielectrics 918 and sacrificial regions 919 shown in FIG. 9H, vertical slits can be created through the set of isolation dielectrics 918 and sacrificial regions 919 to allow processing of isolation dielectrics 918 and sacrificial regions 919 adjacent the material for dielectric barrier 910 to form the appropriate gates and voids. For example, indicated in FIG. 9B, there are a number of open pillars 914 being processed. Once the opened pillars have been processed to include material for CT structures in pillars 914, regions between pillars 914 of FIG. 9B can be removed, forming slits. Such slits may have been created earlier in the process. Theses slits provide access to the further process the structures of FIG. 9H, which can include providing processing chemical compounds to the desired areas of pillar 914 and/or the immediate region around 914.

FIG. 9I shows the structure of FIG. 9H after removal of sacrificial regions 919, where after removal air can occupy the previous sacrificial regions 919. The removal of sacrificial regions 919 can include etching the material of sacrificial regions 919 that is selective to the material for isolation regions 918 and the material for dielectric barrier 910. By selective with respect to etching is meant that the etchant that removes the sacrificial regions 919 does not remove the material for isolation regions 918 and the material for dielectric barrier 910. With the material for sacrificial regions 919 being a nitride such as silicon nitride, the material for isolation regions 918 being an oxide such as silicon oxide, and the material for dielectric hairier being a metal oxide such as AlO$_x$, the nitride of sacrificial regions 919 may be removed using a hot phosphoric acid etchant.

FIG. 9J shows the structure of FIG. 9I after deposition of material for gates 915 in the regions that were previously sacrificial regions 919. This technique of depositing material for gates 915 is typically referred to as a replacement gate deposition. The material for gates 915 can include a metal. Such a metal can include, but is not limited to, tungsten. The material for gates 915 can include a compound of a metal and a non-metal, where the compound has metallic properties. The material for gates 915 can include, but is not limited to, conductive titanium nitride. The material for gates 915 can include combinations of materials. For example, the material for gates 915 can include, but is not limited to, conductive titanium nitride and tungsten. In some structures, conductive titanium nitride of gates 915 may separate the material for isolation regions 918 and the material for dielectric barrier 910 from tungsten of gates 915.

The deposition of the material for gates 915 can be made with material at temperatures using deposition techniques that are selective to the material for isolation regions 918 and the material for dielectric barrier 910. By selective deposition with respect to the material for isolation regions 918 and the material for dielectric barrier 910 is meant that the selected material for deposition is deposited at the desired location without substantial interaction with the material for isolation regions 918 and the material for dielectric barrier 910. Interaction at the interfaces with the material the material for isolation regions 918 and the material for dielectric barrier 910 may occur, but leaving the material for isolation regions 918 and the material for dielectric barrier 910 substantially as before the deposition. For forming strings of memory cells in a memory device, forming the material for gates 915 can include isolating the material for gates 915 coupled to or integrated with access lines for the memory array. These access lines may be word lines.

FIG. 9K shows the structure of FIG. 9J after removal of the material for isolation regions 918 between the material for gates 915. The removal of the tiers of isolation regions 918 can be performed using a chemistry selected in conjunction with the selection of the material for gates 915 and the material for dielectric barrier 910. A criterion used for the selection can include selecting a chemistry that is selective to the material for gates 915 and material for dielectric barrier 910 such that the chemistry does not substantially affect the material for gates 915 and the material for dielectric barrier 910. The material for dielectric barrier 910 acts as a mask that allows tiers of isolation regions 918 to be removed without removing material for dielectric blocking region 909. Removal of tiers of isolation regions 918 may include use of hydrogen fluoride (HF), a vapor etch, or other chemistry that the material for dielectric barrier 910 can withstand so that the underlying material for dielectric blocking region 909 is not removed with the removal of tiers of isolation regions 918.

The material for dielectric barrier 910, such as $AlO_x$ or other high-κ material are to be deposited to be able to resist both a hot phosphoric acid removal of sacrificial regions 919, such as a nitride removal, as well as a HF or other chemistry used for removal of isolation regions 918, such as an oxide tier removal. For $AlO_x$, there are temperature ALD processes, as well as halide based ALD processes, that may be implemented for the deposition of $AlO_x$, to withstand these chemistries. Halide processes exist for deposition of $HfO_x$ and other high-κ materials that may be implemented such that these deposited films stand up to the hot phosphoric acid as well as the HF and other oxide etch chemistries. Other processes for forming $HfO_x$ and/or other high-κ materials for dielectric barrier 910, such that they survive removal processes, may include use of standard metal organic ALD precursors. Other processes to condition the material for dielectric barrier 910 to survive removal processes may include using various treatments after ALD deposition. These other processes may include anneals (either in inert or reactive ambients), plasma treatments, etc.

FIG. 9L shows the structure of FIG. 9K after removal of portions of the material for dielectric barrier 910 in preparation for processing the other materials in pillar 914. The removal of portions of the material for dielectric barrier 910 can be conducted using ALE that is selective to the material for gate 915 and the material for dielectric blocking region 909 such that the material for gate 915 and the material for dielectric blocking region 909 are not removed. The metered removal mechanism of ALE allows removal of the material for dielectric barrier 910 from between the material for gates 915 without recessing too much of the material for dielectric barrier 910 from between the material for gates 915 and the material for dielectric blocking region 909.

FIG. 9M shows the structure of FIG. 9K after formation of additional material for dielectric barrier 910 on the material for dielectric blocking region 909 and on the material for gate 915. The deposition of this additional material can include filling the region between dielectric blocking region 909 and on the material for gate 915 and may provide a region with thin thickness on the material for gate 915. For example, the thickness of the additional material on the material for gate 915 may be, but in not limited to 2 nm.

FIG. 9N shows the structure of FIG. 9M after removal of portions of the additional material for dielectric barrier 910. The removal may be performed using ALE of the additional material for dielectric barrier 910 selective to the material for gates 915 and the material for dielectric blocking region 909 such that the material for gate 915 and the material for dielectric blocking region 909 are not removed. ALE allows control of fine etching due its capability to remove material in a metered manner with etch rates in of angstroms per applied cycle. Repeating deposition and etching of additional material for dielectric barrier 910 can be performed for more masking of the material for dielectric blocking region 909.

FIG. 9O shows the structure of FIG. 9N after repetition of deposition and etching of additional material for dielectric barrier 910 to form an opening to provide a mask for processing the material for dielectric blocking region 909. The removal may be performed using ALE of the additional material for dielectric barrier 910 selective to the material for gates 915 and the material for dielectric blocking region 909 such that the material for gate 915 and the material for dielectric blocking region 909 are not removed. Continued repeating of the deposition and etching of additional material for dielectric barrier 910 can be performed until the opening in the material for dielectric blocking region 909 meets the desired size for the mask to process the material for dielectric blocking region 909. The resulting material for dielectric barrier 910 with its opening can be used as a critical dimension reduction mask to subsequently etch out the material for dielectric blocking region 909 and the material for the charge trap region 905. In an embodiment, multiple deposition/etch cycles of additional material for dielectric barrier 910 may be reduced in number by using an appropriate thickness ratio of the material for the charge trap region 905 to the material for dielectric blocking region 909 during the formation of the material for dielectric blocking region 909 and the material for the charge trap region 905 in open pillar 914, associated with FIGS. 9E and 9F. The desired size of the opening in the material for dielectric barrier 910, which is the basis for multiple deposition/etch cycles of additional material for dielectric barrier 910, can be related to the relationship of the structures for the dielectric blocking region 909 and the charge trap region 905 in the completed CT structures. The thickness ratio of the material for the charge trap region 905 to the material for dielectric blocking region 909 may be made sufficiently high to allow control the size of a void between charge trap regions 905 in adjacent completed CT structures.

FIG. 9P shows the structure of FIG. 9O after removal of portions of the material for dielectric blocking region 909. The removal may be performed selective to the material for gates 915 and the material for dielectric barrier 910 such that the material for gate 915 and the material for dielectric barrier 910 are not removed. In addition, the removal of the portions of the material for dielectric blocking region 909 can be performed with removing the material for the charge trap region 905, which may be accomplished with the choice of removing material and processing parameters such as length of time for removal. With the material for dielectric blocking region 909 including an oxide, the removal of the portions of the material for dielectric blocking region 909 can include an oxide etch.

FIG. 9Q shows the structure of FIG. 9P after removal of portions of the material for charge trap region 905. The removal may be performed selective to the material for gates 915, the material for dielectric barrier 910, and the material for dielectric blocking region 909 such that the material for gates 915, the material for dielectric barrier 910, and the material for dielectric blocking region 909 are not removed. With the material for charge trap region 905 including a nitride, the removal of the portions of the material for charge trap region 905 can include a nitride etch. With the material for dielectric blocking region 909 being an oxide and the material for charge trap region 905 including a nitride, an oxide etch can be performed followed by a nitride etch, a wet etch or a vapor etch, to remove portions of the dielectric blocking region 909 and portions of the charge trap region 905 without recessing the material for gates 915.

The removal of the portions of the material for charge trap region 905 may be conducted such that the material for charge trap region 905 is recessed vertically from the material for dielectric blocking region 909. In addition, the material for dielectric blocking region 909 may have been processed such that the material for dielectric blocking region 909 is recessed vertically from the material for dielectric blocking region 909 and/or the material for gates 915. Controlling the thickness ratio of the material for the charge trap region 905 to the material for dielectric blocking region 909 in the formation phase of these regions in open pillar 914 can compensate for small critical dimensions under the material for gates 915 in the area toward the material for tunnel region 907. Balancing isotropic etch profiles of the material for dielectric blocking region 909 and the material for the charge trap region 905 with the formation of the mask from patterning the material for dielectric barrier 910 and the thickness ratio of the material for the charge trap region 905 to the material for dielectric blocking region 909 can provide an optimal gate and CT stack dimensions, allowing for a 30 nm tier pitch in a memory array of a memory device in which the CT stack is formed. In addition, an anneal or other treatment may be performed to prevent etch damage along the CT edges in the stack from removal of the material for dielectric blocking region 909 and the material for the charge trap region 905.

FIG. 9R shows the structure of FIG. 9Q after formation of dielectrics 922 to seal voids 920. Formation of dielectrics 922 can be conducted selective to the material for gates 915, the material for dielectric barrier 910, and the material for dielectric blocking region 909 such that dielectric 922 does not interact to change the material for gates 915 the material for dielectric barrier 910, and the material for dielectric blocking region 909. Dielectrics 922 can be formed in a "pinch off" sealing process to seal voids 920. The sealing process can be implemented using plasma-enhanced chemical vapor deposition (PECVD) or other depleting process. In forming a seal, using PECVD or other deposition process that is not completely conformal can provide a void. In such cases, the sealing films are typically deposited at sub atmospheric pressures of a few mTorr to a few Torr. This pressure remains inside the void after it is sealed up. This void may be referred to as an "air gap," but the composition of gases would be that of the process when the void was sealed.

The pinch off sealing may also pinch off the opening in the material for dielectric barrier 910, which is a space between portions of material for dielectric barrier 910. This sealing process in forming CT memory cells for memory arrays of a memory device forms and defines a portion of the boundaries of voids 920. As shown in FIG. 9R, in addition to sealing dielectrics 922, voids 920 have a vertical boundary defined by, the material for tunnel region 907 between the material for charge trap region 905 of adjacent CT structures being formed. The sealing process may be implemented similar to the process associated with FIG. 1B such that the sealing dielectrics end in the region between adjacent material for gates 915 prior to reaching the material for the dielectric barrier 910.

The structure illustrated in FIG. 9R can be processed to form electrical connections and to be integrated in an electronic device for which the structures was formed. In this further processed state, the materials for semiconductor pillar 903, tunnel region 907, charge trap region 905, dielectric barrier 910, and gates 915 can be effectively segmented as individual CT structures as illustrated in FIG. 4 with center of pillar 914 filled with dielectric 404. Variations to the processing stages illustrated in FIGS. 9A-9R can be made to generate alternative structures to the voids between adjacent CT structures in a stack. For example, prior to forming the sealing dielectrics, fin structures of the material for dielectric barriers 910 in the regions for the void regions, shown in FIG. 9Q, can be removed or significantly reduced using ALE. Other variations to the processing stages illustrated in FIGS. 9A-9R can be made to generate define the boundaries for voids for the multiple CT structures in a vertical stack.

Figure 10A:
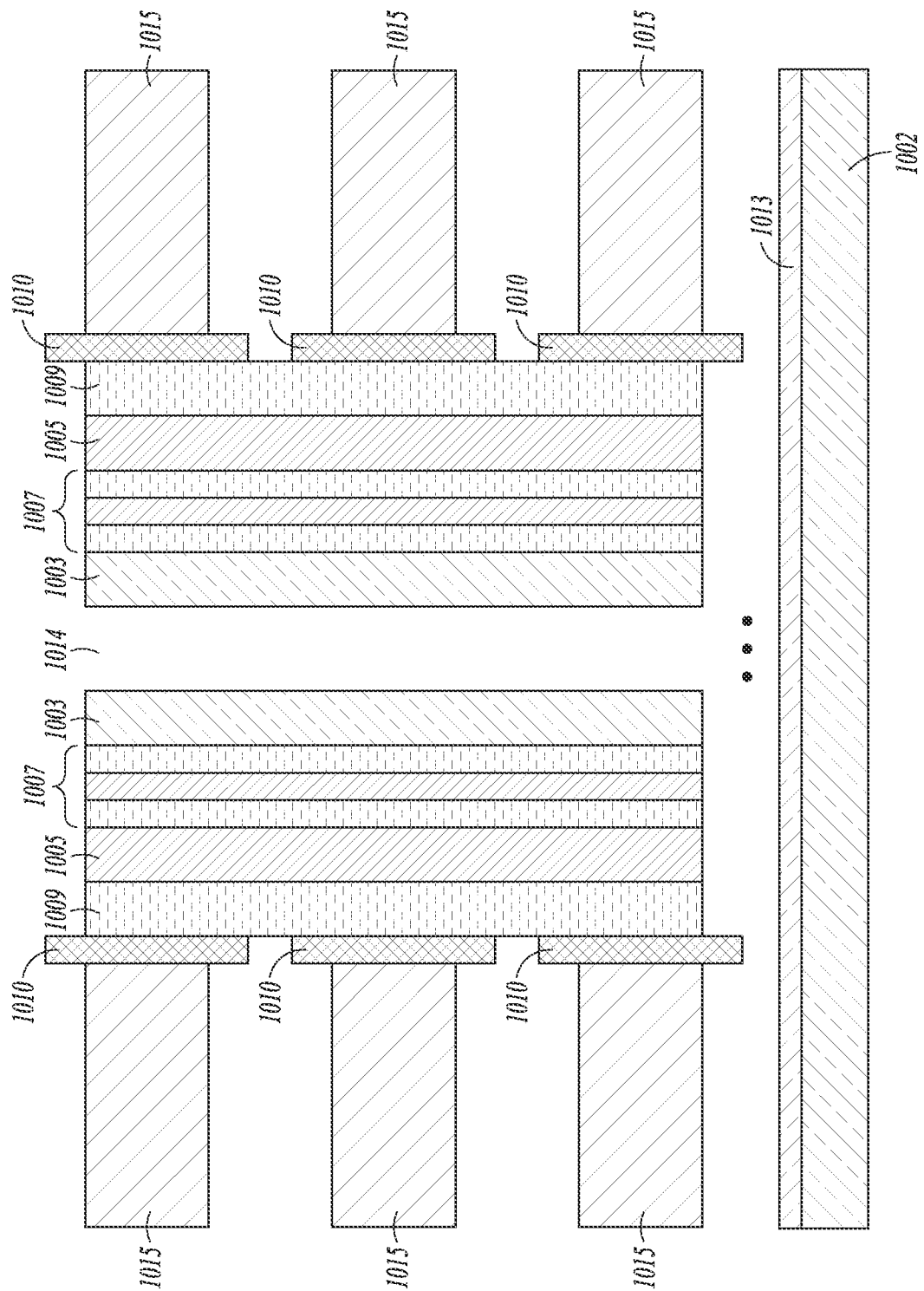
FIGS. 10A-10D are cross-sectional views illustrating stages of an example method of forming charge trap structures, according to various embodiments.

FIGS. 10A-10D are cross-sectional views illustrating features of stages of an embodiment of forming multiple CT structures in an electronic device. FIG. 10A illustrates a processing stage that begins a variation to the stages of FIGS. 9A-9R. FIG. 10A shows a structure having material for semiconductor pillar 1003, material for tunnel region 1007, material for charge trap region 1005, material for dielectric blocking region 1009, and material for dielectric barrier 1010 in pillar 1014 connected to material for gates 1015, where these materials are arranged above a conductive region 1013 on substrate 1002. The structures shown in FIG. 10A can be formed using processing stages similar or identical to the processing stages illustrated in FIGS. 9A-9O.

Figure 10B:
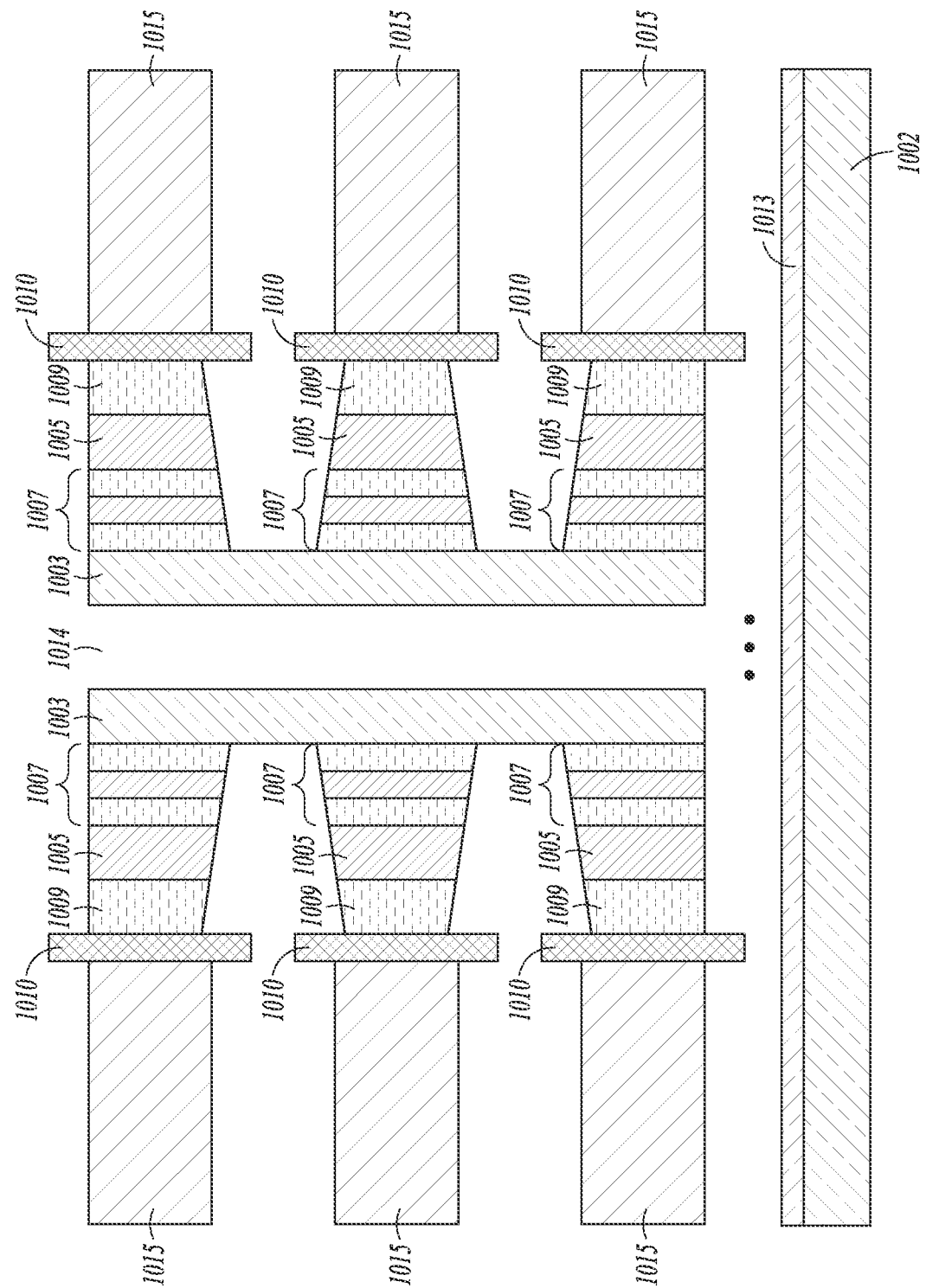

FIG. 10B shows the structure of FIG. 10A after removal of portions of material for dielectric blocking region 1009, portions of material for charge trap region 1005, and portions of material for tunnel region 1007, which exposes the material for semiconductor pillar 1003. The material for a semiconductor pillar 1003 may be formed as a doped hollow channel. The doped hollow channel can be coupled to conductive region 1013 via material and/or integrated circuit structures coupled on and contacting conductive region 1013. For example, the material for semiconductor pillar 1003 may be semiconductor material deposited to extend to and contact conductive region 1013. Conductive region 1013 can be formed as a semiconductor region 1013 having a majority carrier concentration at a concentration level higher than the majority carrier concentration of semiconductor pillar 1003. Semiconductor region 1013 can be formed as a source region. With material for dielectric blocking region 1009 including an oxide, material for charge trap region 1005 including a nitride, and material for tunnel region 1007 including one or more of oxides and nitrides, removal of the portions of these material regions can include a set of oxide/nitride stack etches to expose the material for semiconductor pillar 1003.

Figure 10C:
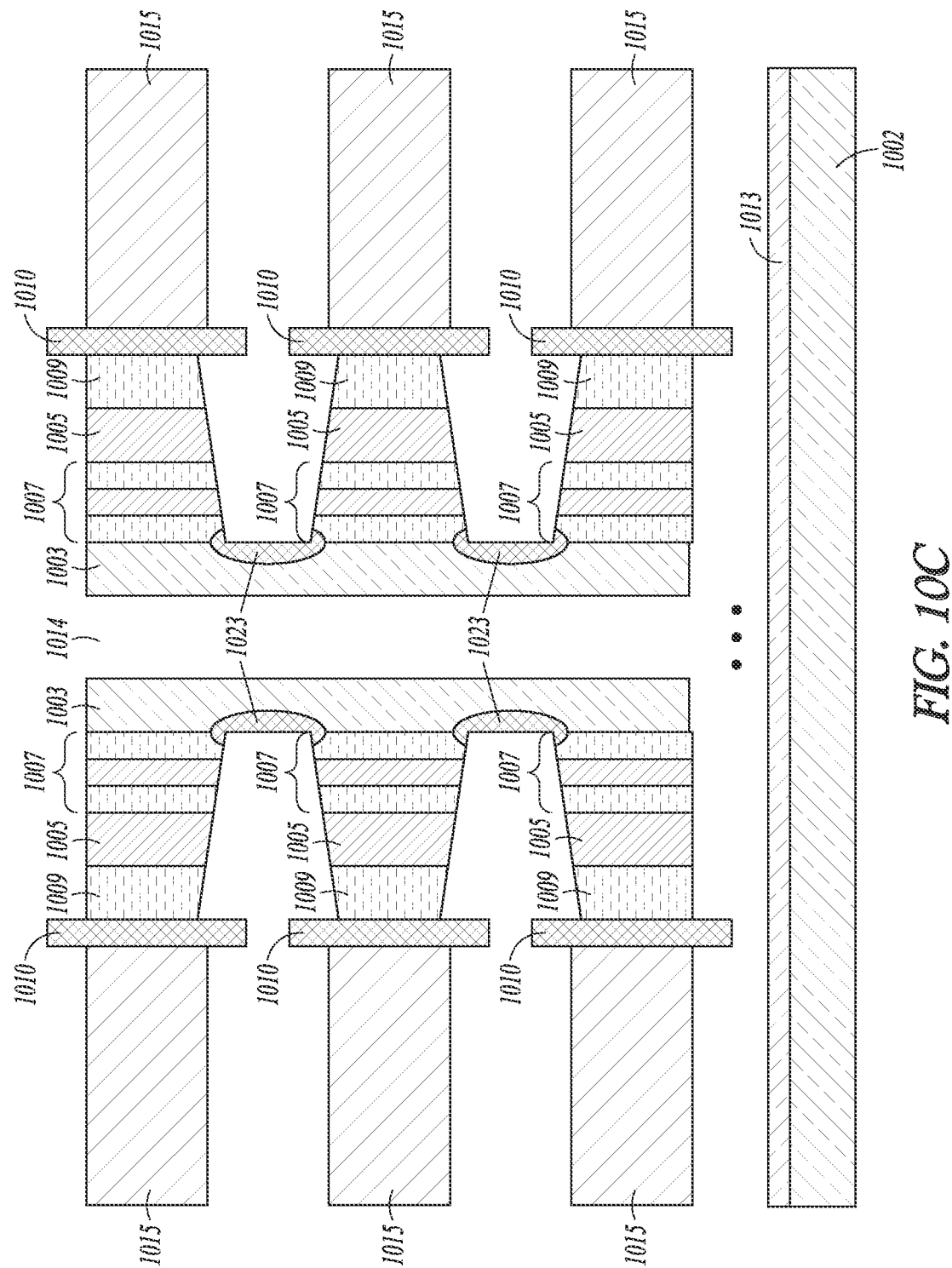

FIG. 10C shows the structure of FIG. 109 after subjecting the exposed material for semiconductor pillar 1003 to a doping vapor to enhance the doping of the semiconductor pillar 1003 at regions 1023 of the exposed material for semiconductor pillar 1003. Subjecting the exposed material for semiconductor pillar 1003 can include applying phosphine ($PH_3$) to increase the carrier doping levels. The phosphine can be applied in an anneal in a temperature range of about 700° C. to about 750° C., Other annealing temperature ranges may be used. The doping process can provide region 1023 as an enhanced $N^+$ region. Another vapor that can be used in an isotropic vapor anneal is arsine ($AsH_3$). Other n-type dopants may be used. With semiconductor doping in the various sections for the CT structures being p-type, p-type dopants may be used, providing region 1023 as an enhanced RE region. For p-type channel, to increase carrier doping level, a vapor can be applied that provides increased p-type doping. Applying a vapor anneal with a p-type species can include applying diborane ($B_2H_6$) gas to provide an increase in p-type doping levels. For an undoped channel, to increase carrier doping level in the regions of the channel bounded by the tunnel region of the charge trap structures, a vapor can be applied that provides p-type doping or n-type doping. The selection of the doping type in the regions of the channel bounded by the tunnel region of the charge trap structures can depend on other features of the integration scheme, for example, the doping scheme of selector devices vertically coupled to the stack of CT structures. Dopants in the regions 1023 of the material for semiconductor pillar 1003 between adjacent charge trap structures can be activated without diffusing dopants into the material for semiconductor pillar 1003 bounded by the material of tunnel region 1007.

The higher doping levels in regions 1023 can be non-uniform along a vertical length of the material for semiconductor pillar 1003 with respect to the carrier concentration in the material for semiconductor pillar 1003 bounded by the material for tunnel region 1023. The higher doping levels in regions 1023 can be distributed as a gradient along a vertical length of channel 1023 with respect to the carrier concentration in the material for channel 1023 bounded by the material for tunnel region 1007. Such a gradient may be realized with an excess of majority carrier concentration, relative to doping along the material for semiconductor pillar 1003 bounded by the material for tunnel region 1007, approaching zero at the beginning of the boundary of the material for semiconductor pillar 1003 with the material for tunnel region 1007. The higher doping levels in regions 1023 can be distributed as gradient across the material for semiconductor pillar 1003 in the x-direction, perpendicular to the length of the material semiconductor pillar 1003.

Figure 10D:
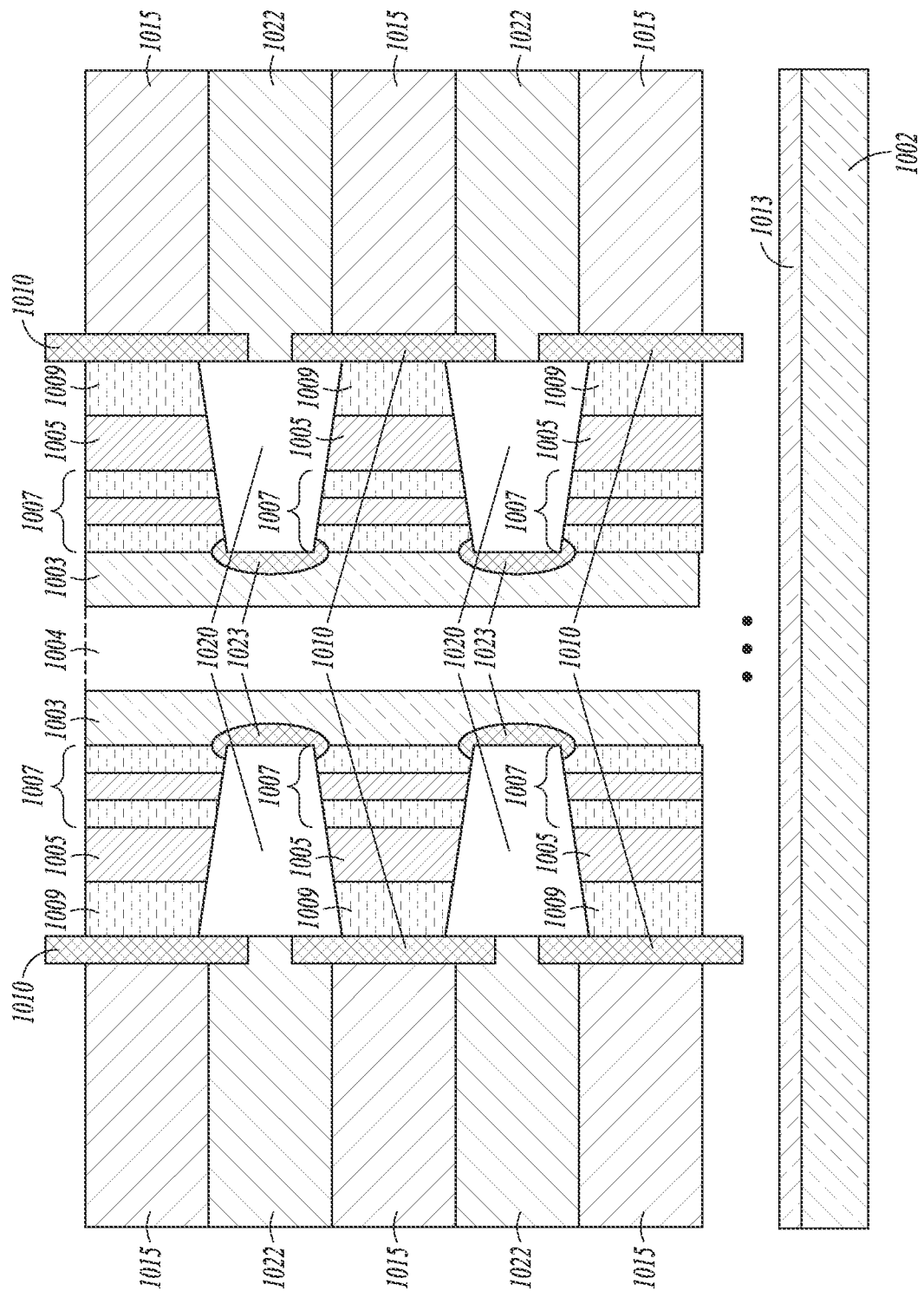

FIG. 10D shows the structure of FIG. 10C after formation of dielectrics 1022 to seal voids 1020. Formation of dielectrics 1022 can be conducted selective to the material for gates 1015, the material for dielectric barrier 1010, and the material for dielectric blocking region 1009 such that dielectric 1022 does not interact to change the material for gates 1015, the material for dielectric barrier 1010, and the material for dielectric blocking region 1009. Dielectrics 1022 can be formed in a "pinch off" sealing process to seal voids 1020. The sealing process can be implemented using plasma-enhanced chemical vapor deposition (PECVD) or other depleting process. The pinch off sealing may also pinch off the opening in the material for dielectric barrier 1010, which is a space between portions of material for dielectric barrier 1010. This sealing process in forming CT memory cells for memory arrays of a memory device forms and defines a portion of the boundaries of voids 1020. As shown in FIG. 10C, in addition to sealing dielectrics 1022, voids 1020 have a vertical boundary defined by the material for semiconductor pillar 1003 between the material for tunnel regions 1007 of adjacent CT structures being formed. The sealing process may be implemented similar to the process associated with FIG. 2B such that the sealing dielectrics end in the region between adjacent material for gates 1015 prior to reaching the material for the dielectric barrier 1010.

The structure illustrated in FIG. 10D can be processed to form electrical connections and to be integrated in an electronic device for which the structures were formed. In this further processed state, the materials for semiconductor pillar 1003, tunnel region 1007, charge trap region 1005, dielectric barrier 1010, and gates 1015 can be effectively segmented as individual CT structures as illustrated in FIG. 5 with center of pillar 1014 filled with dielectric 504. Variations to the processing stages illustrated in FIGS. 10A-10D can be made to generate alternative structures to the voids between adjacent CT structures in a stack. For example, prior to forming the sealing dielectrics, fin structures of the material for dielectric barriers 1010 in the regions for the void regions, shown in FIG. 1_0C, can be removed or significantly reduced using ALE. Other variations to the processing stages illustrated in FIGS. 10A-10D can be made to generate define the boundaries for voids for the multiple CT structures in a vertical stack.

Figure 11:
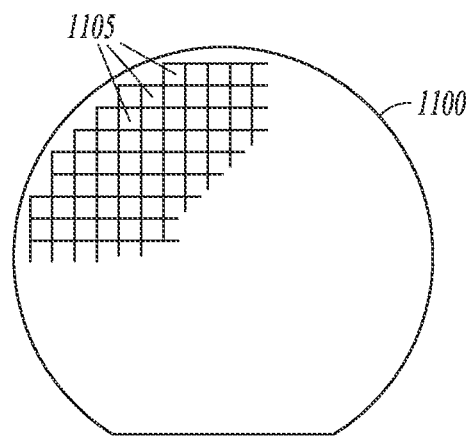
FIG. 11 is a representation of an example wafer having multiple die, according to various embodiments.

FIG. 11 illustrates an embodiment of an example of a wafer 1100 arranged to provide multiple electronic components. Wafer 1100 can be provided as a wafer in which a number of dice 1105 can be fabricated. Alternatively, wafer 1100 can be provided as a wafer in which the number of dice 1105 have been processed to provide electronic functionality and are awaiting singulation from wafer 1100 for packaging. Wafer 1100 can be provided as a semiconductor wafer, a semiconductor on insulator wafer, or other appropriate wafer for processing electronic devices such as an integrated circuit chips. Wafer 1100 can be fabricated in accordance with methods associated with any embodiment or combination of embodiments related to FIGS. 1-10.

Using various masking and processing techniques, each die 1105 can be processed to include functional circuitry such that each die 1105 is fabricated as an integrated circuit with the same functionality and packaged structure as the other dice on wafer 1100. Alternatively, using various masking and processing techniques, various sets of dice 1105 can be processed to include functional circuitry such that not all of the dice 1105 are fabricated as an integrated circuit with the same functionality and packaged structure as the other dice on wafer 1100. A packaged die having circuits integrated thereon providing electronic capabilities is herein referred to as an integrated circuit (IC).

Wafer 1100 can comprise multiple dice 1105. Each die 1105 of the multiple dice can include a CT structure. The CT can have or be structured with respect to a void. The CT and/or multiple CTs can be structured similar or identical to CTs as taught herein with respect to FIGS. 1-10.

In various embodiments, the CT structure of each die 1105 can include a semiconductor pillar operable to conduct a current; a charge trap region separated from the semiconductor pillar by a tunnel region; a dielectric blocking region on the charge trap region; a gate on the dielectric blocking region to control storage of charge in the charge trap region; and a dielectric barrier between and separating the dielectric blocking region and the gate, the dielectric barrier being disposed in a vertical arrangement with the dielectric blocking region and the charge trap region such that a void is located between the charge trap region and a region on which the CT structure is disposed. The dielectric barrier can be disposed in a vertical arrangement with the dielectric blocking region and the charge trap region such that a void is located between one or more of the dielectric blocking region, the charge trap region, or the tunnel region and a region on which the CT structure is disposed. The charge trap region can be recessed vertically with respect to the dielectric blocking region in the void. The charge trap region can be a dielectric nitride region, the dielectric blocking region can be an oxide region, and the tunnel region can include a set of dielectric regions.

The CT structure of each die 1105 can be one of multiple CT structures, including a first CT structure, arranged along a vertical string of a number of vertical strings, where each charge trap structure, after the first CT structure, can be disposed above another one of the multiple CT structures. Each CT structure along a respective vertical string can include: a semiconductor pillar for the CT structure that is a portion of semiconductor material arranged vertically along the vertical string for all CT structures along the vertical string; a tunnel region adjacent and contacting the semiconductor pillar; a charge trap region adjacent and contacting the tunnel region, the charge trap region separated from the charge trap region of an adjacent CT structure in the vertical stack by a void; a dielectric blocking region adjacent and contacting the charge trap region; and a dielectric barrier between the dielectric blocking region and a gate of the CT structure. The charge trap region of each CT structure can be recessed vertically with respect to the dielectric blocking region of each CT structure in the void. The tunnel region of the first CT structure can extend along the pillar of semiconductor material and can extend through the other CT structures as the tunnel region of each CT structure. A dielectric can be disposed between gates of adjacent CT structures with the void between the adjacent CT structures bounded by the tunnel region opposite the dielectric. The charge trap region of each CT structure of the multiple CT structures can be a dielectric nitride region, the dielectric blocking region can be an oxide region, and the tunnel region can include a set of dielectric regions.

In various embodiments, the CT structure of each die 1105 can include a semiconductor pillar operable to conduct a current; a charge trap region separated from the semiconductor pillar by a tunnel region; a dielectric blocking region on the charge trap region; a gate on the dielectric blocking region to control storage of charge in the charge trap region; and a dielectric barrier between the dielectric blocking region and the gate, wherein the tunnel region and the semiconductor pillar are arranged as boundaries of a void. The dielectric barrier, the dielectric blocking region, and the charge trap region can be arranged as boundaries of the void. The semiconductor pillar can include higher carrier doping levels in a region of the semiconductor pillar bounded by the void than in regions of the semiconductor pillar bounded by the tunnel region. The higher carrier doping levels are n-type doping. The dielectric barrier can include dielectric material different from material of the dielectric blocking region such that the dielectric material of the dielectric barrier is capable of withstanding material processing for formation of the gate and removal of portions of the charge trap region and the dielectric blocking region to form the void.

The CT structure of each die 1105 can be one of multiple CT structures, substantially identically structured, and arranged in a vertical stack such that the tunnel region of a CT structure is separated from the tunnel region of an adjacent CT structure in the vertical stack by a void. The CT structures can be arranged in the vertical stack with a common semiconductor pillar such that, regions of the common semiconductor pillar between adjacent CT structures have higher carrier doping levels than regions of the common semiconductor pillar adjacent and contacting the tunnel regions of the CT structures.

In various embodiments, each die 1105 can include a memory device. The memory device can include a number of vertical strings, where each vertical string includes a pillar of semiconductor material, and multiple CI' structures, including a first CT structure, arranged along each vertical string. The multiple CT structures can be arranged in a vertical stack with each CT structure, except for the first CI' structure, disposed above another one of the multiple CT structures. Each CT structure can include: the semiconductor material arranged as a channel for the CT structure; a tunnel region adjacent and contacting the pillar; a charge trap region adjacent and contacting the tunnel region; a dielectric blocking region adjacent and contacting the charge trap region; a dielectric barrier between and separating the dielectric blocking region and a gate of the CT structure, where the tunnel region is separated from the tunnel region of an adjacent CT structure in the vertical stack by a void. The pillar can include higher carrier doping levels in a region of the channel between adjacent CT structures bounded by the void than in regions of the pillar bounded by the tunnel region of each CT structure. The dielectric barrier of each CT structure can include aluminum oxide or one or more of hafnium oxide, zirconium oxide, or mixtures of hafnium oxide and/or zirconium oxide with one or more of aluminum oxide, silicon oxide, titanium oxide, gadolinium oxide, niobium oxide, or tantalum oxide. A sealing dielectric can be disposed between gates of adjacent CT structures providing a seal to the void between adjacent CT structures.

Figure 12:
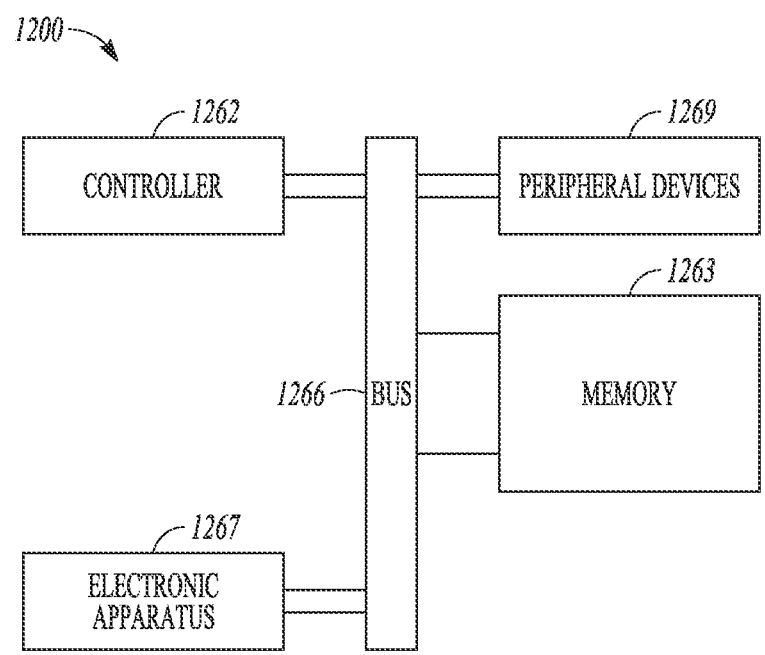
FIG. 12 is a block diagram of an example system that includes a memory structured with an array of charge trap structures as memory cells, according to various embodiments.

FIG. 12 shows a block diagram of an embodiment of an example system 1200 that includes a memory 1263 structured with an array of CT structures as memory cells. The architectures of the CT structures and the memory can be realized having voids in a manner similar to or identical to structures in accordance with various embodiments discussed herein. System 1200 can include a controller 1262 operatively coupled to memory 1263. System 1200 can also include an electronic apparatus 1267 and peripheral devices 1269. One or more of controller 1262, memory 1263, electronic apparatus 1267, or peripheral devices 1269 can be in the form of one or more ICs.

A bus 1266 provides electrical conductivity between and/or among various components of system 1200. In an embodiment, bus 1266 can include an address bus, a data bus, and a control bus, each independently configured. In an alternative embodiment, bus 1266 can use common conductive lines for providing one or more of address, data, or control, the use of which is regulated by controller 1262. Controller 1262 can be in the form or one or more processors.

Electronic apparatus 1267 may include additional memory. Memory in system 1200 may be constructed as one or more types of memory such as, but not limited to, dynamic random access memory (DRAM), static random access memory (SRAM), synchronous dynamic random access memory (SDRAM), synchronous graphics random access memory (SGRAM), double data rate dynamic ram (DDR), double data rate SDRAM, and magnetic based memory.

Peripheral devices 1269 may include displays, imaging devices, printing devices, wireless devices, additional storage memory, and control devices that may operate in conjunction with controller 1262. In various embodiments, system 1200 includes, but is not limited to, fiber optic systems or devices, electro-optic systems or devices, optical systems or devices, imaging systems or devices, and information handling systems or devices such as wireless systems or devices, telecommunication systems or devices, and computers.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Thus, the following claims are hereby incorporated into the Detailed Description, with each claim standing on its own as a separate embodiment.

What is claimed is:

1. A memory device comprising:
    a semiconductor pillar;
    multiple memory cells disposed along the semiconductor pillar with each of the memory cells having a charge trap region separated from the semiconductor pillar by a tunnel region;
    multiple first regions of the semiconductor pillar with the first regions contacting the tunnel regions of the memory cells, each first region having a doping level; and
    multiple second regions of the semiconductor pillar with each second region arranged as a boundary of a void between tunnel regions of adjacent memory cells, with the second regions having higher doping levels than the first regions.

2. The memory device of claim 1, wherein the higher doping levels in the second regions are non-uniform along a vertical length of the semiconductor pillar with respect to the doping in the first regions.

3. The memory device of claim 1, wherein the higher doping levels in the second regions are distributed as gradients along a vertical length of the semiconductor pillar.

4. The memory device of claim 3, wherein the gradients are provided by an excess of a majority carrier concentration, relative to the doping of the first regions along the semiconductor pillar, with the excess approaching zero at a beginning of a boundary of the semiconductor pillar with the tunnel regions.

5. The memory device of claim 1, wherein the higher doping levels in the second regions are distributed in the semiconductor pillar in a direction perpendicular to a vertical length of the semiconductor pillar.

6. The memory device of claim 5, wherein the distributions are gradients across the semiconductor pillar in the direction perpendicular to the vertical length of the semiconductor pillar.

7. The memory device of claim 1, wherein the semiconductor pillar includes polycrystalline silicon.

8. The memory device of claim 1, wherein each memory cell of the multiple memory cells is arranged with the semiconductor pillar providing a channel structure for each memory cell, the semiconductor pillar coupling the memory cells to a conductive data line via an access transistor.

9. The memory device of claim 1, wherein the void between the tunnel regions of the adjacent memory cells has boundaries defined, in part, by regions of the adjacent memory cells, the regions including a dielectric blocking region and the charge trap region of one memory cell of the adjacent memory cells and a dielectric blocking region and the charge trap region of another memory cell of the adjacent memory cells.

10. The memory device of claim 9, wherein a distance across the void from the dielectric blocking region of the one memory cell of the adjacent memory cells to the dielectric blocking region of the other memory cell of the adjacent memory cells is greater than a distance across the void from the charge trap region of the one memory cell of the adjacent memory cells to the charge trap region of the memory cell of the adjacent memory cells.

11. The memory device of claim 9, wherein the regions include a dielectric barrier of the one memory cell and a dielectric barrier of the other memory cell, with the dielectric barrier of the one memory cell separating the dielectric blocking region of the one memory cell from a gate to the one memory cell and with the dielectric barrier of the other memory cell separating the dielectric blocking region of the other memory cell from a gate to the of the other memory cell.

12. The memory device of claim 1, wherein the void extends horizontally from the semiconductor pillar to a dielectric region, the dielectric region separating a gate to one memory cell of the adjacent memory cells from a gate to another memory cell of the adjacent memory cells.

13. The memory device of claim 12, wherein the dielectric region has a portion that extends vertically from a dielectric barrier of the one memory cell of the adjacent memory cells to a dielectric barrier of the other memory cell of the adjacent memory cells, with the dielectric barrier of the one memory cell separating a dielectric blocking region of the one memory cell from the gate to the one memory cell and with the dielectric barrier of the other memory cell separating a dielectric blocking region of the other memory cell from the gate to the of the other memory cell.

14. The memory device of claim 12, wherein the void extends to the dielectric region horizontally between a dielectric barrier of the one memory cell of the adjacent memory cells and a dielectric barrier of the other memory cell of the adjacent memory cells.

15. The memory device of claim 12, wherein the dielectric region has a portion that extends vertically from a dielectric barrier of the one memory cell of the adjacent memory cells to a dielectric barrier of the other memory cell of the adjacent memory cells, with the dielectric barrier of the one memory cell separating a dielectric blocking region of the one memory cell from the gate to the one memory cell and with the dielectric barrier of the other memory cell separating a dielectric blocking region of the other memory cell from the gate to the of the other memory cell.

16. The memory device of claim 1, wherein the multiple memory cells are arranged vertically as tiers with a tier pitch scaling of substantially less than 60 nm.

17. A method of forming a memory device, the method comprising:
    forming a semiconductor pillar;
    forming multiple memory cells disposed along the semiconductor pillar with each of the memory cells having a charge trap region separated from the semiconductor pillar by a tunnel region;
    forming multiple first regions of the semiconductor pillar with the first regions contacting the tunnel regions of the memory cells and with each first region having a doping level; and
    forming multiple second regions of the semiconductor pillar with each second region arranged as a boundary of a void between tunnel regions of adjacent memory cells and with the second regions having higher doping levels than the first regions.

18. The method of claim 17, wherein the method includes:
- forming material for dielectric barriers of the multiple memory cells with the material for dielectric barriers formed on a surface of an opening of a stack of materials;
- forming material for dielectric blocking regions of the multiple memory cells with the material for dielectric blocking regions formed on the material for dielectric barriers;
- forming material for the charge trap regions of the multiple memory cells on the material for dielectric blocking regions;
- forming material for the tunnel regions of the multiple memory cells on the material for the charge trap regions;
- forming the semiconductor pillar on the material for the tunnel regions; and
- forming gates to the memory cells using a replacement gate process; and
- removing horizontal sections of the stack of materials, providing spaces to form the voids.

19. The method of claim 18, wherein the method includes removing portions of the material for dielectric barriers using atomic layer etching via the spaces.

20. The method of claim 17, wherein the method includes sealing the voids using a depleting process to deposit a sealing dielectric.

\* \* \* \* \*